United States Patent [19]

Taniguchi

[11] Patent Number: 5,841,520
[45] Date of Patent: Nov. 24, 1998

[54] EXPOSURE APPARATUS AND METHOD THAT USE MARK PATTERNS TO DETERMINE IMAGE FORMATION CHARACTERISTICS OF THE APPARATUS PRIOR TO EXPOSURE

[75] Inventor: Tetsuo Taniguchi, Yokohama, Japan

[73] Assignee: Nikon Corporatioin, Tokyo, Japan

[21] Appl. No.: 691,377

[22] Filed: Aug. 2, 1996

[30] Foreign Application Priority Data

| Aug. 9, 1995 | [JP] | Japan | 7-224813 |
| Sep. 12, 1995 | [JP] | Japan | 7-259367 |
| Oct. 13, 1995 | [JP] | Japan | 7-292091 |
| Dec. 1, 1995 | [JP] | Japan | 7-313791 |

[51] Int. Cl.$^6$ ............................ G03B 27/42; G01N 21/86
[52] U.S. Cl. ................ 355/53; 250/201.1; 250/559.3
[58] Field of Search ................................ 355/53, 77, 75, 355/55, 52; 356/399, 400, 401; 250/201.1, 548, 559.3, 559

[56] References Cited

U.S. PATENT DOCUMENTS

| 4,629,313 | 12/1986 | Tanimoto | 355/53 |
| 4,897,553 | 1/1990 | Nishi | 250/548 |
| 4,952,815 | 8/1990 | Nishi | 250/548 |
| 5,241,188 | 8/1993 | Mizutani | 250/548 |
| 5,424,552 | 6/1995 | Tsuji et al. | 250/548 |
| 5,552,892 | 9/1996 | Nagayama | 356/401 |
| 5,585,925 | 12/1996 | Sato et al. | 356/401 |
| 5,650,840 | 7/1997 | Taniguchi . | |

FOREIGN PATENT DOCUMENTS 64-77125  3/1989  Japan .

*Primary Examiner*—R. L. Moses
*Assistant Examiner*—Shival Virmani
*Attorney, Agent, or Firm*—Oliff & Berridge, PLC

[57] ABSTRACT

A scanning type exposure apparatus comprises a mask stage RST for scanning a mask R across an illumination area on the mask R, a projection optical system PL for projecting an image of a pattern on the mask R onto a photosensitive substrate W, and a substrate stage WST for scanning the photosensitive substrate W across an exposure area. The apparatus comprises an image pickup unit 53 having its light-receiving section 1 provided on the substrate stage WST, for photoelectrically detecting an image of a mark pattern on the mask R, and a combining unit 4 for combining signals outputted from the image pickup unit 53 during a period in which the light-receiving section is scanned across the exposure area in synchronization with scanning for the mark pattern across the illumination area. Image formation characteristics or a position of the image of the mark pattern is determined on the basis of an output of the combining unit 4, which may be corrected before actual exposure. Correction is also performed by using synchronization errors. It is also possible to use an edge scan type sensor in place of the image pickup unit 53.

68 Claims, 18 Drawing Sheets

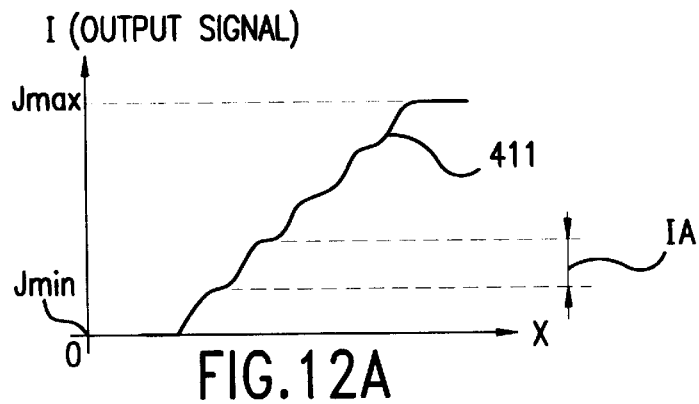
FIG.12A
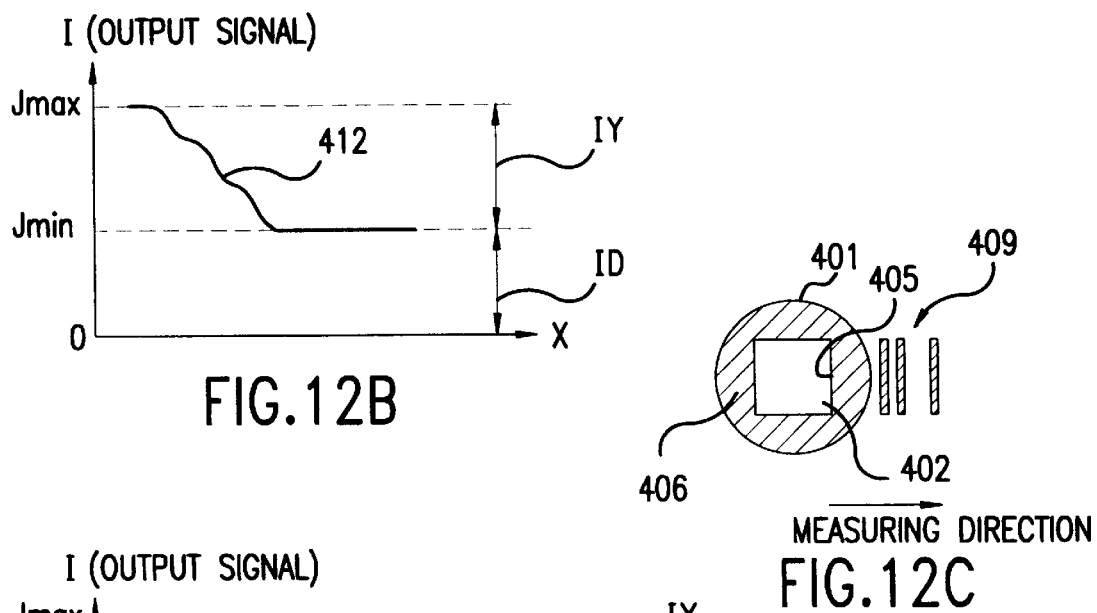
FIG.12B
FIG.12C
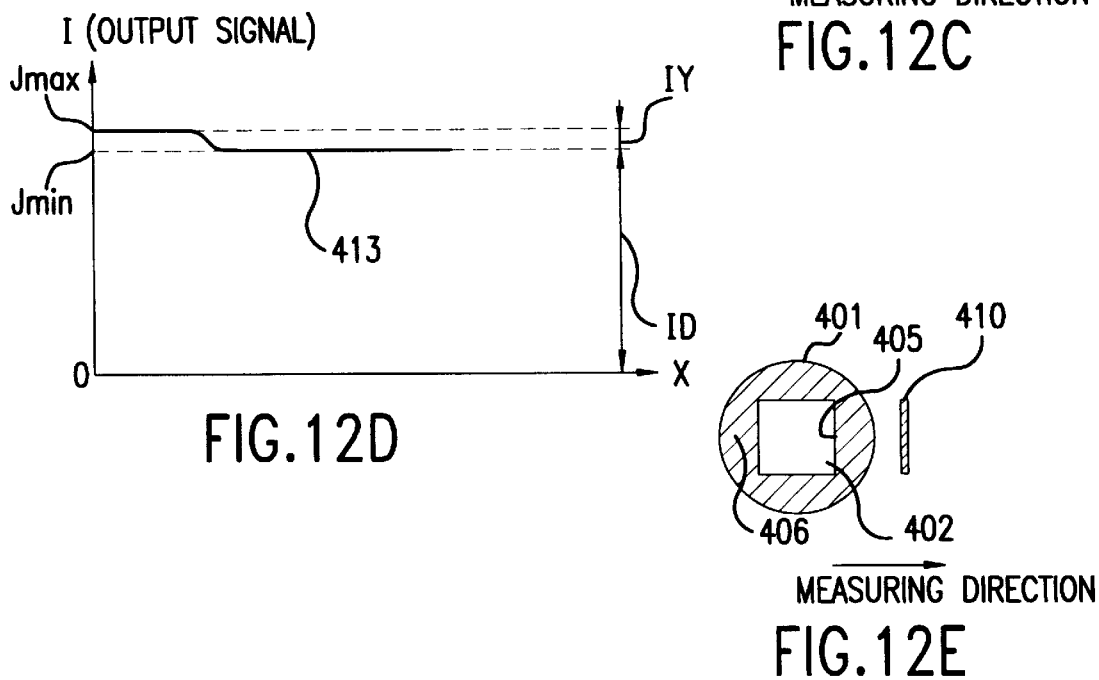
FIG.12D
FIG.12E

EXPOSURE APPARATUS AND METHOD THAT USE MARK PATTERNS TO DETERMINE IMAGE FORMATION CHARACTERISTICS OF THE APPARATUS PRIOR TO EXPOSURE

BACKGROUND OF THE INVENTION

1. Field of the Invention

The present invention relates to a projection exposure apparatus used in the photolithography step for producing, for example, semiconductor elements, liquid crystal display elements, image pickup elements (CCD or the like), or thin film magnetic heads. Specifically, the present invention relates to a projection exposure apparatus having a mechanism for measuring image formation characteristics of a projection optical system by using a spatial image of a mark on a mask. The present invention also relates to a scanning type exposure apparatus for synchronously scanning a mask and a photosensitive substrate with respect to an illumination area on the mask while illuminating the mask on which a circuit pattern is formed so that the photosensitive substrate is successively exposed with the circuit pattern. In particular, the present invention relates to a scanning type exposure apparatus and a scanning type exposure method which make it possible to predict, before actual exposure, an image formation state of an image of a pattern on a mask to be formed by synchronous scanning for the mask and a substrate.

2. Description of the Related Art

The projection exposure apparatus has been hitherto used as an apparatus for forming a circuit pattern of a semiconductor integrated circuit or a liquid crystal substrate on a semiconductor wafer by means of the photolithography technique. In such a projection exposure apparatus, a reticle (mask) is irradiated with an illuminating light beam uniformalized by an illuminating system so that an image of a reticle pattern is formed on a photosensitive substrate through a projection optical system. In order to form a fine circuit pattern, such an apparatus is required to possess highly accurate image formation characteristics. Further, in order to achieve overlay exposure for a plurality of patterns to be superimposed in an identical area on a substrate, such an apparatus is required to have a high overlay accuracy concerning a layer intended to be exposed from now on and a layer having been previously exposed. Accordingly, image formation characteristics, depending on the projection optical system, are previously evaluated before execution of overlay exposure to make correction such that a lens element of the projection optical system is relatively moved in a direction of an optical axis, or a spacing distance between the reticle and a principal point of the projection optical system is changed so that proper image formation characteristics are obtained. Those having been hitherto practiced as methods for previously evaluating image formation characteristics depending on the projection optical system include a method in which a photoresist on a wafer is exposed, before actual exposure, with a pattern on a test reticle on which a plurality of marks are depicted, and coordinates of the marks obtained from a developed image of the test pattern are compared with coordinates of the marks on the reticle. However, such an evaluation method has the following drawbacks. Namely, time and labor are required because preliminary steps of exposure and development are necessary. Moreover, a special apparatus for measuring the image is also required.

The present applicant has disclosed, in Japanese Patent Laid-open No. 59-94032, a method in which a photoelectric sensor is provided on a stage for placing a photosensitive substrate thereon so that positional information on a test pattern on a reticle formed through a projection optical system is directly observed on the basis of an output of the sensor. According to this method, not only initial adjustment for an apparatus can be performed, but also change in image formation characteristics can be readily observed, which is caused due to age-based change of the apparatus, change in external environment such as atmospheric pressure and temperature, change in illuminating light beam-absorbing characteristics of an image formation optical system, and change in apparatus conditions such as illumination conditions for a reticle (solid angle or the like). The image formation characteristics can be corrected on the basis of results of observation as well. The latest projection exposure apparatus is provided with a mechanism for measuring image formation characteristics of a projection optical system for executing the method described above. FIGS. 16A–C illustrate an example of such a mechanism for measuring image formation characteristics of a projection optical system, and a result of observation. FIG. 16A illustrates a schematic structure of a projection exposure apparatus for exposing a wafer W as a photosensitive substrate with a mark pattern (test pattern) on a reticle R through the projection optical system PL. As shown in FIG. 16A, the wafer W is placed on a wafer holder 5 on a wafer stage WST. A fiducial plate 201 is arranged on a surface of the wafer stage WST at a position in the X direction different from a position of the wafer holder 5, and at a height identical to a height of a surface of the wafer W. When the image formation characteristics of the projection optical system PL are measured, the wafer stage WST is moved so that the fiducial plate 201 is located just under the projection optical system PL. The reticle R is illuminated with an illuminating light beam IL so that an image of its mark pattern is formed on the fiducial plate 201. One or a plurality of slits 202 for transmitting the illuminating light beam IL are formed through the fiducial plate 201. A photoelectric sensor 203 for receiving the light beam transmitted through the slit 202 is installed under the fiducial plate 201. The image of the mark pattern 204 on the reticle R can be detected by the photoelectric sensor 203 by moving the wafer stage WST in the horizontal direction (X direction).

FIG. 16B shows a view as viewed from a position over the reticle R, which conceptually represents a positional relationship between the mark pattern 204 on the reticle R and one of the slits 202 on the fiducial plate 201. FIG. 16B illustrates a situation in which the mark pattern 204 on the reticle R is relatively moved in a direction indicated by an arrow across the one of the slits 202. FIG. 16C shows an output of the photoelectric sensor 203 concerning the direction of movement (X direction) described above, i.e., the image of the mark pattern 204 transmitted through the slit 202. Various image formation characteristics of the projection optical system PL can be determined from the output waveform. For example, a contrast of the image can be determined by comparing a reference line width (designed value) with a line width a obtained by slicing the signal waveform at an appropriate slice level. Alternatively, the contrast of the image may be determined by a predetermined computing operation from a size of a peak b. Further, the contrast is determined while moving the fiducial plate 201 in the direction of the optical axis AX of the projection optical system PL, and then, for example, the focal position and the field curvature can be also determined from a position at which the best contrast is obtained. Further, the astigmatism can be also determined by performing measurement by changing the direction of the mark pattern 204. Moreover, a central position c of the mark pattern is determined in a wafer stage coordinate system by recording a coordinate of the wafer stage WST while detecting an image of the mark pattern 204 by means of the photoelectric sensor 203, and thus strain of the image such as distortion can be also determined therefrom.

The projection exposure apparatus shown in FIG. 16A is provided with a positional adjustment sensor (alignment sensor) 205 adjacent to the projection optical system PL, for reading a positional alignment mark (alignment mark) for overlay exposure, formed on the wafer W. The sensor 205 illuminates the positional adjustment mark, and detects the position of the mark by receiving a reflected light beam or a diffracted light beam from the positional adjustment mark. In this procedure, it is also possible to pick up an image of the mark as a two-dimensional image by using an image pickup element as the sensor. When an identical wafer w is overlay-exposed with different reticle patterns, an overlay error concerning the exposure position may occur on the wafer W if the positional relationship varies between the projection optical system PL or an image of a specified pattern on the reticle R and a detecting position of the alignment sensor 205. A distance d between the projection optical system PL and the detecting position of the alignment sensor, or a distance between the image of the specified pattern on the reticle R and the detecting position of the alignment sensor is called "base line" which serves as a reference value when overlay exposure is performed. The distance (base line) is apt to vary due to, for example, change in temperature of the apparatus. Accordingly, it is necessary to periodically measure the distance and always maintain a set value. For this purpose, the base line is previously measured prior to overlay exposure such that a position of an image of a mark pattern on the reticle R is measured by using the photoelectric sensor 203, thereafter the wafer stage WST is moved, and the slit 202 is directly measured, or a position of a positional adjustment mark on the fiducial plate 201, having a previously clarified positional relationship with respect to the slit 202, is measured by using the sensor 205.

However, in the system described above, an amount of light, which is averaged over the measuring direction of the slit, is received. Therefore, the system can make comparison of contrast at most, however, it is impossible to know an accurate profile of the image of the measuring mark 204 on the reticle R. Accordingly, inconveniences arise in that it is impossible to know a delicate difference in line width brought about by a cause of, for example, frame aberration, and it is impossible to know a quality of the image.

Japanese Patent Laid-open No. 1-77125 discloses an apparatus as shown in FIG. 17, as another projection exposure apparatus, provided with a mechanism for previously measuring image formation characteristics of a projection optical system PL. In FIG. 17, a photosensitive object 301 is used in place of the fiducial plate 201 and the photoelectric sensor 203 of the projection exposure apparatus shown in FIG. 16A. A photosensitive object 301, on which an image once formed is erasable, may be used as the photosensitive object 301. Those usable as the photosensitive objects 301 include, for example, a photochromic device and a magneto-optical recording element. At first, the photosensitive object 301 is exposed with a mark pattern 204 on a reticle R. After that, a wafer stage WST is moved in the X direction, and an image of the pattern 204 on the photosensitive object 301 is measured by using a sensor 205. A base line can be determined from a difference between positions of the wafer stage WST during exposure and measurement. When a magneto-optical recording element is used as the photosensitive object 301, the position of the mark pattern can be determined by detecting a polarized light beam from a reflected light beam by using a wavelength constant or the like. The image formation characteristics of the projection optical system PL can be determined by observing the image of the mark pattern formed on the photosensitive object 301 by using the sensor 205, in the same manner as performed in the method for measuring image formation characteristics explained with reference to FIG. 16 C.

FIG. 18A shows another optical system for image formation, having another mechanism for measuring image formation characteristics. FIG. 18A also shows an example of result of observation thereof. FIG. 18A illustrates a schematic structure of an apparatus for exposing a wafer W as a photosensitive substrate with a mark pattern on a reticle R through a projection optical system PL. As shown in FIG. 18A, a wafer stage WST is provided with a photoelectric sensor 220 having two-dimensional resolving power, at a position different from a position of a wafer holder for placing the wafer W thereon. The wafer stage WST is positioned during measurement for the image formation characteristics of the optical system so that the photoelectric sensor 220 is located just under the projection optical system PL, and the wafer W is located outside an exposure area of the projection optical system PL. The photoelectric sensor 220 is, for example, a CCD or an image pickup tube, which can electrically pick up a two-dimensional image. In general, the photoelectric sensor 220 has a positional resolving power which is lower than an image resolving power of the projection exposure apparatus. Therefore, a sufficient degree of accuracy is not obtained if an image is directly formed on the photoelectric sensor 220 (this fact will be also understood from the fact that a CCD or the like is produced by using such a projection exposure apparatus). Accordingly, an image of a test pattern on the reticle R, which is formed by the projection optical system PL, is once magnified approximately 100 to 400 times by using a magnifying optical system 210, and then the image is detected by the photoelectric sensor 220. FIG. 18B shows the mark pattern (test pattern) 240 on the reticle R detected by a detecting section 230 of the photoelectric sensor 220. In order to determine image formation characteristics concerning the projection optical system PL from the detected image, for example, the intensity of a detected signal is measured in the direction 250 of scanning line. Thus it is possible to know, for example, line width a, contrast b, and central coordinate c from a result of measurement as shown in FIG. 18C. Further, based on the result of measurement, it is possible to determine, by calculation, for example, aberration (for example, frame aberration and spherical aberration), focal position, magnification, and distortion of the projection optical system PL. According to this method, a resolving power at a level of picture elements of the photoelectric sensor is obtained by the aid of the magnifying optical system. Accordingly, it is possible to determine an accurate shape of the image of the mark pattern on the reticle. However, this method also suffers an inconvenience that if the image is affected by aberration, it is impossible to distinguish whether the aberration is caused by the magnifying optical system 210 or by the projection optical system PL. Further, the magnifying optical system 210 is relatively large and heavy in weight, which results in another inconvenience that the entire stage is large and heavy, the control performance of the stage is deteriorated, and the measurement itself should be performed on a large scale.

The method for measuring image formation characteristics as described above has been used in the collective exposure system (full field system) represented by the so-called step-and-repeat system. However, in recent years, the exposure apparatus of the so-called slit scan exposure system (hereinafter referred to as "scanning type exposure apparatus") has been developed, which lies in the system for successively exposing a photosensitive substrate with a pattern on a reticle by illuminating a part of a pattern area on the reticle in a shape of slit or circular arc, scanning the reticle across the illumination area, and synchronously scanning the photosensitive substrate in synchronization with the scanning for the reticle, across an exposure area which is in a conjugate relationship with respect to the illumination area in relation to a projection optical system. In the slit scan exposure system, the illumination area on the reticle is smaller than that used in the collective exposure system, and only a part of an image field of the projection optical system is used for exposure. Accordingly, this system has advantages that a projected image suffers relatively less strain, and it is easy to uniformalize the illuminance. On the other hand, it is required to enlarge an areal size for exposure as the areal size of the semiconductor substrate or the like becomes large. In such a situation, this system also has an advantage that the areal size for exposure in the scanning direction can be increased without enlarging the projection optical system itself and without enlarging the image field of the projection optical system.

However, the slit scan exposure system is different from the collective exposure system in that the reticle is moved across the illumination area during a period of formation of one image. Therefore, even in the case of formation of one image, the image is formed by light beams having passed through different portions of the projection optical system. Namely, as a result of the scanning for the reticle across the illumination area during a period in which a certain point on the reticle pattern passes through the illumination area, an optical path for forming its image is continuously moved in the projection optical system. On the contrary, the reticle pattern (object point) is not moved with respect to the illumination area in the conventional method for measuring image formation characteristics. Accordingly, the light beam for forming its image passes through only one optical path in the optical system for image formation. Therefore, as for the slit scan system, even if image formation characteristics are determined by using the conventional method for measuring image formation characteristics, determined results do not necessarily reflect image formation characteristics in actual exposure. For example, if images, which are formed by light beams passed through a plurality of portions of the projection optical system, have mutually different distortions, an image obtained by scanning exposure is widened due to influence of such different distortions, and it exhibits a contrast lower than that of an image measured by the conventional method for measuring image formation characteristics.

The slit scan exposure system suffers additional problems other than those concerning the projection optical system as described above. Namely, the image formation characteristics of the projection optical system are also deteriorated by discrepancy in synchronization between scanning velocities of the reticle and the photosensitive substrate, errors in rotation of the reticle, and vertical movement of the reticle during scanning for the reticle. Further, the image formation characteristics are also deteriorated by, for example, discrepancy in positional relationship between the reticle and the photosensitive substrate caused by vibration of the apparatus brought about by the scanning operation. Especially, as described above, the projection exposure apparatus is provided with the alignment system for illuminating a positional adjustment mark previously formed on the photosensitive substrate, receiving a diffracted light beam or the like from the mark, and detecting a position of the mark, in order to perform exposure while overlaying a plurality of patterns in an identical area on the substrate. The base line of the alignment system is measured in a state in which the wafer stage and the reticle stage stand still when the alignment mark on the wafer is detected. However, in the case of the scanning type exposure apparatus, the wafer is exposed by projection with the reticle pattern by moving both the wafer stage and the reticle stage during actual exposure. Accordingly, the base line measured in the static state is possibly different from a base line obtained in a scanning state. The foregoing matters concern problems inherent in the scanning type exposure apparatus, which cannot be solved by the conventional method for measuring image formation characteristics.

SUMMARY OF THE INVENTION

The present invention has been made in order to solve the problems as described above. An object of the present invention is to provide a scanning type exposure apparatus provided with a mechanism capable of accurately detecting a position or a positional discrepancy of a mark pattern on a mask or a projected image thereof before actual exposure.

Another object of the present invention is to provide a scanning type exposure apparatus provided with a mechanism capable of positional adjustment for a mask and a photosensitive substrate with a high degree of accuracy before actual exposure.

Still another object of the present invention is to provide a scanning type exposure apparatus provided with a mechanism capable of accurately predicting image formation characteristics of a projection optical system or an image formation state of an image of a pattern on a mask before actual exposure.

Still another object of the present invention is to provide a scanning type exposure apparatus provided with a mechanism capable of accurately measuring a base line of an alignment system in the scanning type exposure system.

Still another object of the present invention is to provide a scanning type exposure method capable of accurately predicting, prior to actual exposure steps, image formation characteristics and a position or a positional discrepancy of a mark pattern on a mask or a projected image thereof, during a period in which a mask and a photosensitive substrate are synchronously scanned with respect to an illumination area on the mask.

Still another object of the present invention is to provide a scanning type exposure method based on the foregoing scanning type exposure method, capable of correcting, on the basis of the position or the positional discrepancy of the mark pattern or the projected image thereof, image formation characteristics of a projection optical system and an image formation state of a mask pattern determined in a state in which the mask stands still with respect to the illumination area.

Still another object of the present invention is to provide a scanning type exposure method capable of accurately predicting, prior to actual exposure steps, image formation characteristics of a projection optical system or an image formation state of an image of a mark pattern formed by synchronously scanning a mask and a photosensitive substrate with respect to an illumination area on the mask.

Still another object of the present invention is to provide a scanning type exposure method capable of accurately measuring a base line of an alignment system.

Still another object of the present invention is to provide a projection exposure apparatus capable of measuring image formation characteristics of a projection optical system with a high degree of accuracy. In particular, an object of the present invention is to provide a projection exposure apparatus capable of effectively utilizing a dynamic range (effective measuring range) of a photoelectric conversion element used to measure image formation characteristics, especially of a photoelectric conversion element of the edge scan type, and measuring image formation characteristics with a high degree of accuracy even in the case of occurrence of, for example, change in amount of light for a measuring mark and change in amount of light at the inside of a projection optical system.

The term "illumination area" referred to herein means an area on a mask (reticle) defined by illumination of an illuminating light beam. Usually, the size of the illumination area is restricted by, for example, a field diaphragm arranged in an illuminating optical system. The term "exposure area" referred to herein means an area on a photosensitive substrate exposed with an illuminating light beam radiated through a projection optical system. The exposure area and the illumination area are in a conjugate relationship (relationship of image formation) in relation to the projection optical system. Usually, a scanning type exposure apparatus performs scanning by moving the mask across the illumination area in a one-dimensional direction, and moving the photosensitive substrate across the exposure area in synchronization therewith in a direction opposite to the one-dimensional direction.

According to a first aspect of the present invention, there is provided a scanning type exposure apparatus provided with a mask stage for scanning a mask across an illumination area on the mask, a projection optical system for projecting an image of a pattern on the mask onto a photosensitive substrate, and a substrate stage for scanning the photosensitive substrate across an exposure area which is conjugate to the illumination area in relation to the projection optical system, the scanning type exposure apparatus comprising:

a photoelectric detector, including a light-receiving section provided on the substrate stage, for photoelectrically detecting an image of a mark pattern on the mask; and a combining system for combining signals outputted from the photoelectric detector during a period in which the light-receiving section is scanned across the exposure area in synchronization with scanning for the mark pattern across the illumination area; wherein a position or a positional discrepancy of the image of the mark pattern is detected on the basis of an output of the combining system. The scanning type exposure apparatus of the present invention includes the light-receiving section of the photoelectric detector, provided on the substrate stage. Accordingly, it is possible to previously measure the image of the test mark pattern on the mask under a condition of actual scanning exposure, i.e., under a dynamic condition in which the mask stage and the substrate stage are moved for scanning the mask and the substrate. Provision of the means for combining outputs from the photoelectric detector makes it possible to depict a composite image of the mark pattern formed by light beams transmitted through various portions of the projection optical system during a period of one time of scanning in actual exposure. The composite image makes it possible to know a position and a positional discrepancy of an image to be formed by actual exposure. Such a positional discrepancy is generated by movement of the stage for scanning or the like. Accordingly, this positional discrepancy cannot be obtained by the conventional static method for measuring image formation characteristics.

The scanning type exposure apparatus may further comprise an alignment system for illuminating an alignment mark on the photosensitive substrate, receiving a reflected light beam from the alignment mark, and detecting a position or a positional discrepancy thereof, wherein a difference between the detected position of the image of the mark pattern and a light-irradiating position of the alignment system is used as a base line of the alignment system. In the present invention, the difference between the position of the image of the mark pattern detected by the light-receiving section and the light-irradiating position of a light source of the alignment system is defined as the base line of the alignment system. Thus it is possible to perform alignment for the photosensitive substrate and the mask more accurately upon overlay exposure.

The scanning type exposure apparatus may further comprise a detector for detecting at least one of a position and an amount of rotation of the image of the pattern on the mask on the basis of positions or positional discrepancies of respective images of a plurality of mark patterns on the mask, wherein a result of detection obtained by the detector is used to perform alignment for the mask and the photosensitive substrate. For example, instead of detection of an amount of rotation and a position of the reticle (position of the mark pattern) in a static state of the mask, the position of the reticle is detected in a state of scanning by the mask stage in actual exposure to perform an overlay operation on the basis of a result of measurement for the position of the wafer by an alignment sensor and positional information on the reticle during the scanning. Further, the reticle or the wafer is rotated to cancel any rotational error. Accordingly, the position of the wafer can be adjusted in relation to the position of the reticle during actual exposure. The scanning type exposure apparatus may further comprise a computing unit for calculating image formation characteristics of the projection optical system on the basis of positions or positional discrepancies of respective images of a plurality of mark patterns on the mask.

According to a second aspect of the present invention, there is provided a scanning type exposure apparatus provided with a mask stage for scanning a mask across an illumination area on the mask, a projection optical system for projecting an image of a pattern on the mask onto a photosensitive substrate, and a substrate stage for scanning the photosensitive substrate across an exposure area which is conjugate to the illumination area in relation to the projection optical system, the scanning type exposure apparatus comprising:

a photoelectric detector, including a light-receiving section arranged on the substrate stage, for photoelectrically detecting an image of a mark pattern on the mask;

a combining system for combining signals outputted from the photoelectric detector during a period in which the light-receiving section is scanned across the exposure area in synchronization with scanning for the mark pattern across the illumination area; and a computing unit for calculating an image formation state of the image of the mark pattern on the basis of an output of the combining system. The scanning type exposure apparatus of the present invention includes the light-receiving section of the photoelectric detector, arranged on the substrate stage. Accordingly, it is possible to previously measure the image of the test mark pattern on the mask under a condition of actual scanning exposure. Provision of the means for combining outputs from the photoelectric detectors makes it possible to depict a composite image of the mark pattern formed by light beams transmitted through various portions of the projection optical system during a period of one time of scanning in actual exposure. The use of the composite image makes it possible to know, by the aid of calculation, image formation characteristics of an image to be formed by actual scanning exposure, including, for example, a magnification and a contrast.

Preferably, the scanning type exposure apparatus further comprises a correcting system for correcting the image formation characteristics of the projection optical system in accordance with a result of calculation by the computing unit. The correcting system may be a stage controller for controlling scanning velocities or scanning directions of the mask stage and the substrate stage. Optimum image formation characteristics can be obtained by changing the movement velocities of the respective stages by using the stage controller.

In the scanning type exposure apparatus of the present invention, the photoelectric detector may comprise an image pickup element having its light-receiving surface arranged in a plane substantially conjugate to the light-receiving section, and a magnifying optical system for magnifying the image of the mark pattern and forming an image on the light-receiving surface. It may be approved that a mechanism for forming an image by the process of accumulation of light energy in a photosensitive agent during a period of scanning when the photosensitive substrate is exposed in accordance with the exposure operation is equivalent to a mechanism for forming an image by the image pickup element by the process of photoelectric detection. Accordingly, the use of the image pickup element makes it possible to predict an image to be formed during actual exposure.

According to a third aspect of the present invention, there is provided a scanning type exposure method comprising scanning a mask across an illumination area on the mask while illuminating the mask, and scanning a photosensitive substrate across an exposure area which is conjugate to the illumination area in relation to a projection optical system, in synchronization with the scanning for the mask so that the photosensitive substrate is exposed with a pattern on the mask through the projection optical system, the scanning type exposure method comprising:

scanning a photoelectric detector in place of the photosensitive substrate in synchronization with scanning for the mask before the photosensitive substrate is exposed with the pattern on the mask, the photoelectric detector being provided for detecting an image of a mark pattern formed on the mask; and combining signals outputted from the detector for detecting the image of the mark pattern during the scanning to determine a position or a positional discrepancy of the image of the mark pattern on the mask during the scanning. The photoelectric detector which is, for example, a light-receiving section of an image pickup element, and the mask are synchronously scanned with respect to the illumination area on the mask. Thus the image of the test pattern on the mask can be formed under a condition of actual scanning exposure, i.e., a dynamic condition in which the mask stage and the substrate stage are moved. The obtained image makes it possible to know, prior to actual exposure, the positional discrepancy of the image which would be generated by the use of the scanning type exposure method.

Preferably, the scanning type exposure method further comprises detecting an image of the mark pattern in the exposure area while illuminating the mark pattern on the mask in a state in which the mask is fixed with respect to the illumination area, and correcting information on a detected position of the image of the mark pattern by using the determined position or the determined positional discrepancy of the image of the mark pattern on the mask during the scanning. The information on the position of the image measured under the conventional static condition as shown in FIG. 18A can be previously corrected by using the position or the positional discrepancy measured under the dynamic condition of scanning exposure accompanied by the movement of the mask stage and the substrate stage. For example, image formation characteristics can be predicted prior to actual exposure by using the corrected positional information, and thus the exposure condition can be corrected upon exposure in accordance with various methods.

According to a fourth aspect of the present invention, there is provided a scanning type exposure method comprising scanning a mask across an illumination area on the mask while illuminating the mask, and scanning a photosensitive substrate across an exposure area which is conjugate to the illumination area in relation to a projection optical system, in synchronization with the scanning for the mask so that the photosensitive substrate is exposed with a pattern on the mask through the projection optical system, the scanning type exposure method comprising scanning a light-receiving section of a photoelectric detector in place of the photosensitive substrate in synchronization with scanning for the mask before the photosensitive substrate is exposed with the pattern on the mask, the photoelectric detector being provided for detecting an image of a mark pattern formed on the mask, combining signals outputted from the photoelectric detector during the scanning to determine the image of the mark pattern on the mask during the scanning, and computing image formation characteristics of the projection optical system on the basis of the obtained image of the mark pattern. According to this method, the image of the test pattern on the mask can be formed under a condition of actual scanning exposure, i.e., a dynamic condition in which the mask stage and the substrate stage are moved, and thus the image formation characteristics can be determined. Accordingly, it is possible to previously know the difference between the image formation characteristics upon actual exposure and image formation characteristics determined in a state in which the mask stage and the reticle stage stand still. Therefore, the image formation characteristics measured under the dynamic condition can be corrected, for example, by adjusting the movement velocity of the stage.

According to a fifth aspect of the present invention, there is provided a method for producing microdevices by using the scanning type exposure apparatus in accordance with the first or second aspect of the present invention. Thus microdevices can be produced with a high degree of accuracy.

According to a sixth aspect of the present invention, there is provided a scanning type exposure apparatus provided with a mask stage for scanning a mask across an illumination area on the mask, a projection optical system for projecting an image of a pattern on the mask onto a photosensitive substrate, and a substrate stage for scanning the photosensitive substrate across an exposure area which is conjugate to the illumination area in relation to the projection optical system, the scanning type exposure apparatus comprising:

a photosensitive object installed on the substrate stage;

a detector for detecting an image of a mark pattern formed on the photosensitive object during a period in which the photosensitive object is scanned across the exposure area in synchronization with scanning for the mark pattern across the illumination area; and an image formation state-computing unit for determining an image formation state of the image of the mark pattern on the basis of a result of detection fed from the detector. The scanning type exposure apparatus includes the photosensitive object installed on the substrate stage. Accordingly, the image of the test mark pattern on the mask can be previously detected on the photosensitive object under a condition of actual scanning exposure, i.e., under a dynamic condition in which the mask stage and the substrate stage are moved in order to scan the mask and the substrate. The image of the pattern on the mask is formed (by exposure) on the photosensitive object in accordance with the same principle as that of exposure for the photosensitive substrate during a period of one time of scanning in actual exposure. Therefore, the positional information and the image formation state of an image to be formed by actual exposure can be predicted by observing, for example, the mark pattern on the mask formed on the photosensitive object prior to actual exposure.

Preferably, the scanning type exposure apparatus according to the sixth aspect further comprises a correcting system for correcting the image formation state in accordance with a result of computing operation by the image formation state-computing unit. If the computed image formation state is different from an image formation state measured under a static condition or a designed value, the image formation characteristics can be corrected prior to actual exposure by using the correcting system. The correction can be executed by controlling scanning velocities or scanning directions of the mask stage and the substrate stage by using a stage controller.

According to a seventh aspect of the present invention, there is provided a scanning type exposure apparatus provided with a mask stage for scanning a mask across an illumination area on the mask, a projection optical system for projecting an image of a pattern on the mask onto a photosensitive substrate, and a substrate stage for scanning the photosensitive substrate across an exposure area which is conjugate to the illumination area in relation to the projection optical system, the scanning type exposure apparatus comprising:

a photosensitive object installed on the substrate stage;

a detector for detecting an image of a mark pattern formed on the photosensitive object during a period in which the photosensitive object is scanned across the exposure area in synchronization with scanning for the mark pattern across the illumination area; and a positional adjustment mark detector for illuminating a positional adjustment mark formed on the photosensitive substrate, and photoelectrically detecting a light beam coming from the positional adjustment mark; wherein a base line of the positional adjustment mark detector is determined on the basis of a detected position of the image of the mark pattern and a detecting position of the positional adjustment mark detector. The scanning type exposure apparatus includes the photosensitive object installed on the substrate stage. Accordingly, the base line of the positional adjustment mark detector can be defined under a condition of actual scanning exposure, i.e., under a dynamic condition in which the mask stage and the substrate stage are moved in order to scan the mask and the substrate. Therefore, it is possible to reduce the overlay error in exposure, caused by vibration or the like of the projection optical system brought about by the movement of the mask stage and the substrate stage.

In the scanning type exposure apparatus according to the sixth or seventh aspect, the detector for detecting the image of the mark pattern formed on the photosensitive object may be a positional adjustment mark detector for illuminating a positional adjustment mark formed on the photosensitive substrate, and photoelectrically detecting a light beam coming from the positional adjustment mark. A detector for detecting the image of the mark pattern formed on the photosensitive object may be separately provided. However, the positional adjustment mark detector, which is included in an ordinary projection exposure apparatus, is used for the purpose of the present invention as well. Thus the arrangement of the apparatus can be simplified. Preferably, the scanning type exposure apparatus further comprises an adjusting system for adjusting one of an intensity of an illuminating light beam and a sensitivity of the photosensitive object so that the photosensitive object is uniformly exposed during the period of synchronous scanning for the mark pattern and the photosensitive object. The degree of photosensitivity of the photosensitive substrate to be actually exposed is different from that of the photosensitive object. Accordingly, the adjusting system makes it possible to form the image of the mark pattern on the photosensitive object under the same condition as that in actual exposure.

According to an eighth aspect of the present invention, there is provided a scanning type exposure method comprising scanning a mask across an illumination area on the mask while illuminating the mask, and scanning a photosensitive substrate across an exposure area which is conjugate to the illumination area in relation to a projection optical system, in synchronization with the scanning for the mask so that the photosensitive substrate is exposed with a pattern on the mask through the projection optical system, the scanning type exposure method comprising:

scanning a photosensitive object in synchronization with scanning for the mask before the photosensitive substrate is exposed with the pattern on the mask;

detecting an image of a mark pattern formed on the photosensitive substrate during the scanning; and computing an image formation state of an image of the pattern on the mask on the basis of the detected image of the mark pattern. According to the scanning type exposure method, the photosensitive object and the mask are synchronously scanned prior to actual scanning exposure. Thus the image of the test mark pattern on the mask can be previously observed on the photosensitive object under a condition of actual scanning exposure, i.e., under a dynamic condition in which the mask stage and the substrate stage are moved for scanning the mask and the substrate. The image of the mask pattern is formed (by exposure) on the photosensitive object in accordance with the same principle as that of exposure for the photosensitive substrate during a period of one time of scanning in actual exposure. Therefore, the positional information and the image formation state of an image to be formed by actual exposure can be predicted by previously observing, for example, the mark pattern on the mask formed on the photosensitive object. It is preferred that the scanning type exposure method further comprises a step of correcting the computed image formation state.

According to a ninth aspect of the present invention, there is provided a scanning type exposure method comprising scanning a mask across an illumination area on the mask while illuminating the mask, and scanning a photosensitive substrate across an exposure area which is conjugate to the illumination area in relation to a projection optical system, in synchronization with the scanning for the mask so that the photosensitive substrate is exposed with a pattern on the mask through the projection optical system, the scanning type exposure method comprising:

scanning a photosensitive object in synchronization with scanning for the mask before the photosensitive substrate is exposed with the pattern on the mask;

detecting an image of a mark pattern formed on the photosensitive substrate during the scanning; and determining a base line of a positional adjustment mark detector for detecting a positional adjustment mark formed on the photosensitive substrate, on the basis of a detected position of the image of the mark pattern and a detecting position of the detector. According to the scanning type exposure method, the base line of the positional adjustment mark detector can be defined under a condition of actual scanning exposure, i.e., under a dynamic condition in which the mask stage and the substrate stage are moved in order to scan the mask and the substrate. Therefore, it is possible to reduce the overlay error in exposure, caused by vibration or the like of the projection optical system brought about by the movement of the mask stage and the substrate stage.

In the scanning type exposure apparatuses according to the sixth and seventh aspect of the present invention and the scanning type exposure methods according to the eighth and ninth aspect of the present invention, the photosensitive object is preferably a photosensitive object from which an exposed image is erasable. For example, it is possible to use a photochromic element and a magneto-optical recording element. Alternatively, it is also possible to use a photosensitive substrate to be actually exposed, as the photosensitive object.

According to a tenth aspect of the present invention, there is provided a method for producing microdevices by using the scanning type exposure apparatus according to the sixth or seventh aspect of the present invention.

According to an eleventh aspect of the present invention, there is provided a scanning type exposure apparatus provided with a mask stage for scanning a mask across an illumination area on the mask, a projection optical system for projecting an image of a pattern on the mask onto a photosensitive substrate, and a substrate stage for scanning the photosensitive substrate across an exposure area which is conjugate to the illumination area in relation to the projection optical system, in synchronization with the scanning for the mask, the scanning type exposure apparatus comprising a photoelectric detector for photoelectrically detecting, on the substrate stage, an image of a mark pattern on the mask, a synchronization error detector for detecting a synchronization error caused by the synchronous scanning for the photosensitive substrate and the mask, for example, at each of positions of the mask or the photosensitive substrate (or with an average value thereof), and an image formation state-computing unit for computing an image formation state of the image of the mark pattern obtained by the synchronous scanning, on the basis of the synchronization error detected by the synchronization error detector and images of the mark pattern corresponding to various positions in a scanning direction detected by the photoelectric detector respectively when the mark pattern is located at the respective positions in the scanning direction in the illumination area, wherein an image formation state of the image of the pattern on the mask to be obtained by the synchronous scanning for the photosensitive substrate and the mask is predicted from a result of computing operation by the image formation state-computing unit.

In the scanning type exposure apparatus according to the eleventh aspect of the present invention, the mask stage moves the mark pattern on the mask to the various positions in the illumination area, and the photoelectric detector detects the images (static images) of the mark pattern formed through the projection optical system. The images are formed by light beams passed through different optical paths in the projection optical system respectively. The synchronization error detector detects the synchronization error comprising a synchronization discrepancy in stage velocity, a positional discrepancy of the photosensitive substrate in the Z direction, involved in movement of the mask stage and the substrate stage during actual scanning exposure, and a discrepancy in image formation state caused by vibration of the projection optical system. The image formation state-computing unit can compute the image formation state of the image of the mark pattern to be formed under a condition of actual scanning exposure, by correcting the image formation states of the images of the mark pattern detected when the mark pattern is located at the respective positions in the illumination area, by using the detected synchronization error, and overlaying corrected images with each other.

Preferably, the scanning type exposure apparatus according to the eleventh aspect further comprises a correcting system for correcting an image formation state in accordance with a result of computing operation by the image-formation state-computing unit. The image formation characteristics can be corrected prior to actual exposure by using the correcting system when the computed image formation state is different from a designed value or an image formation state measured under a static condition as having been hitherto performed. The correction can be executed by controlling scanning velocities or scanning directions of the mask stage and the substrate stage by using a stage controller.

According to a twelfth aspect of the present invention, there is provided a scanning type exposure apparatus provided with a mask stage for scanning a mask across an illumination area on the mask, a projection optical system for projecting an image of a pattern on the mask onto a photosensitive substrate, and a substrate stage for scanning the photosensitive substrate across an exposure area which is conjugate to the illumination area in relation to the projection optical system, in synchronization with the scanning for the mask, the scanning type exposure apparatus comprising a photoelectric detector for photoelectrically detecting, on the substrate stage, an image of a mark pattern on the mask, a synchronization error detector for detecting a synchronization error caused by the synchronous scanning for the photosensitive substrate and the mask, for example, a teach of positions of the mask or the photosensitive substrate, an image position-computing unit for computing a position of the image of the mark pattern on the basis of the synchronization error detected by the synchronization error detector and images of the mark pattern corresponding to various positions in a scanning direction detected by the photoelectric detector respectively when the mark pattern is located at the respective various positions in the scanning direction in the illumination area, and a positional adjustment mark detector for illuminating a positional adjustment mark formed on the photosensitive substrate, and photoelectrically detecting a light beam coming from the positional adjustment mark, wherein a base line of the positional adjustment mark detector is determined on the basis of the computed position of the image of the mark pattern and a detecting position of the positional adjustment mark detector. The computed position of the image of the mark pattern relates to the image formed under a condition equivalent to that of actual scanning exposure in accordance with the same principle as that of the scanning type exposure apparatus according to the eleventh aspect of the present invention. Accordingly, the base line of the positional adjustment mark detector can be determined on the basis of the position of the image. Thus the base line is determined on the basis of the position of the image to be formed by actual scanning type exposure. Therefore, it is possible to reduce the overlay error in exposure, caused by, for example, vibration of the projection optical system brought about by movement of the mask stage and the substrate stage. Moreover, it is possible to improve the overlay accuracy in scanning type exposure.

In the scanning type exposure apparatuses according to the eleventh and twelfth aspects, the photoelectric detector may comprise a light-receiving section having a slit formed thereon, and a sensor for photoelectrically detecting a light beam transmitted through the slit, and the image of the mark pattern may be photoelectrically detected by relatively moving the slit of the light-receiving section and the image of the mark pattern on the mask in a direction parallel to the scanning direction. The synchronization error may include a positional discrepancy of each of the stages caused by synchronous movement of the substrate stage and the mask stage, and a discrepancy in image formation characteristics caused by vibration of the projection optical system. A photoelectric conversion element for detecting a spatial image of a mark on the mask, formed through the projection optical system, through an aperture having a width wider than the spatial image in a measuring direction may be used as the photoelectric detector. Further, the image formation state-computing unit or the image position-computing unit may be allowed to compute the image formation state or the position of the image of the mark pattern obtained by the synchronous scanning, on the basis of the synchronization error detected by the synchronization error detector and images of the mark pattern obtained from detection signals outputted from the photoelectric conversion element by relatively moving the spatial image and the aperture in the measuring direction by the aid of the substrate stage when the mark pattern is located at various positions in the scanning direction in the illumination area. In such an embodiment, it is effective that the scanning type exposure apparatus comprises a light amount-adjusting unit for adjusting an amount of incident light coming into the photoelectric conversion element in conformity with an effective measuring range of the photoelectric conversion element.

According to a thirteenth aspect of the present invention, there is provided a scanning type exposure apparatus provided with a mask stage for scanning a mask across an illumination area on the mask, a projection optical system for projecting an image of a pattern on the mask onto a photosensitive substrate, and a substrate stage for scanning the photosensitive substrate across an exposure area which is conjugate to the illumination area in relation to the projection optical system, in synchronization with the scanning for the mask, the scanning type exposure apparatus comprising a detecting system for illuminating a mark pattern established on an object plane or an image plane of the projection optical system, and detecting, on the image plane or the object plane, an image of the mark pattern formed by the projection optical system, a synchronization error detector for detecting a synchronization error caused by the synchronous scanning for the photosensitive substrate and the mask, for example, at each of positions of the mask or the photosensitive substrate, and an image formation state-computing unit for computing an image formation state of the image of the mark pattern obtained by the synchronous scanning, on the basis of the synchronization error detected by the synchronization error detector and images of the mark pattern corresponding to various positions in a scanning direction detected by the detecting system respectively when the mark pattern is located at the respective various positions in the scanning direction, wherein an image formation state of the image of the pattern on the mask to be obtained by the synchronous scanning for the photosensitive substrate and the mask is predicted from a result of computing operation by the image formation state-computing unit. In this apparatus, the mark pattern is established on the object plane or the image plane of the projection optical system. For example, the mark pattern is formed on either the mask or the photosensitive substrate. The image of the mark pattern formed by the projection optical system is detected by the detecting system installed on the image plane or the object plane, for example, on the mask stage or the substrate stage. The image formation state of the image of the mask pattern to be formed in actual scanning exposure can be predicted in accordance with the same principle as that of the scanning type exposure apparatus according to the eleventh aspect.

According to a fourteenth aspect of the present invention, there is provided a scanning type exposure method comprising scanning a mask across an illumination area on the mask while illuminating the mask, and scanning a photosensitive substrate across an exposure area which is conjugate to the illumination area in relation to a projection optical system, in synchronization with the scanning for the mask so that the photosensitive substrate is exposed with a pattern on the mask through the projection optical system, the scanning type exposure method comprising arranging a mark pattern on the mask at various positions in a scanning direction in the illumination area, photoelectrically detecting an image of the mark pattern formed by the projection optical system at each of the positions respectively before the photosensitive substrate is exposed with the pattern on the mask, synchronously scanning the photosensitive substrate and the mask at the same scanning velocities as those in actual scanning exposure so that a synchronization error caused by the synchronous scanning is detected for each of positions of the mask or the photosensitive substrate, and computing an image formation state of the image of the mark pattern obtained by the synchronous scanning, on the basis of the detected synchronization error and the photoelectrically detected image of the mark pattern corresponding to each of the positions in the scanning direction, thereby predicting image formation characteristics of the image of the pattern on the mask to be obtained by the synchronous scanning for the mask and the photosensitive substrate.

In the scanning type exposure method according to the fourteenth aspect of the present invention, the mark pattern on the mask is moved to the various positions in the illumination area, and the images (static images) of the mark pattern formed by the projection optical system are photoelectrically detected while fixing the mask stage at the respective positions. The images are formed by light beams passed through different optical paths in the projection optical system respectively. A synchronization discrepancy in stage velocity, a positional discrepancy of the photosensitive substrate in the Z direction, involved in movement of the mask stage and the photosensitive substrate during actual scanning exposure, and a discrepancy in image formation characteristics caused by vibration of the projection optical system are previously detected as the synchronization error by synchronously scanning the photosensitive substrate and the mask beforehand. The detected synchronization error is used to correct the image formation state of the image of the mark pattern detected when the mark pattern is located at each of the positions in the illumination area. The corrected images are overlaid with each other. Thus it is possible to measure the image of the mark pattern, formed under a condition equivalent to that of actual scanning type exposure.

According to a fifteenth aspect of the present invention, there is provided a scanning type exposure method which uses a projection exposure apparatus provided with a detector for detecting a positional adjustment mark formed on a photosensitive substrate, which includes scanning a mask across an illumination area on the mask while illuminating the mask, and scanning the photosensitive substrate across an exposure area which is conjugate to the illumination area in relation to a projection optical system, in synchronization with the scanning for the mask so that the photosensitive substrate is exposed with a pattern on the mask through the projection optical system, comprising; arranging a mark pattern on the mask at various positions in a scanning direction in the illumination area, photoelectrically detecting an image of the mark pattern formed by the projection optical system at each of the positions respectively before the photosensitive substrate is exposed with the pattern on the mask, synchronously scanning the photosensitive substrate and the mask so that a synchronization error caused by the synchronous scanning is detected for each of positions of the mask or the photosensitive substrate, computing a position of the image of the mark pattern on the mask on the basis of the detected synchronization error and the photoelectrically detected image of the mark pattern at each of the positions in the scanning direction, and determining a base line of the positional adjustment mark detector on the basis of the computed position of the mark pattern and a detecting position of the detector for detecting the positional adjustment mark on the photosensitive substrate. The computed image of the mark pattern is formed under a condition equivalent to that of actual scanning type exposure in accordance with the same principle as that of the scanning type exposure method according to the fourth aspect of the present invention. Therefore, the base line of the positional adjustment mark detector can be determined on the basis of the position of the image. Accordingly, it is possible to reduce the overlay error in exposure, caused by vibration or the like of the projection optical system brought about by movement of the mask stage and the substrate stage.

In the scanning type exposure method according to the fifteenth aspect of the present invention, the image of the mark pattern formed by the projection optical system may be photoelectrically detected by relatively moving the image of the mark pattern and a light-receiving section of a photoelectric detector in a direction parallel to the scanning direction.

According to a sixteenth aspect of the present invention, there is provided a method for producing microdevices by using the scanning type exposure apparatus according to any one of the eleventh to thirteenth aspects of the present invention.

According to a seventeenth aspect of the present invention, there is provided a projection exposure apparatus provided with a projection optical system for projecting an image of a transferring pattern formed on a mask onto a photosensitive substrate under an illuminating light beam for exposure, and a substrate stage for moving the substrate in a plane perpendicular to an optical axis of the projection optical system, the projection exposure apparatus comprising, a photoelectric conversion element for detecting a spatial image of a measuring mark on the mask, formed through the projection optical system, through an aperture having a width wider than the spatial image in a measuring direction, under an illuminating light beam in the same wavelength region as that of the illuminating light beam for exposure, an image formation characteristic-calculating unit for calculating image formation characteristics of the projection optical system on the basis of a detection signal outputted from the photoelectric conversion element when the spatial image and the aperture are relatively moved in the measuring direction by the aid of the substrate stage, and a light amount-adjusting unit for adjusting an amount of incident light coming into the photoelectric conversion element in conformity with an effective measuring range (dynamic range) of the photoelectric conversion element.

According to the projection exposure apparatus, the operation is basically performed, for example, as described in an embodiment shown in FIGS. 11A to 11D, by using a detection signal I obtained from a photoelectric conversion element 403 when an aperture 402 having a wide width is relatively scanned across an image 204R of a measuring mark. For example, the detection signal I is differentiated to perform positional detection. According to this system (edge scan system), it is possible to know a fine structure of the image 204R of the measuring mark as well. However, based on only such knowledge, it is impossible to cope with change in amount of illuminating light. Thus, for example, when the amount of light coming into the photoelectric conversion element changes depending on the change in illumination condition or the type of the pattern to be measured, the amount of light is always controlled by using the light amount-adjusting unit in conformity with the effective measuring range of the photoelectric conversion element. Accordingly, it is possible to increase signal components corresponding to the spatial image of the measuring mark within the effective measuring range of the photoelectric conversion element. Therefore, the position of the spatial image of the measuring mark can be measured with a high degree of accuracy, and consequently the image formation characteristics can be measured with a high degree of accuracy.

In this aspect, an example of the light amount-adjusting unit is a spatial filter having a variable dimming ratio, for adjusting the amount of incident light coming into the photoelectric conversion element in conformity with the effective measuring range of the photoelectric conversion element irrelevant to any change in illumination condition on the measuring mark. Accordingly, the amount of incident light can be controlled by using a simple system in conformity with the effective measuring range of the photoelectric conversion element.

Another example of the light amount-adjusting unit is shielding zones provided in front of and at the back of the measuring mark, for adjusting the amount of incident light coming into the photoelectric conversion element in conformity with th e effective measuring range of the photoelectric conversion element irrelevant to any change in illumination condition on the measuring mark. Unnecessary illuminating light is intercepted by the shielding zones provided in front of and at the back of the measuring mark.

Thus it is possible to increase the ratio of signal components in the effective measuring range of the photoelectric conversion element. Therefore, it is possible to detect a shielding pattern with a high degree of accuracy as well.

According to an eighteenth aspect of the present invention, there is provided a projection exposure apparatus provided with a projection optical system for projecting an image of a transferring pattern formed on a mask onto a photosensitive substrate under an illuminating light beam for exposure, and a substrate stage for moving the substrate in a plane perpendicular to an optical axis of the projection optical system, the projection exposure apparatus comprising a photoelectric conversion element for detecting a spatial image of a measuring mark on the mask, formed through the projection optical system, through an aperture having a width wider than the spatial image in a measuring direction, under an illuminating light beam in the same wavelength region as that of the illuminating light beam for exposure, and an image formation characteristic-calculating unit for calculating image formation characteristics of the projection optical system on the basis of a detection signal outputted from the photoelectric conversion element when the spatial image and the aperture are relatively moved in the measuring direction by the aid of the substrate stage, wherein the measuring mark comprises one or a plurality of shielding patterns, based on the use of a mask for evaluation having shielding zones provided in front of and at the back of the shielding pattern or patterns in the measuring direction, at a spacing distance d1 as measured for a projected image thereof, and the aperture for restricting an amount of incident light coming into the photoelectric conversion element has a width d2 which is wider than the spacing distance d1 in the measuring direction.

According to the projection exposure apparatus according to the eighteenth aspect of the present invention, when the spatial image is measured in accordance with the edge scan system, a state is obtained in which projected images of edges of the shielding zones are necessarily accommodated in the aperture because the spacing distance d2 of the aperture in the measuring direction is wider than the spacing distance d1 in the measuring direction between projected images of the shielding zones. Therefore, even when the measuring mark comprises a lonely shielding pattern in which the SN ratio would be deteriorated if such a shielding pattern is used as it is, the amount of incident light coming into the photoelectric conversion element is controlled, and the ratio of signal components existing in the effective measuring range of the photoelectric conversion element is increased. Thus the image formation characteristics can be measured with a high degree of accuracy.

BRIEF DESCRIPTION OF THE DRAWINGS

FIG. 12A shows a signal waveform from an edge scan type sensor used in the fourth embodiment of the present invention.

FIG. 12B shows an output signal waveform from the sensor when a shielding pattern comprises three basic marks.

FIG. 12C conceptually shows a relationship between the fiducial plate and a mark image when the shielding pattern comprises three basic marks.

FIG. 12D shows an output signal waveform from the sensor when a shielding pattern comprises one basic mark.

FIG. 12E conceptually shows a relationship between the fiducial plate and a mark image when the shielding pattern comprises one basic mark.

DESCRIPTION OF THE PREFERRED EMBODIMENTS

First Embodiment

Figure 1:
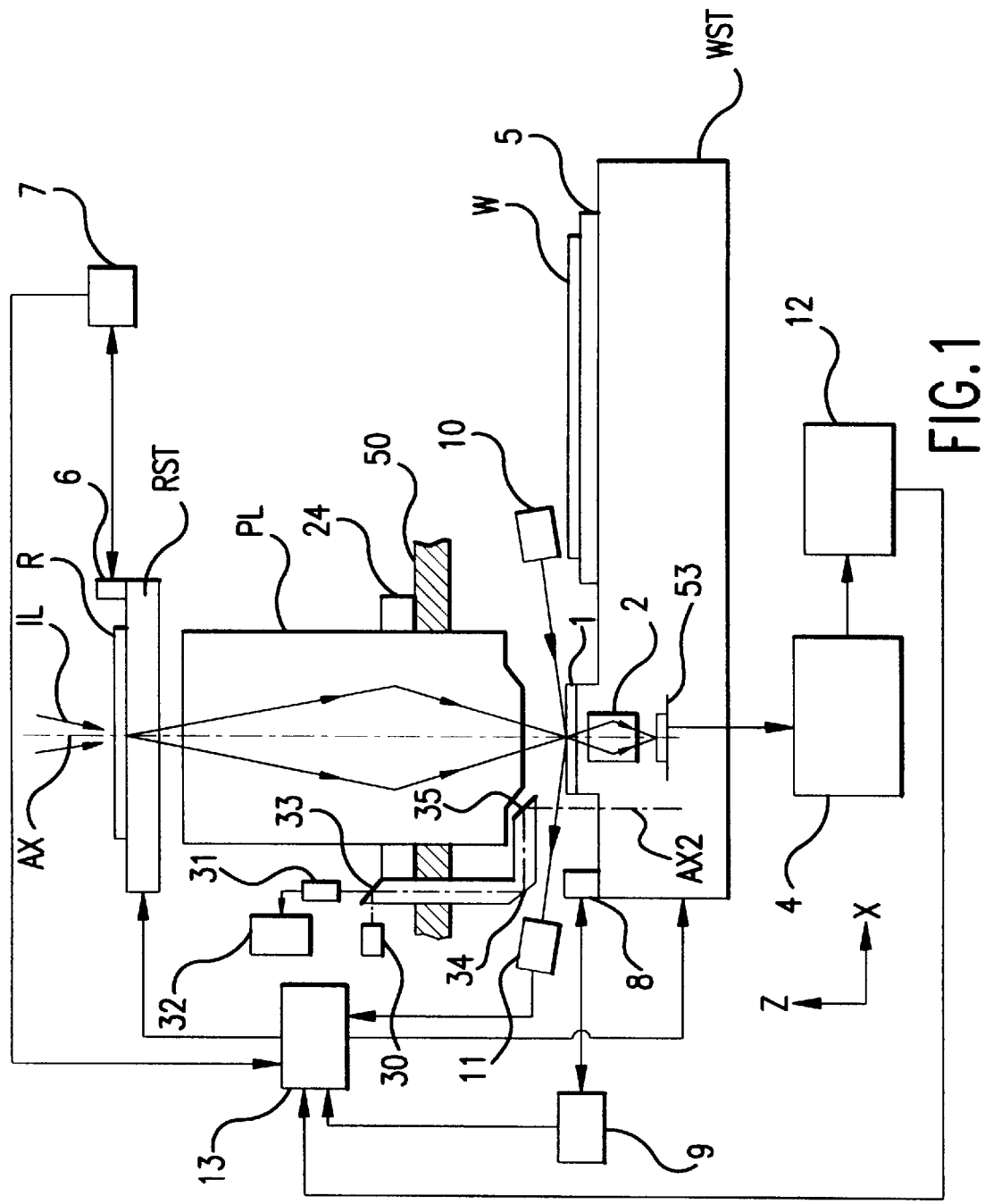
FIG. 1 shows a schematic arrangement of a scanning type exposure apparatus according to a first embodiment of the present invention, comprising a mechanism capable of previously measuring image formation characteristics during scanning.

An embodiment of the scanning type exposure apparatus according to the present invention will be explained below with reference to the drawings. FIG. 1 shows an example of the scanning type projection exposure apparatus for performing exposure while synchronously scanning a reticle R and a wafer W with respect to an illumination area on the reticle R. The projection exposure apparatus principally comprises a light source (not shown), an illuminating optical system (not shown), a reticle stage RST for moving the reticle R in a scanning direction, a projection optical system PL for projecting an image of a pattern formed on the reticle R onto the wafer W, a wafer stage WST for moving the wafer W in synchronization with the scanning for the reticle R, a wafer alignment system 30 to 35 for performing positional adjustment for the wafer, and a photoelectric sensor 53 for previously evaluating image formation characteristics. In general, the light source and the illuminating optical system are arranged over the reticle stage RST in FIG. 1. Those usable as the illuminating light source include, for example, i-ray and g-ray as a bright line of an ultra-high voltage mercury lamp, KrF and ArF excimer laser beams, and ultraviolet region light sources such as metallic vapor laser beams. The illuminating optical system comprises, for example, a fly's eye lens for achieving uniform illuminance, a shutter for opening and shutting an optical path, a variable blind for restricting the illumination area, and a relay lens. The reticle R, on which a circuit pattern or the like is depicted, is illuminated with an illuminating light beam IL coming from the light source and the illuminating optical system, at a substantially uniform illuminance and at a predetermined solid angle. Recently, in order to increase the resolving power, the illuminating optical system includes a mechanism capable of, for example, zonal illumination or oblique illumination.

The reticle stage RST is arranged over the projection optical system PL, which is movable in the scanning direction (X direction) at a predetermined scanning velocity by the aid of a reticle-driving unit (not shown) comprising a linear motor or the like. A movement mirror 6 for reflecting a laser beam coming from an interferometer 7 is secured to an end of the reticle stage RST in the X direction. The position of the reticle stage RST in the scanning direction is measured by the interferometer 7 at a unit of, for example, 0.01 μm. The result of measurement by the interferometer 7 is fed to a stage controller 13 so that the reticle stage RST is always positioned with a high degree of accuracy. A reticle holder (not shown) is installed on the reticle stage RST. The reticle R is attracted and held on the reticle holder by the aid of a vacuum chuck or the like. A reticle alignment system (not shown) is installed over the reticle stage RST in an opposed manner with an optical axis AX interposed therebetween. A reference mark formed on the reticle R is observed by using the reticle alignment system, and the initial position of the reticle stage RST is determined so that the reticle R is positioned at a predetermined reference position with a high degree of accuracy. Therefore, the position of the reticle R can be adjusted with a sufficiently high degree of accuracy only by measuring the position of the reticle stage RST by using the movement mirror 6 and the interferometer 7. The driving unit for the reticle stage RST is controlled by the stage controller 13.

On the reticle stage RST, the reticle R is illuminated with the rectangular (slit-shaped) illumination area with its long side directed in a direction (Y direction) perpendicular to the scanning direction (X direction) of the reticle R. The illumination area is defined by an unillustrated field diaphragm. The field diaphragm is usually arranged at a position over the reticle stage and in a plane conjugate to the reticle R or in the vicinity thereof.

The illuminating light beam passed through the reticle R comes into the projection optical system PL. Upon actual exposure, an image of the circuit pattern on the reticle R is formed, by the projection optical system PL, on the wafer W to which a photosensitive agent (photoresist) is applied. The projection optical system PL accommodates a plurality of lens elements which use the optical axis AX as a common optical axis. The projection optical system PL includes a flange 24 on its outer circumference (lens barrel) at a central position in the direction of the optical axis. The projection optical system PL is secured to a pedestal 50 of the main exposure apparatus body by the aid of the flange 24. The image of the pattern on the reticle R is projected onto the wafer W at a projection magnification which is determined by a magnification and an arrangement of the lens elements of the projection optical system PL. Usually, the pattern is reduced into ⅕ or ¼ by the projection optical system PL.

The reticle pattern in the slit-shaped illumination area (with its center substantially coincident with the optical axis AX) on the reticle R is projected onto the wafer W through the projection optical system PL. The projected image on the wafer W is in a relationship of inverted image with the pattern on the reticle R with respect to the projection optical system PL. Accordingly, when the reticle R is scanned in the −X direction (or +X direction) at a velocity Vr during exposure, the wafer W is scanned in the +X direction (or −X direction) opposite to the direction of the reticle R at a velocity of Vw in synchronization with the reticle R. Thus an entire surface of a shot area on the wafer W is successively exposed with the pattern on the reticle R. The ratio of the scanning velocities (Vr/Vw) is determined by the reduction magnification of the projection optical system PL described above.

The wafer W is vacuum-attracted by the wafer holder 5 held on the wafer stage WST. The wafer stage WST is not only movable in the scanning direction (X direction) as described above, but also movable in the direction (Y direction) perpendicular to the scanning direction so that a plurality of shot areas on the wafer may be subjected to scanning exposure respectively. The wafer stage WST repeats an operation to scan each of the shot areas on the wafer W, and an operation to move to an exposure start position for the next shot area. The wafer stage WST is finely movable in the direction of the optical axis AX (Z direction) of the projection optical system PL as well. The wafer stage WST is tiltable with respect to the optical axis AX by the aid of an unillustrated leveling stage. The wafer stage WST is driven by a wafer stage-driving unit (not shown) such as a motor, and its velocity of movement is controlled in accordance with the ratio (vr/vw) described above. A movement mirror 8 is secured to an end of the wafer stage WST. A laser beam from an interferometer 9 is reflected by the movement mirror 8, and a reflected light beam is detected by the interferometer 9. Thus the position of the wafer stage WST in a coordinate system in the XY plane (hereinafter referred to as "wafer stage coordinate system") is always monitored. The reflected light beam from the movement mirror 8 is detected by the interferometer 9 at a resolving power of, for example, about 0.01 μm. The wafer stage-driving unit is controlled by the stage controller 13 to move the wafer stage WST so that the wafer stage WST is synchronized with the reticle stage RST. The stage controller 13 collectively controls the scanning by the aid of the respective stages, the adjustment for the projection optical system PL accompanied thereto, and other operations.

The scanning type exposure apparatus shown in FIG. 1 is provided with the wafer alignment system 30 to 35 adjacent to the projection optical system PL. The wafer alignment system is an optical detecting system for detecting a positional adjustment mark (alignment mark) formed on the wafer W in order to make accurate exposure on the wafer W for a new pattern overlaid on a layer having been exposed in a previous process and processed, for example, etched and vapor-deposited. Those usable as a light source 30 of the wafer alignment system include, for example, lasers and halogen lamps for emitting a light beam having a wavelength to which the photoresist film on the wafer W is not photosensitive. An illuminating light beam radiated from the light source 30 advances along a half mirror 33 and a mirror 34, and it illuminates the positional adjustment mark on the wafer w by the aid of a mirror 35. A reflected light beam or a diffracted light beam from the positional adjustment mark on the wafer W passes through a path reverse to that of the illuminating light beam, and it passes through the half mirror 33. The light beam is photoelectrically converted by a light-receiving unit 31. A signal from the light-receiving unit 31 is amplified by an amplifier 32 into a sufficient output. The signal is fed to the stage controller 13 which also functions as an alignment control system. An optical axis AX2 of the alignment system is established at a position adjacent to the optical axis AX of the projection optical system PL as near as possible. The axes are spaced apart from each other by a constant spacing distance. Stable maintenance of the spacing distance ensures an accurate positional relationship between the pattern on the reticle R and the shot area on the wafer W when overlay exposure is performed. The optical axis AX and the optical axis AX2 are usually called the base line of the alignment system. However, in the present invention, the base line is determined on the basis of a projected image of a mark formed on the reticle R as described later on. It is also possible to use a two-dimensional image pickup element such as a CCD in place of the light-receiving unit 31 of the wafer alignment system.

The projection exposure apparatus shown in FIG. 1 further includes a Z-directional position sensor comprising a projector 10 for obliquely radiating a light beam onto the image plane of the projection optical system PL, and a light receiver 11 for receiving a reflected light beam from the image plane. For example, the Z-directional position sensor may be arranged such that a slit image or a pin hole image is projected from the projector 11 onto the wafer W, and a reflected light beam therefrom is received through a slit or a pin hole. The Z-directional position sensor is adjusted such that the reflected light beam comes into the slit or the pin hole when the wafer W is located on an optimum image plane of the projection optical system PL. Provision of a plurality of such sensors makes it possible to detect the inclination of the plane of the wafer W, and then perform correction by inclining the wafer stage WST by using the leveling stage described above so that the entire exposure area on the wafer W is coincident with the optimum image plane of the projection optical system PL. A light beam having a wavelength at which the photosensitive agent applied to the wafer is not photosensitive is selected as the light beam radiated from the projector.

Figure 2A:
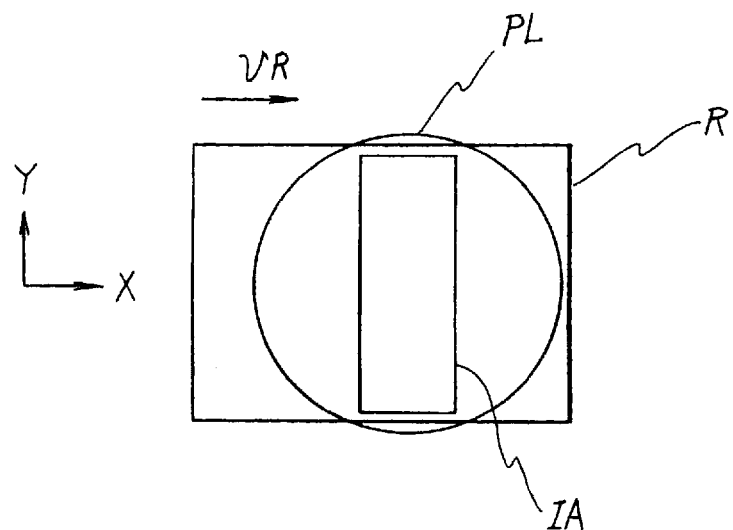
FIG. 2A explains a scanning exposure method by using the scanning type exposure apparatus according to the embodiment, illustrating a situation in which a reticle R is scanned across an illumination area IA.
Figure 2B:
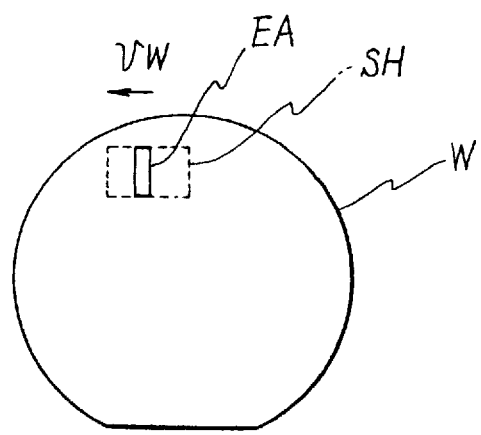
FIG. 2B explains the scanning exposure method by using the scanning type exposure apparatus according to the embodiment, illustrating a situation in which a wafer W is scanned across an exposure area EA in a direction opposite to a scanning direction for the reticle R.

Now the scanning exposure operation performed by the scanning exposure apparatus having the aforementioned structure will be explained with reference to FIG. 2. FIG. 2A conceptually shows a view in which the reticle R is viewed from an upper position. The rectangular illumination area IA is defined in a circle which indicates an image field of the projection optical system PL. The reticle R is moved in the scanning direction (X direction) across the illumination area IA. Thus the pattern on the reticle R is successively illuminated, and all the pattern existing on the reticle R in the scanning direction is illuminated by one time of scanning. The illumination time is determined by a period of time required for each pattern to traverse the illumination area IA, namely by the size of the pattern and the scanning velocity. The scanning velocity is determined by, for example, the sensitivity of the photosensitive agent and the intensity of the illuminating light beam. FIG. 2A shows a situation in which the reticle R is scanned in the X direction at a velocity Vr. An image of the reticle pattern illuminated in the illumination area IA is formed on the exposure area EA on the wafer W in accordance with a reduction magnification of the projection optical system PL. This situation is shown in FIG. 2B in which the wafer W is viewed from an upper position. As described above, the velocity Vw of the wafer W is determined by (velocity vr of reticle R)×(reduction magnification of projection optical system PL). The image on the wafer W and the pattern on the reticle R are in a relationship of mirror image. Accordingly, the wafer W is moved in the −X direction oppositely to the reticle R. When one time of scanning for the reticle R is completed, the image of the entire surface of the reticle R is formed in an area SH on the wafer W. The so-called step-and-scan exposure is performed by repeating the foregoing operation so that the substantially whole surface of the wafer W is exposed with a plurality of images of the pattern on the reticle R.

With reference to FIG. 1, a glass plate 1 for measuring image formation is installed on the wafer stage WST at a position different from the position of the wafer holder 5 and at a height substantially coincident with the upper surface of the wafer W. The position of the glass plate 1 is adjusted by the Z-directional position sensor (10, 11) and the wafer stage WST so that the upper surface of the glass plate 1 is coincident with the image plane of the projection optical system PL. A magnifying optical system 2 and a photoelectric sensor 53 are installed under the glass plate 1 and inside the wafer stage WST. According to the exposure method of the present invention, the wafer stage WST is moved before actual exposure for the wafer W is performed, and thus the glass plate 1 is positioned just under the projection optical system PL to measure image formation characteristics. The light beam passed through the projection optical system PL once forms an image on the glass plate 1, and then it forms an image again on a light-receiving surface of the photoelectric sensor 53 by the aid of the magnifying optical system 2. The image formed on the glass plate 1 is magnified by a magnification of the magnifying optical system 2, and an magnified image is formed on the light-receiving surface of the photoelectric sensor 53. The glass plate 1 may be omitted by allowing the uppermost lens for constructing the magnifying optical system 2 to be positioned on the image formation plane of the projection optical system PL. If the magnifying optical system 2 has any aberration, it is impossible to distinguish whether the distortion of the image formed on the light-receiving surface of the photoelectric sensor 53 is caused by aberration of the projection optical system PL or by aberration of the magnifying optical system 3. Accordingly, it is necessary for the magnifying optical system 2 to use an optical system having extremely little aberration.

Figure 18A:
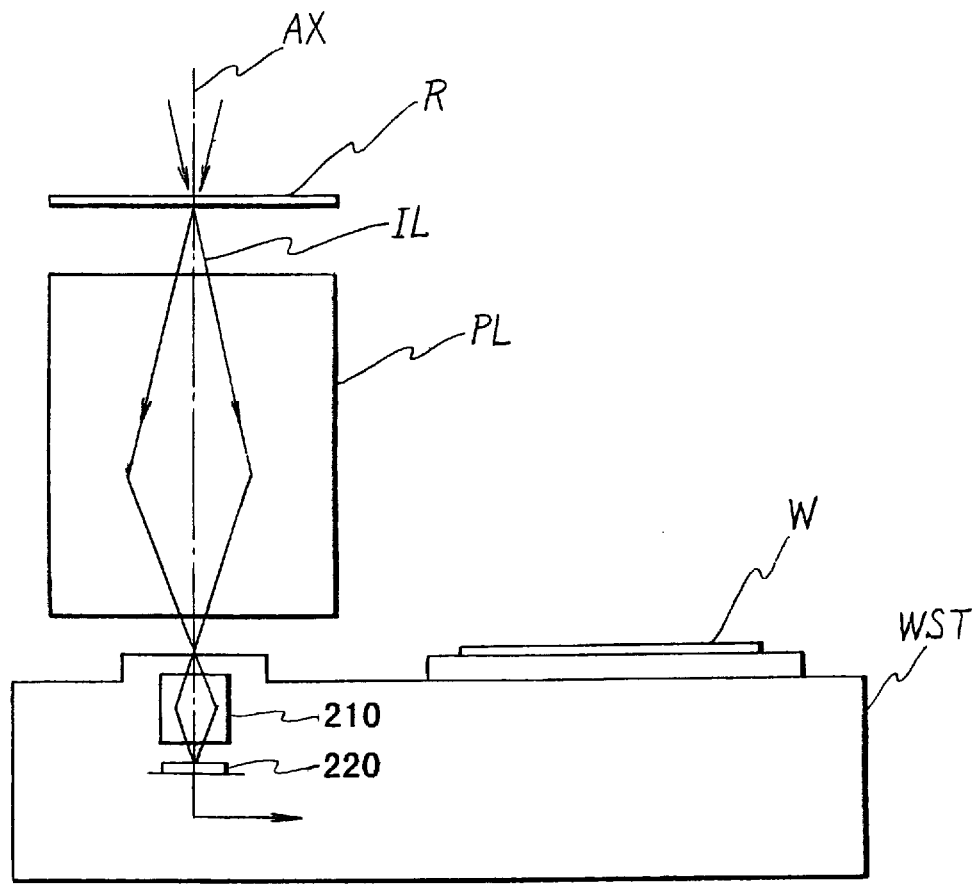
FIG. 18A shows a schematic arrangement of a conventional projection exposure apparatus of the collective exposure type provided with a system for measuring image formation characteristics based on the use of a magnifying optical system.

The arrangement of the system for measuring image formation characteristics comprising the magnifying optical system 2 and the photoelectric sensor 53 as described above is similar to the arrangement of the conventional static system for measuring image formation characteristics as shown in FIG. 18A. It is possible to use exactly the same magnification of the magnifying optical system 2 and exactly the same type of photoelectric sensor 53 as well. Accordingly, a static image may be measured by using the projection optical system PL in the same manner as the conventional technique, in which the photoelectric sensor 53 is moved to an arbitrary position in the exposure area EA to subsequently perform measurement while the wafer stage WST and the reticle stage RST stand still. An image signal of the photoelectric sensor 53 is fed to an image-processing system 4 and processed. The processed image data is fed to a computing unit 12 to compute image formation characteristics. It is also necessary for the scanning type exposure apparatus to optimally adjust, before actual exposure, the image formation characteristics in such a static state, i.e., the image formation characteristics in a state in which the reticle R and the wafer W are not scanned. It is desirable to correct the image formation characteristics determined by the computing operation, by using an appropriate correcting system. For example, if the magnification determined by the computing operation is discrepant with a target magnification, a magnification discrepancy in the non-scanning direction occurs in an image formed by scanning, resulting in deterioration of image quality in the scanning direction. Accordingly, it is possible to use known methods for correcting the magnification and the distortion, including, for example, those in which the optical path length concerning the reticle R and the projection optical system PL is changed, or a part of the lens elements of the projection optical system PL is driven in the direction of the optical axis AX, or inclined with respect to the optical axis AX. The discrepancy in focal position and the inclination of the image plane may be corrected by giving an offset to the Z-directional position sensor (10, 11). The present invention provides the method for measuring image formation characteristics during the period of scanning exposure and the correcting method on the assumption that the image formation characteristics in the static state are optimized. In the present invention, the position of the mark on the reticle R and the image formation characteristics measured in the static state of the reticle R and the wafer stage WST can be previously corrected by using information on the position of the mark on the reticle R and the image formation characteristics obtained by measurement for the image formation characteristics measured during the scanning for the reticle R and the wafer stage WST as described later on.

Figure 4:
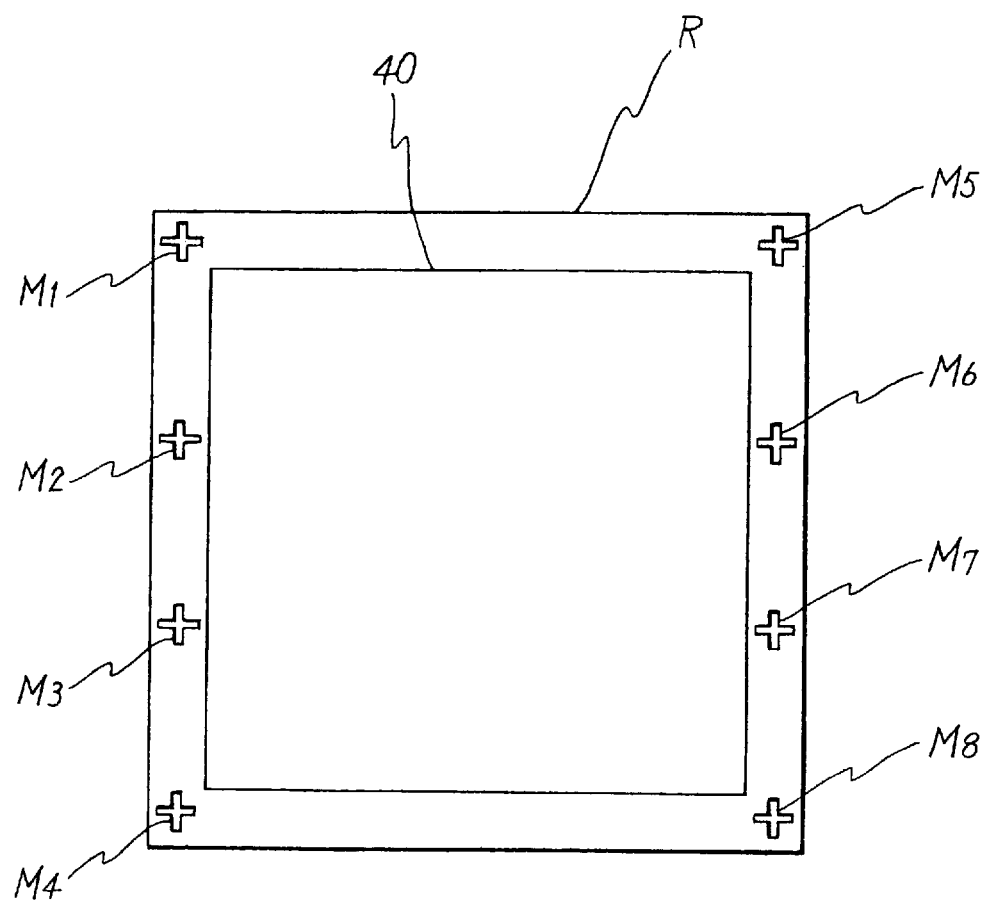
FIG. 4 shows a plan view of a reticle including test marks M1 to M8 used in the first to third embodiments.

Next, a method for measuring image formation characteristics, which constitutes one step of the scanning exposure method according to the present invention, will be explained by using the scanning type exposure apparatus shown in FIG. 1. Those usable as the reticle R include an exclusive test reticle on which a test pattern is depicted by using a plurality of marks, and a reticle for production having a reticle pattern involving a plurality of test marks at its circumference as shown in FIG. 4. Alternatively, it is possible to use an exclusive pattern for measuring image formation characteristics installed on the reticle stage RST. When the moving velocity and the inclination of the reticle R are different depending on positions on the reticle stage RST, it is advantageous to use a test reticle capable of measurement on a substantially entire surface of the reticle stage RST. However, the use of such an exclusive reticle R results in a complicated operation for reticle exchange. Accordingly, it is desirable to appropriately use different types of reticles. This invention uses a reticle R for producing a circuit pattern as shown in FIG. 4, having a reticle pattern involving respective four test marks M1 to M8 on each of two opposing sides located outside a reticle pattern area 40.

Figure 3A:
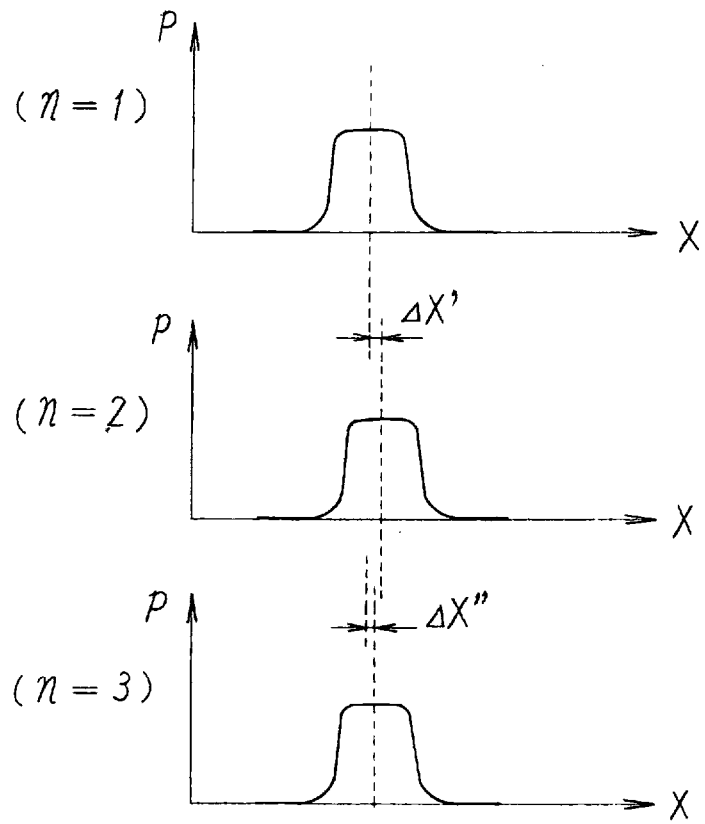
FIG. 3A shows the change of respective images with respect to the number of times of pickup n of images of the reticle R picked up by a photoelectric sensor during scanning.

When the image formation characteristics are measured, the wafer stage WST is moved, and images of the test marks on the reticle R are formed on the photoelectric sensor 53. The reticle R and the photoelectric sensor 53 are synchronously scanned at the same scanning velocities as those used during actual exposure so that the image of each of the test marks on the reticle R is picked up as image data and fed to the image-processing system 4. During the period of scanning, the photoelectric sensor 53 passes across the exposure area EA (see FIG. 2B). The image-processing system 4 adds outputs of respective picture elements to one another in succession on the basis of the obtained image data. Upon completion of the scanning, an image is formed, which is produced by adding signals obtained during a period of passage of the photoelectric sensor across the exposure area EA. The image corresponds to an image formed on the wafer W by scanning exposure. The process of image pickup will be explained with reference to FIGS. 3A and 3B. FIG. 3A shows output waveforms each obtained by one time of output from the photoelectric sensor 53. When the photoelectric sensor 53 is a two-dimensional sensor, the output is represented as a position coordinate on the sensor by using a function of XY. However, only X components are shown in the drawings in order to simplify the explanation. The coordinate X, Y on the photoelectric sensor 53 can be allowed to correspond to a position coordinate on the wafer stage provided that the coordinate position of the wafer stage, detected by the laser interferometer 8, has been determined when the reference point of the photoelectric sensor 53 is located, for example, on the optical axis AX of the projection optical system PL. The position of image formation of the mark on the reticle R, detected by the photoelectric sensor 53, can be also represented by the position coordinate system on the wafer stage.

In FIG. 3A, n indicates an order of pickup of image formation data on the mark M1 into the photoelectric sensor 53 during the period of scanning for the test mark M1 on the reticle R. Ideally, an identical projected image should be formed at a constant position in the exposure area EA irrelevant to the timing of data pickup during the period of passage of the mark through the illumination area IA. A final image should be formed as obtained by overlaying the identical images. However, as described above, the image of the mark is formed on the photoelectric sensor 53 while scanning the reticle R and the photoelectric sensor 53 (or the wafer W in actual exposure). Accordingly, light beams for forming the image of the mark M1 continuously pass through different portions of the projection optical system PL during the period of passage of the mark IA through the illumination area IA. Therefore, the presence of aberration of the projection optical system PL causes distortion in the image, and the position of image formation of the mark changes. If any synchronization discrepancy occurs between the reticle stage RST and the wafer stage WST in relation to the scanning direction during a period of one time of scanning, the position of image formation of the mark changes. The position of image formation may change due to other causes such as change in positional relationship between the reticle R and the wafer stage WST caused by vibration of the whole apparatus due to scanning.

Figure 3B:
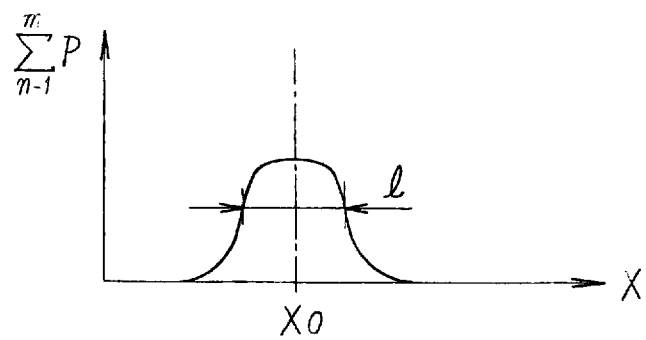
FIG. 3B shows a combined image obtained by adding respective image signals upon m times of pickup.

On account of the causes as described above, the position of image formation of the mark M1 suffers discrepancy every time when the image data on the mark is picked up as shown in FIG. 3A. In FIG. 3A, the central position of the image of the mark obtained by the second pickup (n=2) is deviated from the central position of the image of the mark obtained by the first pickup by $+\Delta x'$. The central position of the image of the mark obtained by the third pickup (n=3) is deviated from the central position of the image of the mark obtained by the first pickup by $+\Delta x''$. The shape of each of the mark images also changes depending on, for example, the difference in position of passage of the light beam through the projection optical system PL, the follow-up control error with respect to the optimum image plane of the wafer stage WST based on the use of the Z sensor, and the deterioration of image due to discrepancy in image formation position during the period of pickup for one image plane. FIG. 3B shows a result of addition of output images (n=1 to m) after m times of pickup of data by the photoelectric sensor 53. The waveform is blunt as compared with the respective images due to the influences as described above. Especially, the line width 1, which is obtained by slicing the signal at a predetermined level, is wider than signal widths of the individual images.

Now, there is obtained a central position X0 of the image (FIG. 3B) obtained by combining the individual output images. On the other hand, it is possible to determine, by calculation, a position (designed value) X01 at which the image of the mark M1 should be formed on the photoelectric sensor 53 on the basis of the position coordinate of the mark M1 on the reticle R and the magnification of the projection optical system PL. Therefore, $\Delta X=X0-X01$ represents the positional discrepancy in image formation (difference between the designed value and the actual exposure position) in the X direction of the mark M1 on the reticle R, brought about due to various causes including the scanning for the reticle R and the photoelectric sensor 53 (or the wafer W in actual exposure).

A method for determining a base line of the wafer alignment system from the one-dimensional or two-dimensional position of image formation of each of the marks on the reticle R obtained as described above will be explained. The light beam radiated from the light source 30 of the alignment system is detected by the photoelectric sensor 53 to determine an irradiating position based on the coordinate system of the wafer stage WST beforehand. Thus the spacing distances in the X and Y directions between a position of image formation of a specified mark in the coordinate system of the wafer stage WST, determined by the photoelectric sensor 53, and the irradiating position of the light source 30 for alignment may be defined as base lines of the alignment system respectively. Alternatively, a reference mark, which can be detected by the alignment system (alignment sensor), is added to the glass plate 1 beforehand. The base line may be defined on the basis of a position of the reference mark and a position of a specified mark on the reticle R. The value of the base line is stored. Upon actual exposure (overlay exposure), an alignment mark on the wafer W is detected by using the wafer alignment system 30 to 35. Thus the relative position between the wafer W and the reticle R can be adjusted by using the stored value of the base line. The position of the wafer W subjected to overlay exposure can be accurately determined on the basis of the mark on the reticle R by defining the base line of the alignment system as described above. Moreover, the base line can be determined in such a way that the relative positional discrepancy between the reticle R and the wafer W, which would be caused during scanning, is incorporated. Thus the overlay accuracy in scanning type exposure can be improved.

Next, a method for determining dynamic image formation characteristics of the projection optical system PL in scanning exposure from the one-dimensional or two-dimensional position of image formation of each of the marks on the reticle R obtained as described above will be explained. Outputs of combined images as shown in FIG. 3 for the respective marks M1 to M8 are fed from the image-processing system 4 to the computing unit 12. The computing unit 12 calculates the image formation characteristics on the basis of the output of the combined image concerning each of the marks M1 to M8. For example, when a contrast of the image is determined as one of the image formation characteristics, the output of each of the marks detected as shown in FIG. 3B is sliced at an appropriate slice level to determine a line width 1 respectively so that decision is made by comparing obtained results. Alternatively, the contrast may be determined from rise angles at both end edges of the output waveform of each of the marks.

When an image magnification is determined as one of the image formation characteristics, the following method may be adopted. For example, positions of image formation X1 and X5 of marks M1 and M5 of a plurality of marks on the reticle R are detected in the X coordinate system of the photoelectric sensor 53. The positions of image formation are converted into those in the X coordinate system on the wafer stage WST. The magnification can be calculated on the basis of a spacing distance between X1 and X5 in the coordinate system of the wafer stage WST and a spacing distance in the X direction between the marks M1 and M5 on the reticle R.

When a distortion is determined as one of the image formation characteristics, the following method may be adopted. For example, sets of two points A1, A2 and B1, B2 are selected in a relatively inner region and a relatively outer region in the pattern area 40 on the reticle R so that a spacing distance A1A2 between the two points is equal to a spacing distance B1B2. Positions of image formation of them are detected by the photoelectric sensor 53 in the same manner as described above so that positions of image formation are determined in the coordinate system of the wafer stage WST. After that, a spacing distance A1A2' and a spacing distance B1B2' between the positions of image formation are determined for each of the sets of two points in the coordinate system of the wafer stage WST respectively. Differences between the determined spacing distances and the spacing distances on the reticle R, i.e., (A1A2'−A1A2) and (B1B2'−B1B2) are calculated respectively to make comparison taking the magnification into consideration. Thus the distortion can be determined.

On the other hand, the amount of rotation of the reticle R on the reticle stage RST, which would be caused by scanning for the reticle R, can be determined by measuring the position of image formation of the mark on the reticle R as described above. In this procedure, for example, the marks M1 and M5 are selected from the marks on the reticle R. Positions Y1 and Y5 of image formation in the Y direction on the photoelectric sensor 53 are detected for the marks M1 and M5 in the same manner as described above. Coordinates Y1' and Y5' on the wafer stage WST, corresponding to the positions of image formation Y1 and Y5, are determined respectively to decide a difference ΔY' therebetween. Thus it is possible to know a degree of discrepancy in the Y direction upon image formation of the pattern on the reticle R. The amount of rotation θ of the reticle R can be also calculated from ΔY' and a distance in the X direction between M1 and M5.

The positional discrepancy of the entire pattern on the reticle R can be also determined as follows. For example, the reticle R is arranged on the reticle stage RST so that the center of the reticle R is located on the optical axis of the projection optical system PL, and two-dimensional positions of image formation of the respective marks are determined by using the photoelectric sensor 53 in the same manner as described above. After that, the positions of image formation of the respective marks are converted into those in the wafer stage coordinate system. Distances between the reference point on the sensor 53 (wafer stage coordinate system) and the positions of image formation of the respective marks (wafer stage coordinate system) are subsequently determined respectively. The determined distances are compared with distances L1 to L8 from the center of the reticle R to the respective marks M1 to M8 on the reticle R, taking the magnification into consideration. Thus it is possible to know an offset amount of the pattern on the reticle R during scanning for the reticle R. In this procedure, the offset amount of the pattern on the reticle R can be also determined by comparing, for one mark, the distance from the center of the reticle R with the distance between the position of image formation thereof and the reference point. However, in view of reproducibility, it is desirable to calculate the offset amount from an average value by determining the differences in distance for the eight marks M1 to M8 respectively.

The image formation characteristics of the image formed by scanning exposure can be determined as described above. If the image formation characteristics are not obtained with desired degrees of accuracy, it is conceived to perform correction. However, it is premised that the image formation characteristics (image formation characteristics concerning the static image) measured in the state in which the stages stand still are optimally adjusted. Therefore, it is difficult to make further adjustment. As an adjustment method at this stage, it is conceived to mitigate, for example, vibration and discrepancy in synchronization between the reticle R and the wafer W which would be deteriorated due to scanning exposure. In general, when the scanning velocity is lowered, the load on the control system is decreased, and thus the accuracy in synchronization is improved. Further, vibration may be reduced. Accordingly, for example, if a desired accuracy is not achieved for the positional discrepancy in the position of image formation of the mark determined as described above, a method is conceived in which a signal is fed to the stage controller 14 to lower the scanning velocity. When the scanning velocity is lowered, the productivity of products (throughput) is lowered. Accordingly, it is most suitable to lower the velocity within a range in which a desired accuracy is obtained. Therefore, it is also possible to select an optimum velocity by measuring the image formation characteristics while changing the scanning velocity. As described above, the scanning velocity is determined by the sensitivity of the photosensitive agent. Accordingly, it is also necessary to adopt a countermeasure that the illuminance of the illuminating light beam is controlled depending on the velocity, or the width of the illumination area IA in the scanning direction is changed.

In the method described above, the data on images are internally added in succession in the image-processing system 4. However, a method is also conceived in which all data are once stored in a memory, and then the data are added to synthesize an image. According to this method, the respective data remain in the memory after the image is synthesized. Therefore, an advantage is obtained in that analysis can be made, if an obtained accuracy is defective, for a defective portion of the exposure area IA. In the method described above, the image data are added by computing operation. However, a method is also conceived in which the image data are added by using the photoelectric sensor 53. The intensity of the illuminating light beam is dimmed by using a filter or the like so that images are accumulated in the sensor 53 by one time of scanning. Thus it is possible to obtain a total photoelectric output during scanning at once. According to this method, the circuit system is simplified because of no necessity for computing operation.

In the method described above, addition is performed on the basis of the picture elements of the photoelectric sensor 53. However, a measurement error occurs if the positional relationship between the reticle stage RST and the photoelectric sensor 53 changes due to vibration of the apparatus or the like. Accordingly, an index or a frame may be attached to the glass plate 1 to make addition so that the detected position of the index or the frame, detected by the photoelectric sensor 53, is constant. Thus the inconvenience as described above disappears. It is convenient to commonly use the index with the reference mark detected by the alignment sensor during measurement of the base line described above.

Usually, when the focal position is determined in accordance with the method described above, measurement is repeated while changing the position of the wafer stage WST in the Z direction. However, a method is also conceived, in which the light beam is branched by using a half mirror or the like to receive branched light beams with a plurality of photoelectric sensors so that the light beams may be received at a plurality of positions in the direction of the optical axis of the magnifying optical system 2. Another method is also conceived, in which a plurality of photoelectric sensors 53 and a plurality of magnifying optical systems 2 are arranged on the wafer stage WST to perform measurement at a plurality of measuring points in the exposure area EA at once. According to this method, an advantage is obtained in that measurement can be performed at a plurality of points by one time of scanning. An advantage is also obtained in that measurement can be performed highly accurately because the measurement accuracy for distortion in the non-scanning direction is irrelevant to the measurement error of the interferometer 9 provided that the distances between the respective photoelectric sensors in the non-scanning direction are strictly measured beforehand.

In the method according to the first embodiment explained above, the photoelectric sensor 53 is provided at the inside of the wafer stage WST. However, in order to avoid an inconvenience caused by heat generation by the photoelectric sensor and an inconvenience caused by increase in weight of the wafer stage WST, only a light-receiving section (for example, an incident end surface of an optical fiber) may be installed on the wafer stage WST to receive light beams, and an image may be fed to a photoelectric sensor installed at the outside of the wafer stage WST by using an image fiber or the like. Alternatively, it is also possible to introduce an illuminating light beam into the wafer stage WST by using a fiber or the like so that a test pattern is irradiated from the wafer stage WST to receive a light beam by using a photoelectric sensor installed on the reticle stage RST.

The present invention can be carried out in the case of the use of the photoelectric sensor having any of two-dimensional and one-dimensional resolving powers as described above. Usually, for example, the contrast and the distortion are measured by using a single line (lonely line) or a plurality of lines (line and space) in the XY directions. Accordingly, in the case of the one-dimensional sensor, sensors may be arranged in two directions of X and Y directions. In the case of the two-dimensional sensor, a sensor is arranged to have its resolving power in the XY directions as well. Thus data processing may be performed for X and Y components by selecting data.

Second Embodiment

Figure 5:
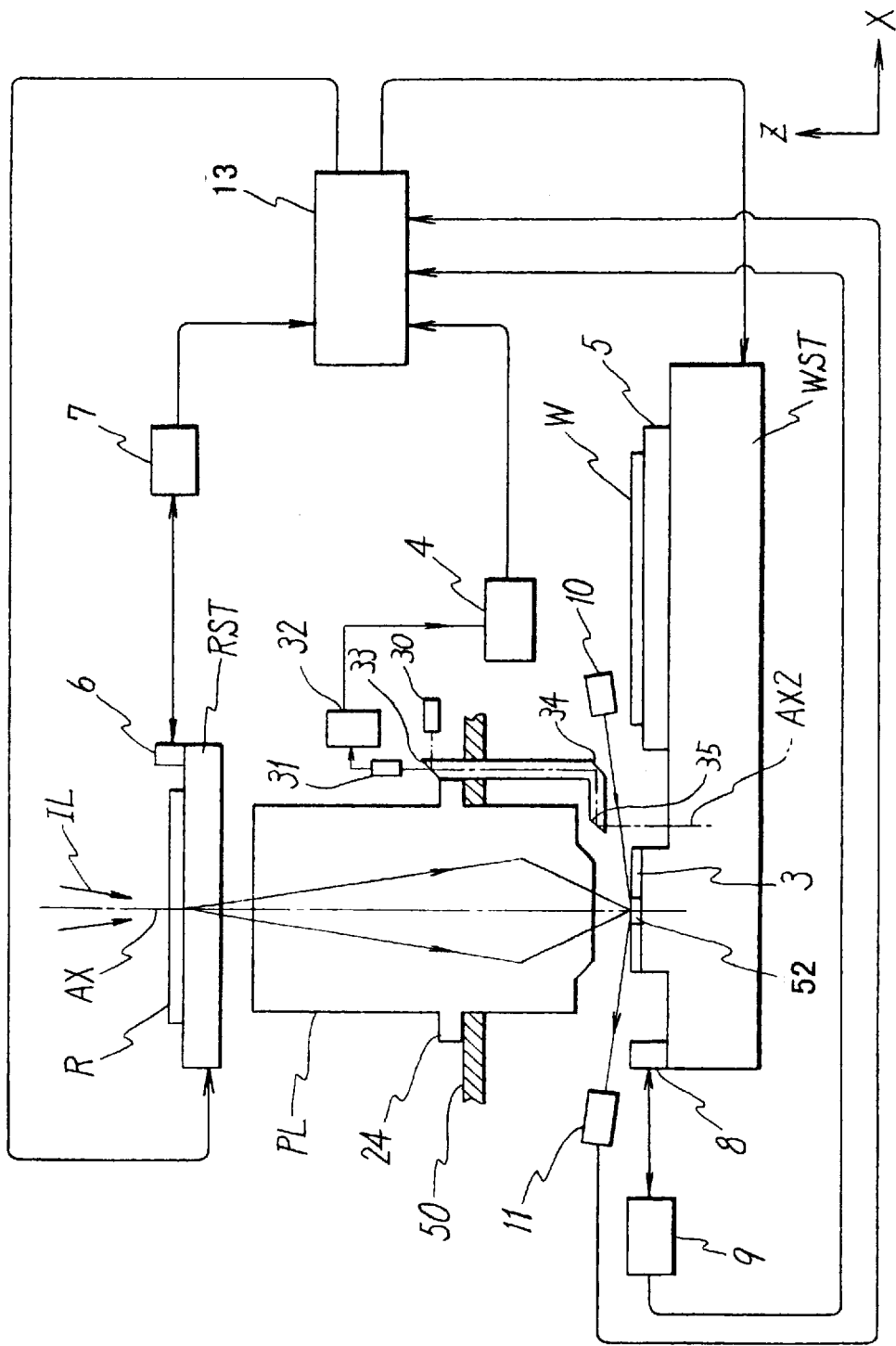
FIG. 5 shows a schematic arrangement of a scanning type exposure apparatus according to a second embodiment of the present invention, comprising a mechanism capable of previously measuring image formation characteristics during scanning.

FIG. 5 shows a second embodiment of the scanning type projection exposure apparatus for performing exposure while synchronously scanning a reticle R and a wafer W with respect to an illumination area on the reticle R. This projection exposure apparatus principally comprises a light source (not shown), an illuminating optical system (not shown), a reticle stage RST for moving the reticle R in a scanning direction, a projection optical system PL for projecting an image of a pattern formed on the reticle R onto the wafer W, a wafer stage WST for moving the wafer W in synchronization with the scanning for the reticle R, a wafer alignment system 30 to 35 for performing positional adjustment for the wafer, and a photosensitive object 3 for previously evaluating image formation characteristics. The same reference numerals as those used in FIG. 1 are affixed to the same components as those described in the first embodiment, explanation of which will be omitted.

Figure 17:
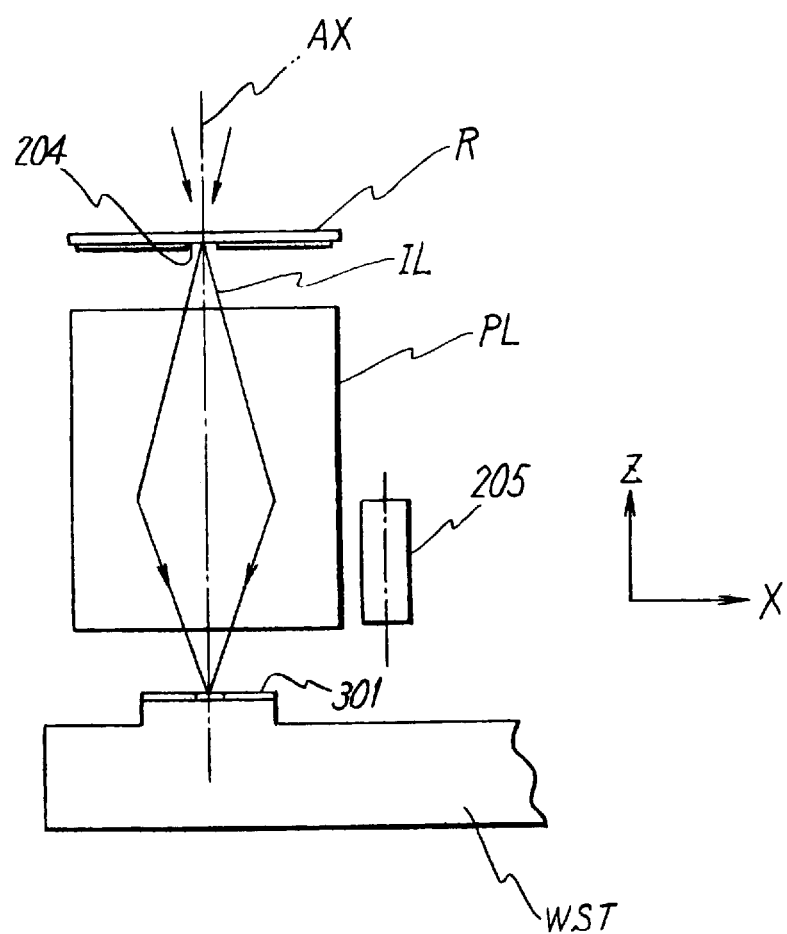
FIG. 17 shows a schematic arrangement of a conventional projection exposure apparatus of the collective exposure type provided with a system for measuring image formation characteristics based on the use of a photosensitive object 301.

The scanning exposure operation performed by the scanning exposure apparatus having the structure shown in FIG. 5 is the same as that explained with reference to FIGS. 2A and 2B in the first embodiment. With reference to FIG. 5, a photosensitive object 3 for measuring image formation characteristics is installed on the surface of the wafer stage WST at a position in the X direction different from the position of the wafer holder 5 and at a height substantially coincident with the upper surface of the wafer W. In this embodiment, a photochromic device is used as the photosensitive object 3. The position of the photosensitive object 3 is adjusted by the Z-directional position sensor (10, 11) and the wafer stage WST so that the upper surface of the photosensitive object 3 is coincident with the image plane of the projection optical system PL. When the image formation characteristics of the projection optical system PL are previously measured, the wafer stage WST is moved in the X direction so that the photosensitive object 3 is located just under the projection optical system PL. Accordingly, an image of a pattern on the reticle R illuminated with the illuminating light beam IL is formed on the photosensitive object 3 through the projection optical system PL. The arrangement of the system for measuring image formation characteristics by using the photosensitive object 3 is similar to the arrangement of the static system for measuring image formation characteristics used in the collective exposure type projection exposure apparatus as shown in FIG. 17. Accordingly, a static image may be measured by using the projection optical system PL in the same manner as the conventional technique, in which the photosensitive object 3 is moved to an arbitrary position in the exposure area EA to subsequently perform measurement while the wafer stage WST and the reticle stage RST stand still. An exposed image on the photosensitive object 3 is observed by the alignment system 30 to 35, and processed by the processing system 4. The processed image data is fed to a controller 13 to compute image formation characteristics. An exclusive observing system, other than the alignment system 30 to 35, may be used to observe the exposed image on the photosensitive object 3. It is also necessary for the scanning type exposure apparatus to optimally adjust, before actual exposure, the image formation characteristics in such a static state, i.e., the image formation characteristics in a state in which the reticle R and the wafer W are not scanned. It is desirable to correct the image formation characteristics determined by the computing operation, by using an appropriate correcting system. For example, if the magnification determined by the computing operation is discrepant with a target magnification, a magnification discrepancy in the non-scanning direction occurs in an image formed by scanning, resulting in deterioration of image quality in the scanning direction. Accordingly, it is possible to use known methods for correcting the magnification and the distortion, including, for example, those in which the optical path length concerning the reticle R and the projection optical system PL is changed, or a part of the lens elements of the projection optical system PL is driven in the direction of the optical axis AX, or inclined with respect to the optical axis AX. The discrepancy in focal position and the inclination of the image plane may be corrected by giving an offset to the Z-directional position sensor (10, 11). The present invention provides the method for measuring image formation characteristics of the projection optical system PL during the period of scanning exposure and the correcting method therefor on the assumption that the image formation characteristics in the static state are optimized.

Next, a method for measuring image formation characteristics, which constitutes one step of the scanning exposure method according to the present invention, will be explained by using the scanning type exposure apparatus shown in FIG. 5. This embodiment uses a reticle R for producing a circuit pattern as shown in FIG. 4, having a reticle pattern involving respective four test marks M1 to M8 on each of two opposing sides located outside a reticle pattern area 40.

In order to measure the image formation characteristics, at first, the wafer stage WST is moved so that the photosensitive object 3 is located just under the projection optical system PL. After that, the reticle R and the photosensitive object 3 are synchronously scanned at the same scanning velocities as those used in actual exposure while illuminating the reticle R with the illuminating light beam IL. Thus the photosensitive object 3 is exposed with an image of the test mark on the reticle R during a period of passage of the photosensitive object 3 across the exposure area EA. A pattern image 52 formed on the photosensitive object 3 corresponds to an image to be formed on the wafer W by actual scanning exposure. During the period of scanning, in order to measure the position of the exposed (projected) image, positional signals of the reticle stage RST and the wafer stage WST are fed to the controller 13 from the interferometers 7 and 9. When the position in the Z direction is measured to detect the focal position or the like, an output of the Z-directional sensor (10, 11) is simultaneously fed to the controller 13.

Figure 6A:
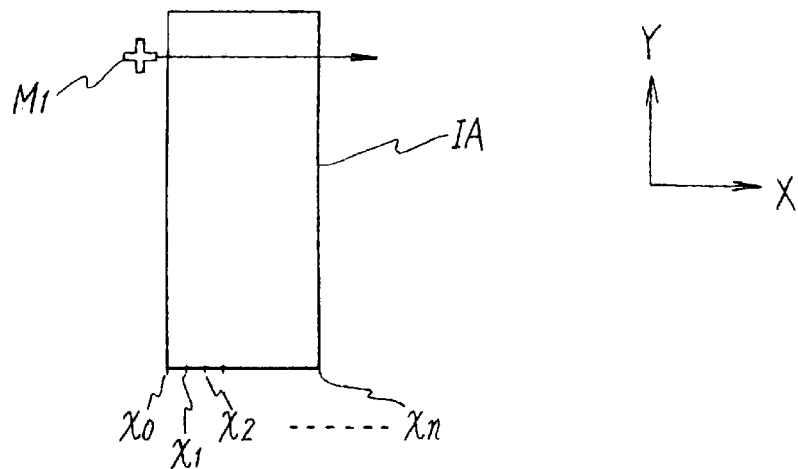
FIG. 6A shows a state in which a reference mark M1 is scanned across an illumination area IA through positions in the X direction in the exposure apparatus of the second embodiment.
Figure 6B:
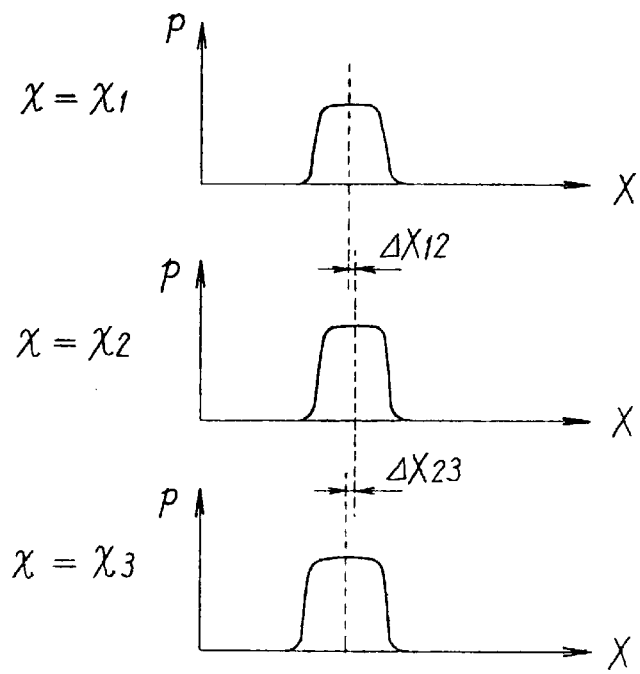
FIG. 6B shows mark pattern images to be formed on a photosensitive object when the reference mark M1 is located at positions in the X direction x1, x2, and x3 in the illumination area IA in the exposure apparatus of the second embodiment.
Figure 6C:
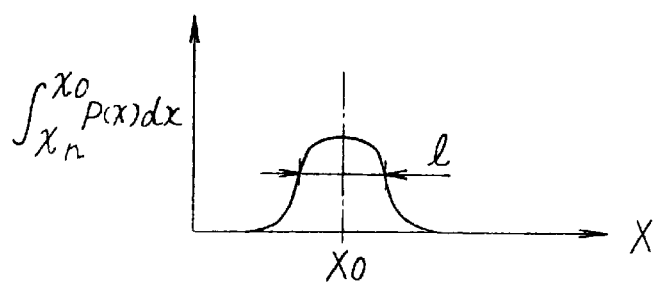
FIG. 6C shows an image of the mark M1 formed on the photosensitive object by one time of scanning for the reference mark M1 across the illumination area IA in the exposure apparatus of the second embodiment.

The process, in which the image of the mark pattern on the reticle R is formed on the photosensitive object 3 during the scanning, will be explained in further detail with reference to FIGS. 6A to 6C. FIG. 6A conceptually shows a situation in which the mark M1 on the reticle R moves in the X direction across the illumination area IA along an arrow depicted in the drawing when the reticle R is scanned across the illumination area IA on the reticle. The image of the mark M1 is continuously projected onto the photosensitive object 3 through the projection optical system PL during the period of existence of the mark M1 in the illumination area IA. Ideally, images of the mark M1 should be identical even when the mark M1 is located at any of positions x=x1, x2, x3, . . . xn in the X direction in the illumination area IA. However, as described above, the image of the mark M1 is formed on the photosensitive object 3 while scanning the reticle R and the photosensitive object 3 (or the wafer W in actual exposure). Therefore, when the mark M1 is located at different positions in the illumination area IA, its pattern images are formed by light beams passed through different portions of the projection optical system PL. Existence of any aberration of the projection optical system PL causes mutually different distortions of the images depending on the position of the mark M1 in the X direction. FIG. 6B shows examples imaginarily illustrating images of the mark M1 to be formed on the photosensitive object 3 at moments at which the mark M1 is located at respective positions x=x1, x2, x3 in the X direction. Distortions of the respective images are different from each other due to the difference in optical path in the projection optical system PL. Accordingly, a discrepancy of $\Delta x12$ may occur between central positions of the images concerning x=x1 and x=x2. A discrepancy of $\Delta x23$ may occur between central positions of the images concerning x=x2 and x=x3. It is also assumed that $\Delta x12$ and $\Delta x23$ include discrepancy in synchronization between the reticle stage RST and the wafer stage WST brought about during one time of scanning, and discrepancy in positional relationship between the reticle R and the wafer stage WST caused by vibration of the whole apparatus due to scanning. Actually, the respective images shown in FIG. 6B are not detected individually on the photosensitive object 3. An image appears on the photosensitive object 3 in a form as obtained by adding images formed at respective x positions when the mark M1 is subjected to one time of scanning across the illumination area IA. As shown in FIG. 6C, a final image thereof is formed in a shape which is blunter than those of the respective images shown in FIG. 6B. Especially, the line width 1 obtained by slicing the signal at a predetermined level is wider than signal widths of the individual images. The formed image is represented by a function of XY based on the coordinate on the photosensitive object 3 (or coordinate on the wafer stage) because the photosensitive object 3 is two-dimensional. However, the image is represented by using only the X coordinate in the scanning direction in order to simplify the explanation.

The image of the mark pattern on the reticle R formed (exposed) on the photosensitive object 3 as described above is detected by using the alignment system 30 to 35. After the scanning exposure, the wafer stage WST is moved toward an optical axis AX2 of the alignment system. The photosensitive object 3 is scanned across a light beam from the light source 30 of the alignment system while moving the wafer stage WST. During the scanning, a reflected light beam from the photosensitive object 3 is detected by the light-receiving section 31 of the alignment system. A detected signal amplified by the amplifier 32 is subjected to image processing in the processing system 4, and an obtained signal is fed to the controller 13. The controller 13 computes the position of image formation and the positional discrepancy of the mark on the reticle R and various image formation characteristics on the basis of the obtained image output in accordance with the following methods. The mark on the reticle R is not limited to M1. Images of all of the marks M1 to M8 are formed by the scanning for the reticle R, as waveforms similar to the waveform shown in FIG. 6C on the photosensitive object 3. Their image outputs are fed to the controller 13 through the processing system 4.

The position of image formation of the mark on the reticle R can be judged from the central position of the waveform of the image obtained as the image output by the processing system 4, for example, from X0 in the waveform shown in FIG. 6C. On the other hand, it is possible to determine, by calculation, the position (designed value) X01 at which the image of the mark M1 should be formed on the photosensitive object 3 on the basis of the position coordinate of the mark M1 on the reticle R and the magnification of the projection optical system PL. Therefore, calculation of $\Delta X=X0-X01$ makes it possible to determine the positional discrepancy in image formation (difference between the designed value and the actual exposure position) in the X direction of the mark M1 on the reticle R, brought about due to various causes including scanning for the reticle R and the photosensitive object 3 (or the wafer W in actual exposure). The position of image formation and the positional discrepancy can be also determined for the other marks M2 to M8 in the same manner as described above.

Next, a method for determining dynamic image formation characteristics of the projection optical system PL in scanning exposure from the one-dimensional or two-dimensional position of image formation of each of the obtained marks on the reticle R will be explained. For example, when a contrast of the image is determined as one of the image formation characteristics, the output of each of the marks detected as shown in FIG. 6C is sliced at an appropriate slice level to determine a line width 1 respectively so that the obtained result may be compared with the reference value. Alternatively, the contrast may be determined from rise angles at both end edges of the output waveform of each of the marks.

When an image magnification is determined as one of the image formation characteristics, the following method may be adopted. Positions of image formation X1 and X5 on the photosensitive object 3, of a plurality of marks, for example, marks M1 and M5 on the reticle R are determined in the X coordinate system on the wafer stage WST. The magnification can be calculated on the basis of a spacing distance between X1 and X5 in the coordinate system of the wafer stage WST and a spacing distance in the X direction between the marks M1 and M5 on the reticle R.

When a distortion is determined as one of the image formation characteristics, the following method may be adopted. For example, sets of two points A1, A2 and B1, B2 are selected in a relatively inner region and a relatively outer region in the pattern area 40 on the reticle R so that a spacing distance A1A2 between the two points is equal to a spacing distance B1B2. Positions of image formation of them on the photosensitive object 3 are determined in the same manner as described above in the coordinate system of the wafer stage WST. After that, a spacing distance A1A2' and a spacing distance B1B2' between the positions of image formation are determined for each of the sets of two points in the coordinate system of the wafer stage WST respectively. Differences between the determined spacing distance s and the spacing distance s on the reticle R, i.e., (A1A2'−A1A2) and (B1B2'−B1B2) are calculated respectively to make comparison taking the magnification into consideration. Thus the distortion can be determined.

On the other hand, the amount of rotation of the reticle R on the reticle stage RST, which would be caused by scanning for the reticle R, can be determined by measuring the position of image formation of the mark on the reticle R as described above. In this procedure, for example, the marks M1 and M5 are selected from the marks on the reticle R. Positions Y1 and Y5 of image formation in the Y direction on the photosensitive object 3 are detected for the marks M1 and M5 in the coordinate system of the wafer stage WST respectively in the same manner as described above so that a difference $\Delta Y$ therebetween is determined. Thus it is possible to know a degree of discrepancy in the Y direction upon image formation of the pattern on the reticle R. The amount of rotation $\theta$ of the reticle R can be also calculated from $\Delta Y$ and a distance in the X direction between M1 and M5.

The positional discrepancy of the entire pattern on the reticle R can be also determined as follows. For example, the reticle R is arranged on the reticle stage RST so that the center of the reticle R is located on the optical axis of the projection optical system PL, and two-dimensional positions of image formation of the respective marks are determined in the coordinate system of the wafer stage by using the photosensitive object 3 and the alignment system 30 to 35 in the same manner as described above. After that, distances between the reference point on the photosensitive object 3 (wafer stage coordinate system) and the positions of image formation of the respective marks are determined respectively. The determined distances are compared with distances L1 to L8 from the center of the reticle R to the respective marks M1 to M8 on the reticle R, taking the magnification into consideration. Thus it is possible to know the offset amount of the pattern on the reticle R during scanning for the reticle R. In this procedure, the offset amount of the pattern on the reticle R can be also determined by comparing, for one mark, the distance from the center of the reticle R with the distance between the position of image formation thereof and the reference point. However, in view of reproducibility, it is desirable to calculate the offset amount from an average value by determining the differences in distance for the eight marks M1 to M8 respectively.

If the image formation characteristics obtained as described above are not in desired ranges, the image formation characteristics can be corrected by using the same operation as described in the first embodiment.

A method for determining a base line of the wafer alignment system from the one-dimensional or two-dimensional position of image formation of each of the marks on the reticle R obtained as described above will be explained. The measurement for the base line can be executed in accordance with the same operation as performed in the measurement for the position of image formation of the mark on the reticle R and the image formation characteristics described above. Namely, the photosensitive object 3 is exposed with the reference mark such as M1 on the reticle R by synchronously scanning the reticle stage RST and the wafer stage WST at the same scanning velocities as those in actual exposure. Signals from the interferometers 7, 9 obtained in this process are simultaneously fed to the controller 13. Thus the position of the photosensitive object during exposure can be recorded by using the wafer stage coordinate system. After that, the wafer stage WST is moved in the X direction so that the photosensitive object 3 is located under the wafer alignment system. A light beam is radiated from the light source 30 of the alignment system onto the photosensitive object 3, and its reflected light beam is detected by the light-receiving unit 31. Thus an image of the reference mark formed on the photosensitive object 3 is detected. During this process, a signal of the interferometer 9 is fed to the controller 13. Thus it is possible to know the position at which the reference mark on the photosensitive object 3 is detected by the wafer alignment system, in the wafer stage coordinate system. Accordingly, it is possible to determine, from a difference in the signal of the interferometer between the exposure of the photosensitive object 3 and the detection by the wafer alignment system, a difference between the position of the exposed image of the reference mark on the reticle R and the detecting position of the alignment system, i.e., the base line of the alignment system. The position of the wafer W subjected to overlay exposure can be accurately determined on the basis of the mark on the reticle R by defining the base line of the alignment system as described above. Moreover, the base line can be determined in such a way that the relative positional discrepancy between the reticle R and the wafer W, which would be caused during scanning, is incorporated. Thus the overlay accuracy in scanning type exposure can be improved.

In this embodiment, the image of the mark pattern is formed by using the photochromic device as the photosensitive object. However, the degree of photosensitivity of the photochromic device is different from the degree of photosensitivity of the photoresist applied to the wafer to be used for actual exposure. Accordingly, it is necessary to adjust the amount of light radiated onto the photosensitive object in order to make conformity with an actual exposure condition. However, in order to previously evaluate image formation characteristics during actual exposure by using the photosensitive object, it is necessary to perform scanning under the same condition as that of actual exposure, and it is impossible to adjust the amount of light by changing the scanning velocity to a scanning velocity during actual exposure. Thus in the present invention, the illuminating optical system is installed with a filter (not shown) capable of changing the intensity of the illuminating light beam so that the photochromic device may be uniformly exposed during an entire period of scanning to give an amount of light which provides a sufficient sensitivity for measurement. In order to cope with various types of reticles, the filter may be arranged such that a plurality of filters having different densities are prepared to be capable of change over by using a revolver or the like. Alternatively, it is also possible to use an element capable of electrically changing its density, such as a liquid crystal element. In another embodiment, the sensitivity of the photochromic device may be variable while maintaining a constant intensity of the exposure light beam. For example, the velocity of exposure of the photochromic device differs depending on the temperature. Accordingly, the temperature of the photochromic device may be controlled to be a desired temperature. Alternatively, the degree of photosensitivity may be adjusted by combining both the adjustment for the intensity of the exposure light beam and the control for the temperature of the photochromic device. The adjustment for the degree of photosensitivity as described above has been unnecessary for the conventional collective type exposure apparatus. However, such adjustment should be considered in the scanning type exposure apparatus in order to reproduce an actual scanning exposure condition.

In this embodiment, the photochromic device is used as the photosensitive object. However, it is also possible to use a magneto-optical recording element. The magneto-optical recording element is a device for radiating a light beam such as a laser beam onto a recording position on a recording film while applying an external magnetic field so that magnetization of the radiated portion is inverted to record a signal such as an image signal, and radiating a reproducing light beam onto the recording film during reproduction so that a polarized component from a reflected light beam is detected to detect a recorded signal. An image once recorded is erasable by radiating a light beam while applying an external magnetic field. Such a magneto-optical recording element is used as the photosensitive object 3 so that the mark pattern on the reticle R may be recorded on the magneto-optical recording element while synchronously scanning the reticle stage RST and the wafer stage WST in the same manner as described above, and a mark pattern image formed on the magneto-optical recording element may be detected by using the alignment system. In this procedure, it is necessary for the scanning type exposure apparatus to provide an optical detecting system including a magnetic field-generating unit such as a coil for applying the external magnetic field to the magneto-optical recording element, and a wavelength constant or the like for detecting the polarized component.

The photosensitive object is not limited to the photochromic device and the magneto-optical recording element. A wafer (photosensitive substrate) to be actually exposed may be used as the photosensitive object. An area, which is not exposed with the pattern on the reticle, exists at the circumference of the photosensitive substrate. Such an area may be used to evaluate the test mark on the reticle.

In place of the installation of the photosensitive object directly on the wafer stage, its light-receiving section may be installed on the wafer stage. The light beam received by the light-receiving section may be transmitted through an optical fiber or the like to a photosensitive object installed outside the wafer stage to expose the photosensitive object therewith.

Third Embodiment

Figure 7:
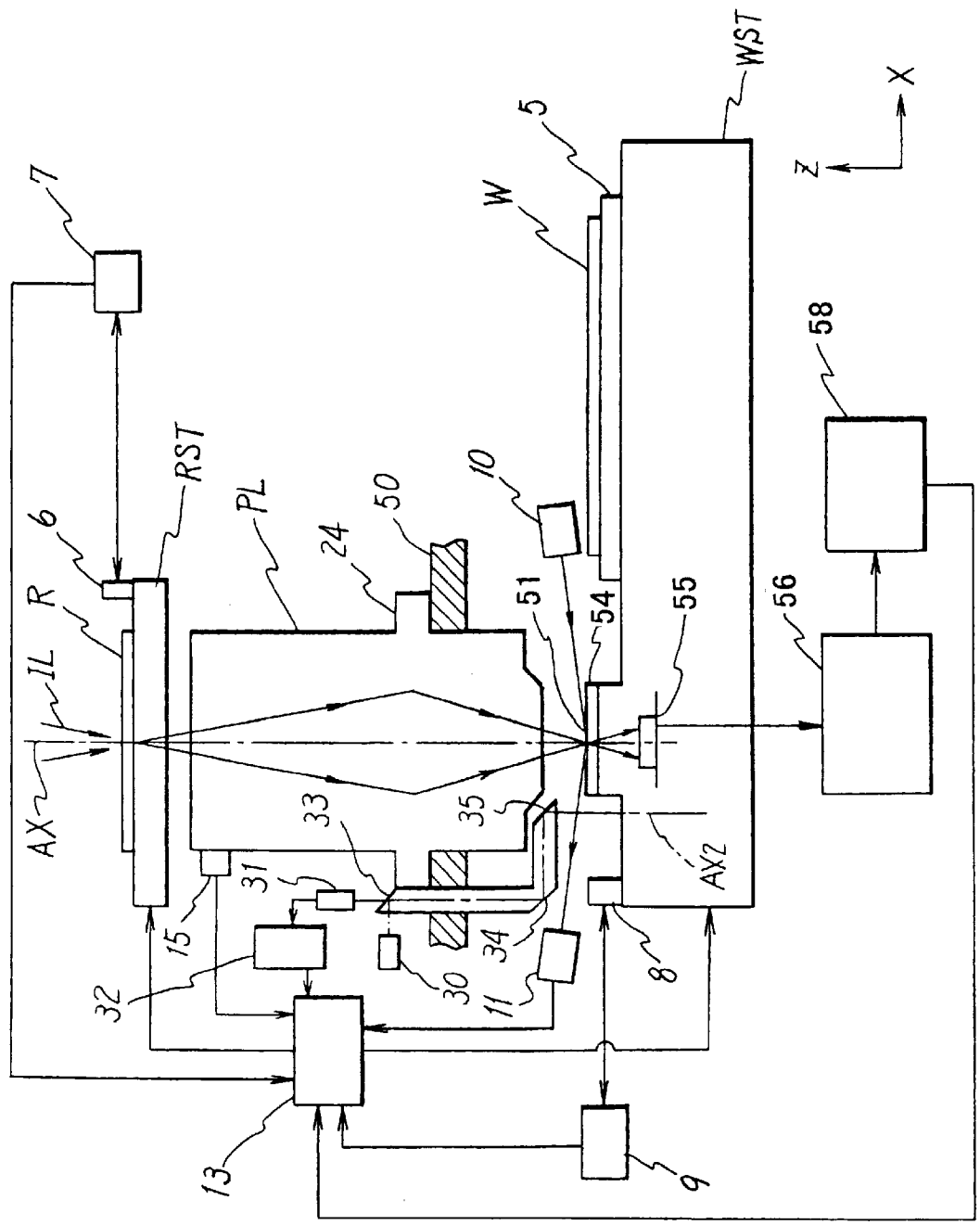
FIG. 7 shows a schematic arrangement of a scanning type exposure apparatus according to a third embodiment of the present invention, comprising a mechanism capable of predicting image formation characteristics during scanning type exposure.

FIG. 7 shows a third embodiment of the scanning type projection exposure apparatus for performing exposure while synchronously scanning a reticle R and a wafer W with respect to an illumination area on the reticle R. This projection exposure apparatus principally comprises a light source (not shown), an illuminating optical system (not shown), a reticle stage RST for moving the reticle R in a scanning direction, a projection optical system PL for projecting an image of a pattern formed on the reticle R onto the wafer W, a wafer stage WST for moving the wafer W in synchronization with the scanning for the reticle R, a wafer alignment system 30 to 35 for performing positional adjustment for the wafer, and a photoelectric sensor 55 for previously evaluating image formation characteristics. The same reference numerals as those used in FIG. 1 are affixed to the same components as those described in the first embodiment, explanation of which will be omitted.

A pattern plate 54 for measuring image formation characteristics is installed on the surface of the wafer stage WST of the exposure apparatus shown in FIG. 7 at a position in the X direction different from the position of the wafer holder 5 and at a height substantially coincident with the upper surface of the wafer W. The position of the pattern plate 54 is adjusted by the Z-directional position sensor (10, 11) and the wafer stage WST so that the upper surface of the pattern plate 54 is coincident with the image plane of the projection optical system PL. When the image formation characteristics of the projection optical system PL are previously measured, the wafer stage WST is moved in the X direction so that the pattern plate 54 is located just under the projection optical system PL. Accordingly, an image of a pattern on the reticle R illuminated with the illuminating light beam IL is formed on the pattern plate 54 through the projection optical system PL. A slit-shaped aperture 51 is formed at a central portion of the pattern plate 54. The photoelectric sensor 55 for measuring the intensity of the illuminating light beam passed through the aperture 51 is installed inside the wafer stage WST and under the pattern plate 54.

Figure 16A:
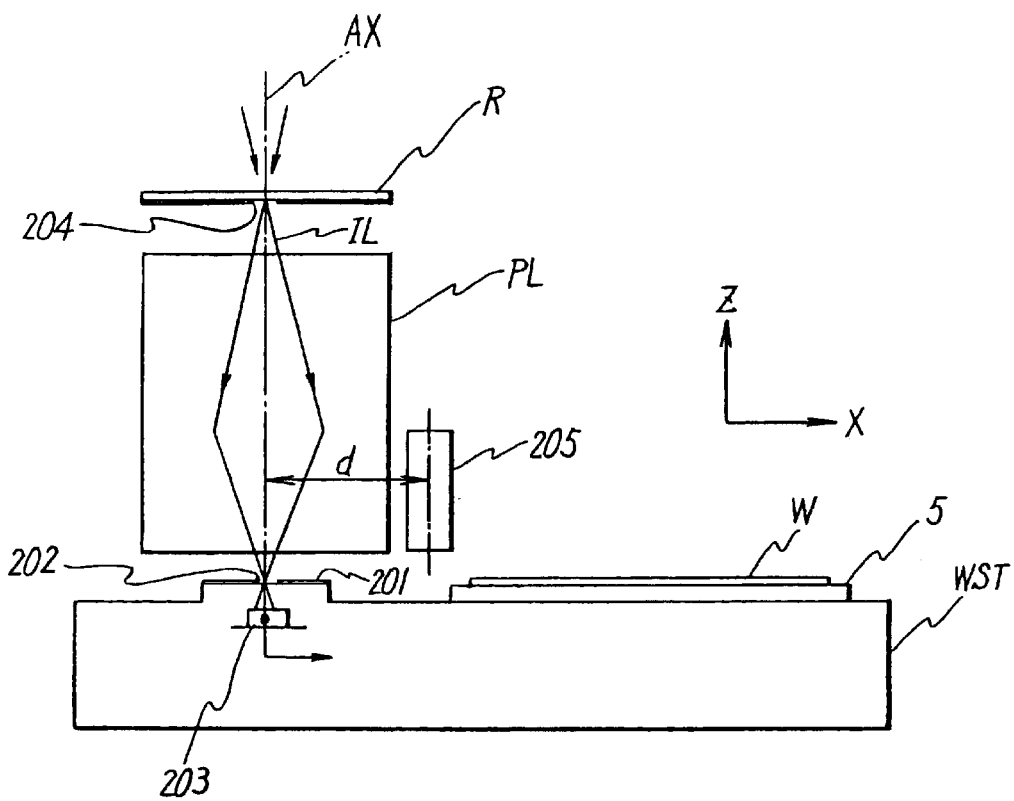
FIG. 16A shows a schematic arrangement of a conventional projection exposure apparatus of the collective exposure type provided with a system for measuring image formation characteristics.

The photoelectric sensor 55 has a sufficient areal size to receive all light beams passing through the aperture 51. The arrangement of the system for measuring image formation characteristics by using the pattern plate 54 (which serves as a light-receiving section of the photoelectric sensor 55) and the photoelectric sensor 55 is similar to the arrangement of the static system for measuring image formation characteristics used in the conventional collective exposure type projection exposure apparatus as shown in FIG. 16A. Accordingly, as explained in the foregoing section of the related art, a static projected image of a mark pattern on the reticle R, which is formed by a light beam passed through one fixed optical path in the projection optical system PL, can be measured as follows. Namely, the pattern plate 54 is moved to a position of image formation by the projection optical system PL. After that, the wafer stage WST and the reticle stage RST are allowed to stand still, and then the wafer stage WST is finely moved while illuminating the test mark. The wafer stage WST and the reticle stage RST are movable in the scanning exposure apparatus. Accordingly, a static image may be measured by finely moving the reticle stage RST in place of the wafer stage WST. It is also necessary for the scanning type exposure apparatus to optimally adjust, before actual exposure, the image formation characteristics in such a static state, i.e., the image formation characteristics in a state in which the reticle R and the wafer W are not scanned. It is desirable to correct the obtained image formation characteristics by using an appropriate correcting system. For example, if the magnification determined by computing operation is discrepant with a target magnification, a magnification discrepancy occurs in the non-scanning direction for an image formed by scanning, resulting in deterioration of image quality in the scanning direction. Accordingly, it is possible to use known methods for correcting the magnification and the distortion, including, for example, those in which the optical path length concerning the reticle R and the projection optical system PL is changed, or a part of the lens elements of the projection optical system PL is driven in the direction of the optical axis AX, or inclined with respect to the optical axis AX. The discrepancy in focal position and the inclination of the image plane may be corrected by giving an offset to the Z-directional position sensor (10, 11). The present invention provides the method for measuring image formation characteristics of the image of the pattern on the reticle R to be produced by actual scanning exposure and the correcting method therefor on the assumption that the image formation characteristics in the static state are optimized.

Next, a method for measuring (predicting) image formation characteristics of the image of the pattern on the reticle R produced by scanning type exposure will be explained by using the scanning type exposure apparatus shown in FIG. 7 in accordance with the scanning type exposure method of the present invention. This embodiment uses a reticle R for producing a circuit pattern as shown in FIG. 4, having a reticle pattern involving respective four test marks M1 to M8 on each of two opposing sides located outside a reticle pattern area 40.

Figure 8A:
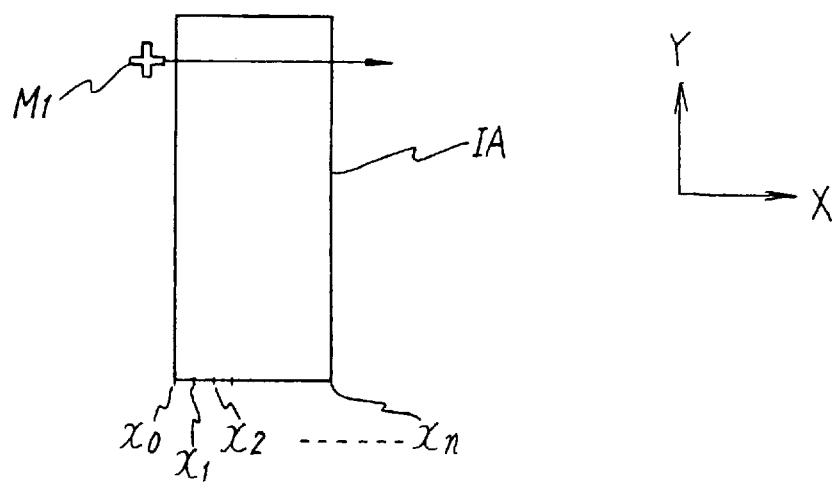
FIG. 8A shows a situation in which the reference mark M1 is moved along the X direction across the illumination area IA in the scanning type exposure apparatus of the third embodiment.

In order to measure the image formation characteristics in accordance with the scanning exposure method of the present invention, the wafer stage WST is moved so that the pattern plate 54 is located at the position of image formation under the projection optical system PL. As shown in FIG. 8A, the mark M1 on the reticle R is successively moved to various positions xR=x1, x2, x3, . . . xn in the scanning direction (direction of the arrow (X)) in the illumination area IA to measure images of the mark M1 at the respective xR positions. At first, the reticle stage RST is moved to position the mark M1 at x1 in the scanning direction. At this time, the image of the mark M1 is formed at any position on the pattern plate 54. After that, the wafer stage WST is moved by a minute amount in the scanning direction (X direction or −X direction) while allowing the reticle stage RST to stand still so that the pattern plate 54 is scanned across the projected image of the mark M1 formed by the projection optical system PL. It is desirable that the movement of the wafer stage WST is performed as slowly as possible so that no harmful influence is exerted on the image formation characteristics of the mark due to vibration of the stage or the like.

Figure 8B:
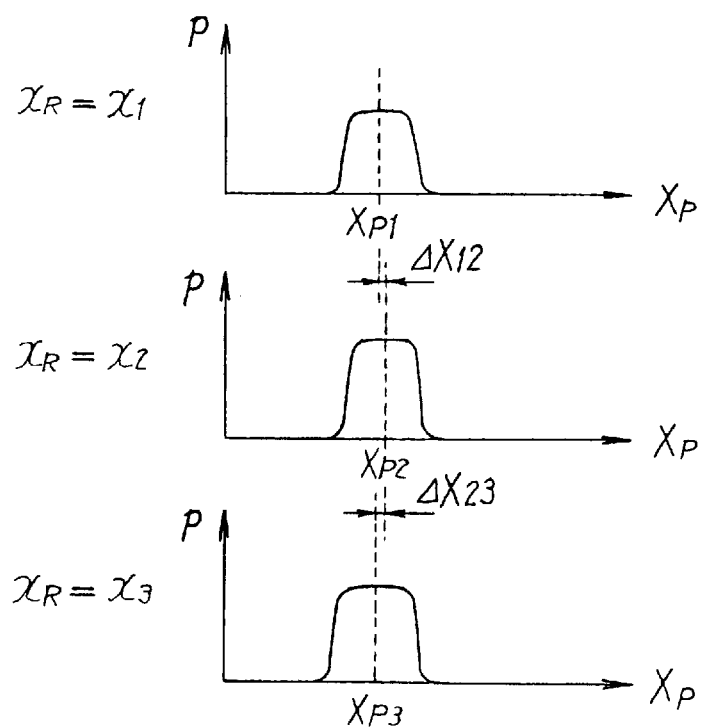
FIG. 8B shows output waveforms of images of the mark pattern M1 detected by a photoelectric sensor when the reference mark M1 is located at positions in the X direction x1, x2, and x3 in the illumination area IA in the scanning type exposure apparatus of the third embodiment.

In accordance with the scanning described above, the image of the mark M1 is detected by the photoelectric sensor 55 through the aperture 51 of the pattern plate 54. A signal waveform detected by the photoelectric sensor 55 is shown in a graph in FIG. 8B concerning xR=x1. The axis of abscissa Xp in the graph indicates a position of coordinate (x coordinate Xp on the photoelectric sensor 55) in the scanning direction (X direction) on the photoelectric sensor 55. It is assumed that the center of the signal waveform is detected at XP1. The central position of the signal waveform may be represented by using an X coordinate system of the wafer stage, i.e., a position of the wafer stage in the X direction measured by the interferometer 9 for the wafer stage WST. However, in this embodiment, the central position is represented by using the Xp coordinate system on the photoelectric sensor 55 in order to make comparison for central positions of images formed depending on mark positions in the illumination area. However, for the sake of processing to be performed later on, the central position XP1 of the signal waveform is converted into a position in the wafer stage coordinate system, and an obtained result is stored in an image formation characteristic-detecting system 56. The axis of ordinate indicates the intensity (arbitrary scale) of received light. After the detection of the projected image of the mark M1 obtained when the mark M1 is located at the first position (xR=x1) in the illumination area is completed, the reticle stage RST is moved so that the mark M1 is moved to the next position (xR=x2) in the scanning direction in the illumination area. Thus the pattern plate 54 is scanned across a projected image of the mark M1 formed by the projection optical system PL, by moving the wafer stage WST in the scanning direction while allowing the reticle stage RST to stand still at the aforementioned position in the same manner as performed in the detection concerning xR=x1. A signal waveform outputted from the sensor 55 is shown in a graph in FIG. 8B concerning xR=x2. The output waveform obtained when the mark M1 is located at xR=x1 is compared with the output waveform obtained when the mark M1 is located at xR=x2. As a result, the central position XP2 of the signal waveform is different by $\Delta X12 = XP2 - XP1$ because of the following reason. Namely, when the mark M1 is located at xR=x1 and xR=x2, light beams for forming images pass through different optical paths in the projection optical system PL, resulting in mutually different influences of distortions exerted on the obtained images because of aberration or the like of lens elements of the projection optical system PL.

Next, the reticle stage RST is moved so that the mark M1 is moved to the next position (xR=x3) in the scanning direction in the illumination area to detect its projected image in the same manner as performed for the detection concerning xR=x1 and xR=x2. The central position is also different by $\Delta X23 = XP2 - XP3$ between an output waveform obtained when the mark M1 is located at xR=x3 and the output waveform obtained when the mark M1 is located at xR=x2 due to the influence of distortion. The mark M1 is successively moved to subsequent positions in the scanning direction in the illumination area by using the reticle stage RST as described above. Thus the detection of projected images is executed respectively at respective xR positions until arrival at xR=xn, i.e., an xR position nearest to the side at which the scanning is completed in the illumination area IA.

After a projected image is measured at x=xn, n individual of output waveforms are obtained for projected images of the mark M1 at the respective positions x1, x2, x3, . . . xn in the scanning direction (direction of the arrow in FIG. 8A)

in the illumination area IA. The output waveforms and the central positions in the wafer stage X coordinate system are stored in the image formation characteristic-detecting system 56 respectively. The foregoing output waveforms represent the images formed by light beams passed through different portions of the projection optical system PL respectively. Accordingly, the output waveforms reflect image formation characteristics of an image to be obtained by scanning exposure in which an image is formed in accordance with the same principle. Image formation characteristics of the foregoing images, for example, their magnifications and distortions may be determined from the obtained waveforms and the central positions in the wafer stage coordinate system by using the image formation characteristic-detecting system 56. Obtained results may be stored in the image formation characteristic-detecting system 56 with respect to each of the xR positions of the mark pattern. In the detection by using the photoelectric sensor 55, if the illuminating light beam IL is not constant due to laser pulse oscillation or the like, the output of the photoelectric sensor is also affected. In such a case, for example, it is necessary to measure a laser power for each pulse by using a power meter or the like so that the output of the photoelectric sensor 55 is normalized by using the laser power.

In the present invention, the image formation characteristics of the image formed by light beams passed through mutually different optical paths in the projection optical system PL are corrected by using variation amounts of image formation characteristics based on synchronization errors which may be produced due to synchronous movement of the reticle stage RST and the wafer stage WST. Such correction is performed by an image formation state-computing unit 58 (corresponding to the image formation state-computing unit and the image position-computing unit). The correction makes it possible to predict image formation characteristics of an image to be produced by actual exposure in accordance with the scanning type exposure system. At first, a method for determining positional discrepancy and variation amounts of image formation characteristics based on synchronization errors will be explained below. The wafer W is placed on the wafer stage WST, and signals from the interferometers 7, 9 for the respective stages are monitored while moving the reticle stage RST and the wafer stage WST at the same scanning velocities as those used in actual exposure to detect synchronization errors in movement velocities of the both stages, i.e., discrepancies between respective designed positions to be expected and measured positions of the reticle stage RST and the wafer stage WST at a predetermined time. In this procedure, not only positional errors in the X and Y directions but also rotational errors of the wafer can be detected by using the interferometers. Calculation for the positional discrepancies etc. is performed by the stage controller 13. Values of the positional discrepancies and the rotational errors are obtained for each of positions of the reticle stage RST and the wafer stage WST. For example, when the reticle stage RST is located at a predetermined position, the degree of discrepancy of a position of the wafer stage with respect to an expected position of the wafer stage is observed in accordance with a velocity synchronized with the reticle stage RST. Obtained results are stored in the stage controller 13, as data for each of positions of the wafer stage WST (represented by the wafer stage coordinate system).

The causes of harmful influences exerted on the image formation characteristics of the image of the pattern on the reticle R, brought about by synchronous movement of the reticle stage RST and the wafer stage WST, may include synchronization discrepancy in movement velocities of the reticle stage RST and the wafer stage WST, as well as positional discrepancy in the Z direction of the photosensitive substrate placed on the wafer stage WST (due to irregularities on the photosensitive substrate), and discrepancy in image formation characteristics of the projection optical system PL caused by vibration of the projection optical system PL during movement of both stages. The causes can be measured by synchronously scanning the reticle stage RST and the wafer stage WST prior to actual exposure. Accordingly, they may be herein incorporated in the synchronization error. Therefore, those capable of functioning as the synchronization error detector include the stage controller 13, as well as the Z-directional position sensor 10, 11, and an acceleration sensor 15. The positional discrepancy of the photosensitive substrate in the Z direction can be calculated by detecting an output of the Z-directional position sensor 11 during a period of synchronous movement to use a relational expression between a positional discrepancy of the wafer W in the Z direction previously determined by experiment or calculation and an image formation characteristic, for example, between a positional discrepancy of the wafer W in the Z direction and a variation amount of a focal position. The discrepancy in image formation characteristics of the projection optical system PL due to vibration of the projection optical system PL can be determined by, for example, observing a detected signal from the acceleration meter 15 installed at the lens barrel of the projection optical system PL as shown in FIG. 7 to use a relational expression between a change in image formation characteristics and respective amounts of movement of the projection optical system PL in the X, Y, and Z direction previously determined by calculation or experiment. The synchronization errors and the variation amounts of image formation characteristics caused thereby are stored in the stage controller 13, for each of positions of the wafer stage WST, or as an average value in one time of scanning.

Figure 9A:
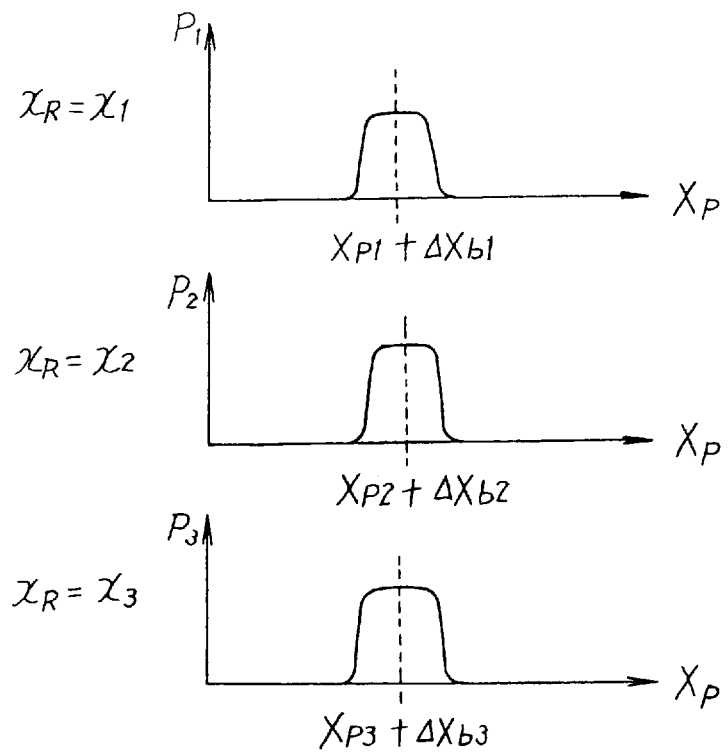
FIG. 9A shows graphs illustrating output waveforms of mark pattern images corresponding to x1, x2, x3, . . . xn in the illumination area after correction with synchronization errors.
Figure 9A:
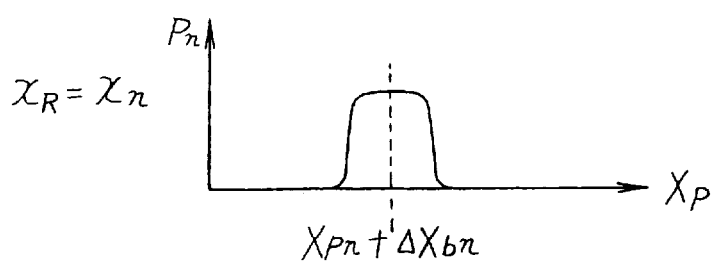

The output waveform of the image of the mark M1 (FIG. 8B) determined at each position in the illumination area IA is corrected by the aid of the image formation state-computing unit 58 by using the synchronization errors thus obtained, and the discrepancy in image formation position of the image of the mark M1 and the variation amount of the image formation characteristics based thereon. In this embodiment, explanation will be made for an example in which the position of image formation in the scanning direction (X direction) of the image of the mark is corrected. A total amount ΔXb, which is obtained by adding up the amounts of the synchronization discrepancy in the movement velocity of the stage WST and the positional discrepancy in the scanning direction (X direction) caused by vibration of the projection optical system PL, stored in the stage controller 13, is determined for each of the positions of the wafer stage WST in the X direction. After that, total amounts ΔXb1, ΔXb2, ΔXb3, . . . ΔXbn (synchronization errors corresponding to the respective x positions in the scanning direction in the illumination area IA), which are obtained by adding up the positional discrepancy amounts in the scanning direction (X direction) at the central positions of the output waveforms of the images observed at the respective xR positions in the illumination area (represented in the wafer stage coordinate system and stored), are extracted from the image formation characteristic-detecting system 56. The output waveforms of the images observed at the respective x positions in the illumination area IA (FIG. 8B) are corrected by using the extracted values ΔXb1, ΔXb2, ΔXb3, . . . ΔXbn. This process is shown in FIG. 9A.

Figure 9B:
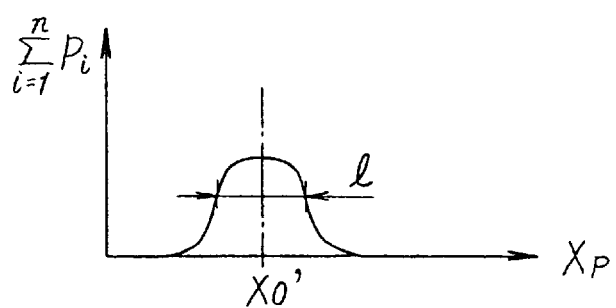
FIG. 9B conceptually shows an image of the mark M1 to be formed by one time of scanning for the reference mark M1 across the illumination area IA.

For example, the output waveform of the image, which is formed when the mark M1 is located at xR =x1 in the illumination area IA, is corrected so that its central position comes to XP1+ΔXb1. Similarly, the output waveforms of the images, which are formed when the mark M1 is located at xR=x2, x3, . . . xn in the illumination area IA respectively, are corrected by shifting their central positions by ΔXb2, ΔXb3, . . . ΔXbn respectively. The output waveforms of the images of the mark M1 thus obtained represent images which may be formed on the photosensitive substrate by the projection optical system PL at the moments at which the mark M1 is located at the respective positions in the scanning direction in the illumination area in actual scanning type exposure respectively. After that, the respective output waveforms are superimposed with each other by adding respective corrected shapes Pm(xp) of the estimated images at x1 to xn shown in FIG. 9A with respect to an interval of m=1 to n. Thus an output waveform as shown in FIG. 9B is obtained. A central position X0' of the output waveform in FIG. 9B represents a position of image formation of the mark M1 on the reticle R. This position of image formation corresponds to a position of image formation of an image which may be formed by one time of scanning in actual scanning type exposure.

In the foregoing explanation, the image formation states (positions of image formation) of the mark M1 located at the respective positions in the scanning direction in the illumination area are corrected considering only the positional discrepancy amounts in the scanning direction (X direction) as the synchronization errors. However, it is also possible to use other synchronization errors such as the positional discrepancy amount of the wafer W in the Z direction, from which the intensity P of the output waveform is corrected, and the positional discrepancy amount in the Y direction, from which the output waveform of the image in the Y direction is corrected. As for the synchronization errors, it is also possible to use an averaged value of synchronization errors which may be produced by one time of scanning, in place of the values stored for the respective positions in the scanning direction in the illumination area. In this procedure, all of the image formation states (positions of image formation) of the mark M1 located at the respective positions in the scanning direction in the illumination area are corrected by using an identical value (average value of the synchronization errors).

The foregoing explanation has been made by using only M1 as the mark on the reticle R. However, static images can be detected at the respective positions in the illumination area in accordance with the same operation as described above for not only M1 but also for all of the marks M1 to M8 to perform correction by using synchronization errors corresponding to the respective position in the illumination area. The output waveforms and the central positions in the wafer stage coordinate system of the marks M1 to M8, before and after the correction, are also stored in the image formation characteristic-detecting system 56.

Next, the positional discrepancy in image formation, which may occur upon actual scanning type exposure, is determined from the position of image formation of the mark M1 on the reticle R, obtained as the central position X0' of the output waveform shown in FIG. 9B. The position (designed value) X01, at which the image of the mark M1 should be formed on the photoelectric sensor 53, can be determined by calculation on the basis of the position coordinate of the mark M1 on the reticle R and the magnification of the projection optical system PL. Therefore, calculation of ΔX=X0–X01 makes it possible to predict the positional discrepancy in image formation (difference between the designed value and the actual exposure position) in the X direction of the mark M1 on the reticle R, brought about due to various causes including synchronous movement of the reticle stage RST and the wafer stage WST. The position of image formation and the positional discrepancy can be also determined for the other marks M2 to M8 in the same manner as described above.

Next, a method for predicting dynamic image formation characteristics of the projection optical system PL in actual scanning type exposure from the obtained one-dimensional or two-dimensional position of image formation of each of the marks on the reticle R will be explained. For example, when a contrast of the image is determined as one of the image formation characteristics, the output waveform of the mark pattern determined by computing operation as shown in FIG. 9B is sliced at an appropriate slice level to determine a line width 1 respectively so that the obtained result may be compared with the reference value. Alternatively, the contrast may be determined from rise angles at both end edges of the output waveform of each of the marks.

When an image magnification is determined as one of the image formation characteristics, the following method may be adopted. Positions of image formation on the photoelectric sensor 55, of a plurality of marks, for example, marks M1 and M5 on the reticle R are determined in the X coordinate system (for example, X1 and X5) on the wafer stage WST. The magnification can be calculated on the basis of a spacing distance between X1 and X5 in the coordinate system of the wafer stage WST and a spacing distance in the X direction between the marks M1 and M5 on the reticle R.

When a distortion is determined as one of the image formation characteristics, the following method may be adopted. For example, sets of two points A1, A2 and B1, B2 are selected in a relatively inner region and a relatively outer region in the pattern area 40 on the reticle R so that a spacing distance A1A2 between the two points is equal to a spacing distance B1B2. Positions of image formation of them on the photoelectric sensor 55 are determined in the same manner as described above in the coordinate system of the wafer stage WST. After that, a spacing distance A1A2' and a spacing distance B1B2' between the positions of image formation are determined for each of the sets of two points in the coordinate system of the wafer stage WST respectively. Differences between the determined spacing distances and the spacing distances on the reticle R, i.e., (A1A2'–A1A2) and (B1B2'–B1B2) are calculated respectively to make comparison taking the magnification into consideration. Thus the distortion can be determined.

On the other hand, the amount of rotation of the reticle R on the reticle stage RST, which would be caused by scanning for the reticle R, can be determined by measuring the position of image formation of the mark on the reticle R as described above. In this procedure, for example, the marks M1 and M5 are selected from the marks on the reticle R. Positions Y1 and Y5 of image formation in the Y direction on the photoelectric sensor 55 are detected for the marks M1 and M5 in the coordinate system of the wafer stage WST respectively in the same manner as described above so that a difference ΔY therebetween is determined. Thus it is possible to know a degree of discrepancy in the Y direction upon image formation of the pattern on the reticle R. The amount of rotation θ of the reticle R can be also calculated from ΔY and a distance in the X direction between M1 and M5.

The positional discrepancy of the entire pattern on the reticle R can be also determined as follows. For example, the reticle R is arranged on the reticle stage RST so that the center of the reticle R is located on the optical axis of the projection optical system PL, and two-dimensional positions of image formation of the respective marks are determined in the coordinate system of the wafer stage by using the photoelectric sensor 55 in the same manner as described above. After that, distances between the reference point on the photoelectric sensor 55 (wafer stage coordinate system) and the positions of image formation of the respective marks are determined respectively. The determined distances are compared with distances L1 to L8 from the center of the reticle R to the respective marks M1 to M8 on the reticle R, taking the magnification into consideration. Thus it is possible to know the offset amount of the pattern on the reticle R during scanning for the reticle R. In this procedure, the offset amount of the pattern on the reticle R can be also determined by comparing, for one mark, the distance from the center of the reticle R with the distance between the position of image formation thereof and the reference point. However, in view of reproducibility, it is desirable to calculate the offset amount from an average value by determining the differences in distance for the eight marks M1 to M8 respectively.

If the image formation characteristics obtained as described above are not in a desired range, the image formation characteristics can be corrected by using the same operation as described in the first embodiment.

Next, a method for determining a base line of the wafer alignment system from the one-dimensional or two-dimensional position of image formation of each of the marks on the reticle R obtained as described above will be explained. The measurement for the base line can be executed by using the results of measurement for the position of image formation and the image formation characteristics of the mark on the reticle R, obtained by using the image formation state-computing unit 58. The position of image formation of the mark M1 on the reticle R, which is obtained as the central position X0' of the output waveform shown in FIG. 9B, is expressed by using the wafer stage coordinate system, and used as the reference point for measuring the base line during scanning type exposure. Next, the wafer stage WST is moved in the X direction so that the photoelectric sensor 55 is located under the wafer alignment system. A light beam is radiated from the light source 30 of the alignment system onto the pattern plate 54 or the photoelectric sensor 55, and its reflected light beam is detected by the light-receiving unit 31. In this procedure, a specified portion of the pattern plate 54 or the photoelectric sensor 55 is defined as the reference position. For example, one end for defining the aperture 51 of the pattern plate 54 may be used as the reference position to detect the end by using the light-receiving unit 31. A signal of the interferometer 9, which is obtained when the reference position is detected by the light-receiving unit 31 of the alignment system, is fed to the stage controller 13. Thus it is possible to know the reference position in accordance with the wafer stage coordinate system. The base line of the alignment system can be determined on the basis of a difference between the reference point for measuring the base line and the reference position detected by the wafer alignment system. The position of the wafer W subjected to overlay exposure can be accurately determined on the basis of the mark on the reticle R by defining the base line of the alignment system as described above. Moreover, the base line can be determined in such a way that the relative positional discrepancy between the reticle R and the wafer W, which would be caused during scanning, is incorporated. Thus the overlay accuracy in scanning type exposure can be improved.

Figure 10A:
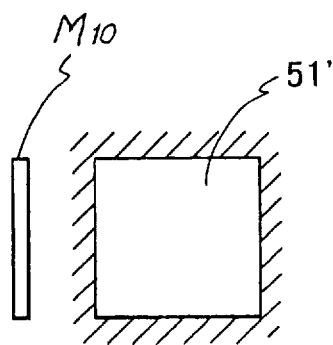
FIG. 10A shows a situation in which an image of a mark pattern is detected by using a photoelectric sensor having an aperture having a large areal size.
Figure 10B:
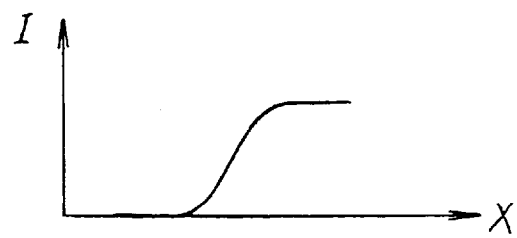
FIG. 10B shows a graph illustrating an output from the sensor shown in FIG. 10A.
Figure 10C:
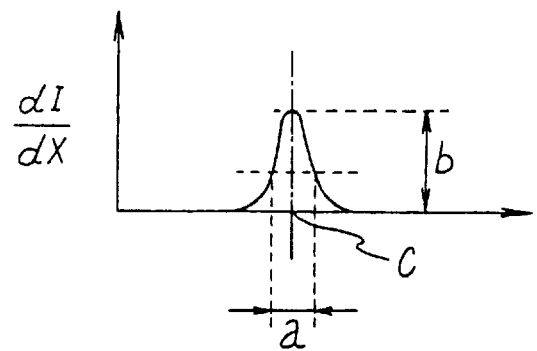
FIG. 10C shows a graph illustrating a waveform obtained by differentiating the output waveform shown in FIG. 10B.

In the foregoing embodiment, the slit-shaped aperture 51 formed through the pattern plate 54 is provided as the light-receiving section of the photoelectric sensor. However, as shown in FIG. 10A, a square aperture 51' having a larger areal size of aperture may be formed through the pattern plate 54. In this arrangement, a photoelectric sensor having a size capable of receiving all light beams passing through the aperture 51' is used as the photoelectric sensor to be installed under the aperture 51'. For example, when a rectangular mark M10 formed on the reticle R passes through the aperture 51', a waveform signal as shown in FIG. 10B is outputted from the photoelectric sensor. A waveform as shown in FIG. 10C is obtained by differentiating the signal. As for the waveform shown in FIG. 10C, the contrast of the image can be determined from a line width a or a peak b, and the distortion can be determined from a central position c of the waveform. The photoelectric sensor involving the aperture 51' having such a large areal size undergoes increase in signal range for measuring integrated waveforms. Accordingly, S/N is low as compared with those having slit-shaped apertures. However, the photoelectric sensor of this type has an advantage that a signal, which is more approximate to an actual image, is obtained because the signal is not averaged by the slit width. Further, the photoelectric sensor of this type has an advantage that measurement can be performed irrelevant to the type of patterns on the reticle. The photoelectric sensor shown in FIGS. 10A to 10C will be described in detail in the fourth embodiment.

In the foregoing embodiment, the photoelectric sensor 55 is provided at the inside of the wafer stage. However, in order to avoid an inconvenience caused by heat generation by the photoelectric sensor and an inconvenience caused by increase in weight of the wafer stage WST, only a light-receiving section, for example, an incident end of an optical fiber is installed on the wafer stage, and light beams received by the light-receiving section may be fed through an optical fiber or the like to a photoelectric sensor installed at the outside of the wafer stage.

In the foregoing embodiment, the image formation characteristics of the reticle pattern are predicted by detecting the mark pattern installed on the side of the object plane of the projection optical system by using the photoelectric sensor installed on the side of the image plane of the projection optical system. However, on the contrary, a mark pattern installed on the side of the image plane of the projection optical system may be detected by a photoelectric sensor installed on the side of the object plane of the projection optical system. For example, a mark pattern formed on the wafer may be irradiated by using an optical fiber or the like, and an image of the mark pattern formed by the projection optical system may be detected by a sensor or the like installed on the reticle stage or at a position over the reticle stage.

The projection exposure apparatuses according to the foregoing first to third embodiments use the projection optical system PL for producing semiconductors. However, the present invention is equivalently effective on scanning type exposure apparatuses other than the scanning type exposure apparatus which uses the projection optical system, such as a scanning type exposure apparatus which uses a mirror optical system.

Fourth Embodiment

In this embodiment, a projection exposure apparatus for detecting an image of a measuring mark by using an edge scan type sensor will be explained as described later on. Therefore, at first, the edge scan type sensor will be explained in detail.

Figure 11A:
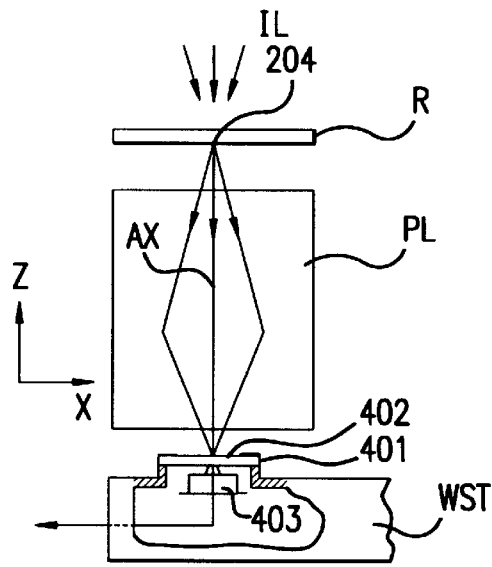
FIG. 11A shows a cross-sectional view of a projection exposure apparatus used in a method for measuring image formation characteristics in accordance with the edge scan system used in a fourth embodiment of the present invention.

FIG. 11A shows an arrangement of principal components of a projection exposure apparatus provided with a mechanism for measuring image formation characteristics, based on the use of a sensor of the edge scan type. In FIG. 11A, a fiducial plate 401, through which an aperture 402 is formed, is secured on a wafer stage WST. A slit 204, which extends in the non-scanning direction (Y direction), is formed as a measuring mark on a reticle R. An image of the slit 204, which is formed through a projection optical system PL, is detected by a photoelectric conversion element 403 through the aperture 402.

Figure 11B:
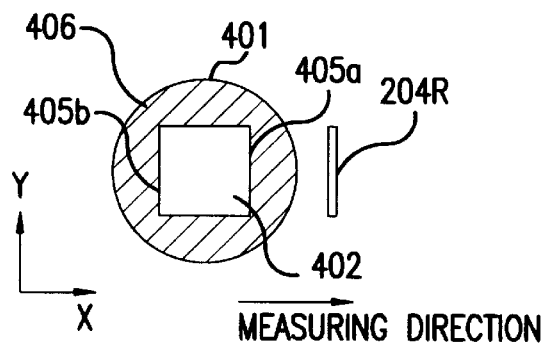
FIG. 11B conceptually shows a direction of movement of a fiducial plate with respect to a measuring mark.
Figure 16B:
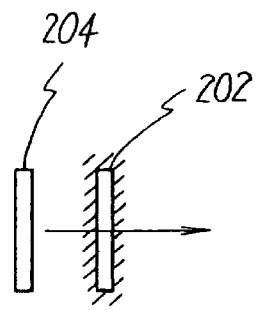
FIG. 16B shows a positional relationship between a mark pattern and an aperture in the apparatus shown in FIG. 16A.
Figure 16C:
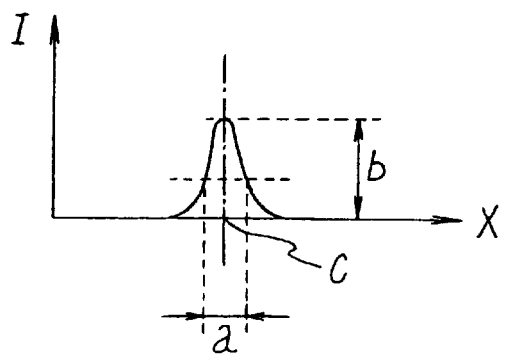
FIG. 16C shows a graph illustrating an output waveform from a sensor 203 of the apparatus shown in FIG. 16A.

FIG. 11B shows a plan view illustrating a relationship between the fiducial plate 401 and the projected image of the measuring mark 204 on the reticle R. In FIG. 11B, the substantially square aperture 402, which is surrounded by a shielding section 406 at its circumference, is provided at a substantially central portion of the circular fiducial plate 401. The slit 202 shown in FIG. 16B is approximately equal to or slightly wider in width than the line width (width in the measuring direction) of the image 204R of the measuring mark 204 to be measured. On the contrary, the width of the aperture 402 of the fiducial plate 401 in the measuring direction (X direction) is sufficiently larger than the line width of the image 204R of the measuring mark. The apparatus of the edge scan type is greatly different from the apparatus in FIG. 16 in this point. A light-receiving section of the photoelectric conversion element 403, which is located at the bottom of the aperture 402, is wider than the aperture 402. The operation is performed in a state as shown in FIG. 11B in the same manner as performed in the measurement exemplified in FIG. 16. Namely, the wafer stage WST is moved in the measuring direction (X direction), simultaneously with which the image 204R of the measuring mark on the reticle is detected by the photoelectric conversion element 403 through the aperture 402.

Figure 11C:
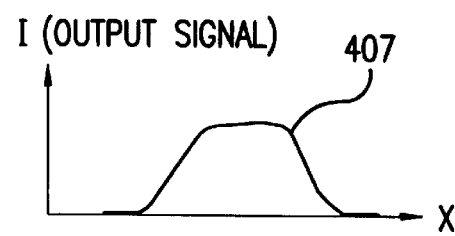
FIG. 11C shows a graph illustrating an output signal from a photoelectric conversion element.

A curve 407 in FIG. 11C represents an output signal waveform from the photoelectric conversion element 403. The axis of abscissa indicates the position x of the aperture 402 in the measuring direction, and the axis of ordinate indicates the output signal I. In FIG. 11C, the output signal I, which is represented by a hill-shaped curve 407, is regarded as an integrated value of amounts of light passed across a right edge 405a of the aperture 402. Accordingly, a waveform equivalent to the curve in FIG. 16C can be obtained by differentiating the curve 407.

Figure 11D:
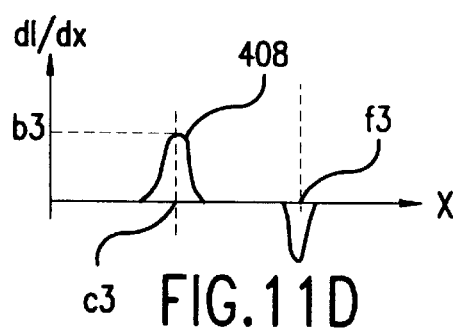
FIG. 11D shows a curve obtained by differentiating the curve shown in FIG. 11C.

A curve 408 shown in FIG. 11D represents a waveform obtained by differentiating the curve 407 in FIG. 11C with respect to the position x. In FIG. 11D, the axis of abscissa indicates the position x in the measuring direction, and the axis of ordinate indicates the differentiated value dI/dx of the output signal I. The curve 408 is represented by a waveform having a maximum value b3 at a central position c3. The curve 408 also has a peak in the opposite direction, i.e., a minimum value at a position f3 in the measuring direction. The peak in the opposite direction results from a left edge 405b of the aperture 402.

In accordance with the method which utilizes the edges 405a, 405b as described above, the shape of the image 204R of the original measuring mark 204 can be accurately reproduced without being averaged. The method explained with reference to FIG. 11 can be used for various types of measurement in the same manner as the methods described with reference to FIGS. 16A to 16C and FIGS. 18A to 18C.

Figure 18B:
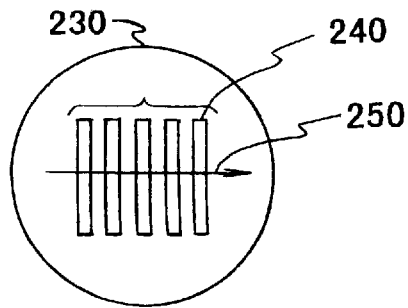
FIG. 18B shows a positional relationship between a mark pattern and a detecting section 230 of a photoelectric sensor in the apparatus shown in FIG. 18A.
Figure 18C:
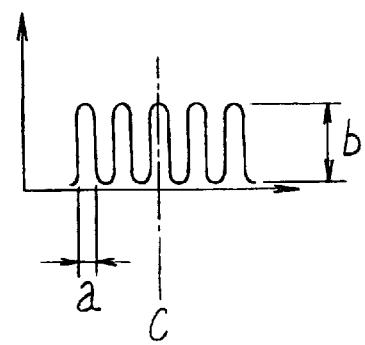
FIG. 18C shows a graph illustrating an output waveform from a sensor 220 of the apparatus shown in FIG. 18A.

In this embodiment, the image 204R of the measuring mark 204 gradually goes out of the aperture 402 starting from the edge 405b located on the opposite side of the edge 405a. Accordingly, if the entire length in the measuring direction of an image of a measuring mark as a measurement objective is longer than the aperture 402, the measurement cannot be performed in some cases because a portion outgoing from the aperture 402 and a portion incoming into the aperture 402 are mixed with each other. For example, as shown in FIG. 18B, when the measuring mark as a measurement objective is composed of a plurality of slit-shaped basic marks, the measuring mark has a wide width in the measuring direction. In such a case, the width in the measuring direction of the measuring mark as the measurement objective is restricted.

When the edge scan type sensor of the type as described above is used, the output signal from the photoelectric conversion element is outputted in an integrated form.

A curve 411 shown in FIG. 12A represents a signal waveform obtained when the edge scan type sensor is used. The axis of abscissa indicates the position x of the aperture in the measuring direction, and the axis of ordinate indicates the output signal I of the photoelectric conversion element. The photoelectric conversion element has a measurable region in which the amount of incident light is proportional to the output signal I. If the amount of incident light exceeds a linear maximum amount of light, the output signal is saturated, and the amount of light cannot be measured correctly. An output signal I corresponding to the linear maximum amount of light is defined as a linear maximum output signal Imax. At this time, the dynamic range of the photoelectric conversion element is Imax. When no light amount-adjusting unit is provided, the maximum output Jmax of the photoelectric conversion element is set to be a value which is considerably smaller than the linear maximum output Imax in order to leave a margin.

In FIG. 12A, the curve 411, which is expressed by a stairs-shaped waveform, represents an output signal I corresponding to an image of a measuring mark comprising a transmission pattern composed of five basic marks. In the case of this transmission pattern, the minimum output signal Jmin outputted from the photoelectric conversion element is approximately zero because the circumference of the pattern is a shielding zone. The width of one of the stairs of the curve 411, for example, the width of a stair indicated by a signal width IA corresponds to an amount of signal from one basic mark. Therefore, in the case of the edge scan type, the signal width IA, which corresponds to one pattern (one mark) with respect to the dynamic range of the photoelectric conversion element, is smaller than that of the conventional slit sensor or the like shown in FIG. 16. Signal processing is performed after the output signal of the photoelectric conversion element is finally converted into a digital amount. Accordingly, when the amount of signal is small, the resolving power for the signal is lowered. Therefore, the SN ratio is lowered considering electric noise exerted on the photoelectric conversion element, resulting in an inconvenience that measurement cannot be performed with a sufficient degree of accuracy.

Especially, in order to obtain a high resolving power, recent projection exposure apparatuses include a mechanism comprising various types of diaphragms inserted into an illuminating optical system to change the illumination condition on the reticle. Such a diaphragm greatly changes the illuminance of the illuminating light beam, resulting in a situation in which the amount of signal per one pattern is further decreased with respect to the dynamic range of the photoelectric conversion element. Recently, in order to increase the resolving power, projection exposure apparatuses have been developed, which use a laser beam having a short wavelength for exposure, for example, a KrF excimer laser beam having a wavelength of 245 nm and an ArF excimer laser beam having a wavelength of 193 nm. However, there is no photoelectric conversion element having a sufficient dynamic range because light sources of such laser beams have short wavelengths and they are pulse light sources. Accordingly, an appropriate countermeasure is desired.

Next, a procedure will be explained, in which a signal is obtained by using a sensor of the edge scan type while using a measuring mark as a measurement objective comprising a shielding pattern in which a light beam comes into its circumference and its pattern section is shielded from light. FIGS. 12C and 12E show positional relationships between the fiducial plate 401 and images of measuring marks when each of shielding patterns comprises three basic marks or one basic mark. FIGS. 12B and 12D show signal waveforms on the photoelectric conversion element, obtained by using the shielding patterns. In FIGS. 12B and 12D, the axis of abscissa indicates the position x of the aperture 402 in the scanning direction, and the axis of ordinate indicates the output signal I of the photoelectric conversion element 403.

In FIG. 12C, the fiducial plate 401 is moved in the measuring direction indicated by an arrow, across an image 409 of a shielding pattern as the measurement objective comprising three basic marks. Thus the output signal I changes as represented by a curve 412 shown in FIG. 12B. As expressed by the curve 412, when the ratio of a shielding section to a transmitting section of the pattern is 1:1, the minimum output signal Jmin concerning an effective region IY of the output signal I has a magnitude which is approximately ½ of the maximum output signal Jmax, and the maximum output signal Jmax is considerably smaller than the linear maximum signal Imax (dynamic range) of the photoelectric conversion element. Accordingly, a considerable part of the dynamic range of the photoelectric conversion element 403 is an ineffective region ID. Therefore, the amount of signal per one pattern with respect to the dynamic range of the photoelectric conversion element 403 has a considerably small value even under the best condition.

On the other hand, as illustrated by an image 410 of a measuring mark shown in FIG. 12E, when a shielding pattern comprising only one basic mark (lonely line) is used, the aperture 402 is sufficiently wider in the measuring direction than the image 410 of the measuring mark. Accordingly, the output signal I changes only a little as illustrated by a curve 413 in FIG. 12D. The minimum output signal Jmin concerning an effective region IY of the output signal I has a further large value. The spacing distance between the maximum output signal Jmax and the minimum output signal Jmin becomes narrower. Therefore, almost all region of the dynamic range of the photoelectric conversion element 403 is an ineffective region ID, resulting in an inconvenience that only a minute part of the dynamic range can be utilized. Thus in the following embodiment, the dynamic range of the photoelectric conversion element is effectively utilized by providing a light amount-adjusting unit for adjusting an amount of light coming into the photoelectric conversion element.

Figure 13:
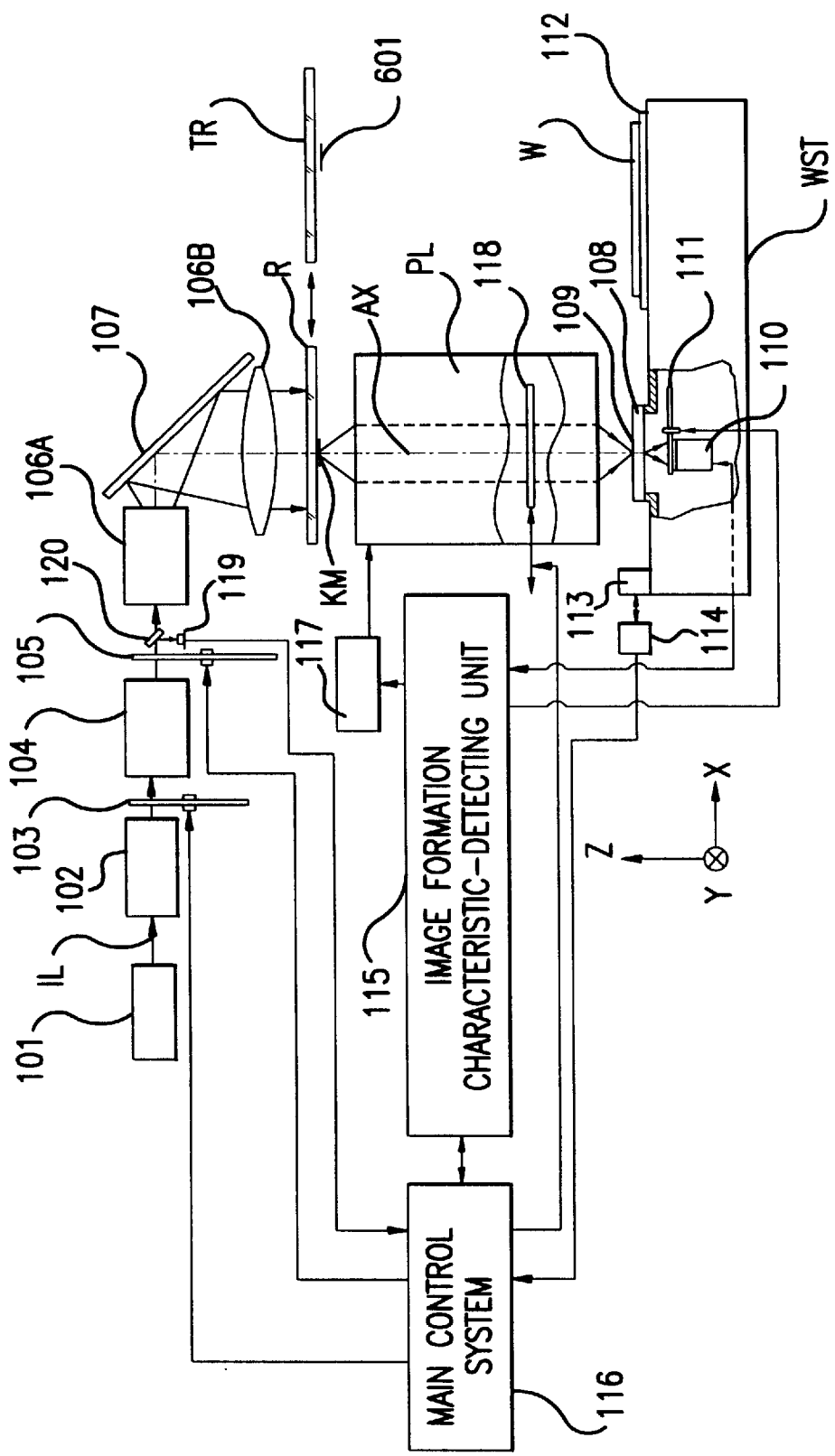
FIG. 13 shows a schematic arrangement of a projection exposure apparatus according to the fourth embodiment of the present invention.

An example of the embodiment of the present invention will be explained below with reference to FIGS. 13 to 15. In this embodiment, the present invention is applied to a projection exposure apparatus of the stepper type for collectively exposing each of shot areas on a wafer with a pattern on a reticle through a projection optical system. FIG. 13 shows a schematic arrangement of the projection exposure apparatus of this embodiment with partial cross section. In FIG. 13, an illuminating light beam IL radiated from an illuminating light source 101 comes into an illuminating light beam-shaping optical system 102 for adjusting a beam diameter of the illuminating light beam. Those usable as the illuminating light beam IL include, for example, i-ray and g-ray as a bright line of an ultra-high voltage mercury lamp, excimer laser beams such as a KrF excimer laser beam and an ArF excimer laser beam, and higher harmonic waves such as a copper vapor laser and a YAG laser. This embodiment is especially effective, for example, when a light source of an excimer laser having a shorter wavelength is used as the light source 101.

The illuminating light beam IL passes through the illuminating light beam-shaping optical system 102, and then it comes into a variable ND filter 103. The variable ND filter 103 is a mechanism comprising a plurality of ND filters having variously different transmittances arranged on a rotatable plate, with which the transmittance for the illuminating light beam IL can be switched at a plurality of levels. The variable ND filter is generally used to control the amount of exposure during exposure. However, in this embodiment, the variable ND filter is also used to control the amount of light coming into the photoelectric conversion element 110 during measurement of image formation characteristics of the projection optical system PL as described later on. The angle of rotation of the rotatable plate of the variable ND filter 103 is controlled by a main control system 116. The illuminating light beam IL having passed through the variable ND filter 103 passes through an illuminance distribution-unformalizing optical system 104 comprising a fly's eye lens and other components, and it comes into a variable diaphragm 105. In order to increase the resolving power, the variable diaphragm 105 includes a system capable of, for example, zonal illumination or modified illumination (oblique illumination). The variable diaphragm 105 comprises, for example, an ordinary circular diaphragm, a circular diaphragm having a small diameter, a zonal diaphragm, and a diaphragm for a modified light source comprising a plurality of apertures eccentric to an optical axis, arranged on a rotatable plate. The illumination condition can be switched by the main control system 116 by controlling the angle of rotation of the rotatable plate of the variable diaphragm 105.

NA (numerical aperture) of the illuminating system can be also changed by using the variable diaphragm 105. The illumination condition is changed by the variable diaphragm 105, while the illuminance is also changed because a part of the illuminating light beam IL is intercepted. A part of the illuminating light beam IL having passed through the variable diaphragm 105 is reflected by a beam splitter 120 having a small reflectance and a large transmittance. The part of the illuminating light beam comes into an integrator sensor 119 comprising a photoelectric conversion element. The integrator sensor 119 measures the illuminance of the illuminating light beam IL from the light source 101, which is generally used to control the amount of exposure during exposure as well. However, in this embodiment, the integrator sensor 119 is also used when the image formation characteristics of the projection optical system PL are measured as described later on.

On the other hand, the illuminating light beam IL having transmitted through the beam splitter 120 passes through a relay lens system 106A comprising, for example, a relay lens and a variable field diaphragm (reticle blind). The illuminating light beam IL is reflected downwardly by a dichroic mirror 107, and then it passes through a condenser lens 106B. Thus the reticle R, on which a circuit pattern is depicted, is illuminated with the illuminating light beam IL with uniform illuminance distribution. Under the illuminating light beam IL, the pattern on the reticle R is reduced into, for example, ⅕, and projected through the projection optical system PL onto each of shot areas on the wafer W to which a photoresist is applied. In this embodiment, the reticle R is a reticle for evaluation, on which a mark for evaluation is formed in place of the circuit pattern. In FIG. 13, image formation is not made on the wafer W for convenience sake of explanation. A pupil filter 118, which is attachable and detachable under the control of the main control system 116 by the aid of an unillustrated driving system, is inserted at a pupil plane (Fourier transform plane with respect to the reticle R) of the projection optical system PL. The pupil filter 118 is based on one of recently developed high-resolution techniques. The pupil filter 118 intercepts a part of the illuminating light beam IL passing through the pupil plane. The illuminance on the wafer W also undergoes change by the pupil filter 118. Explanation will be made below, wherein the Z axis is defined in parallel to an optical axis AX of the projection optical system PL, the X axis is defined in parallel to the plane of paper in FIG. 13, on a plane perpendicular to the optical axis AX, and the Y axis is defined perpendicularly to the plane of paper in FIG. 13, on the plane perpendicular to the optical axis AX.

The reticle R is held on an unillustrated reticle stage which is movable in the X and Y directions. The position of the reticle stage is precisely measured by an unillustrated interferometer. The position of the reticle stage is controlled on the basis of a measured value obtained by the interferometer. A plurality of measuring marks KM, which are measurement objectives, are formed on the reticle R. When it is required to perform more precise measurement of image formation characteristics, a reticle TR including improved measuring marks is used in place of the reticle R. In this embodiment, the reticle TR is used as a mask for evaluation when a shielding pattern is used as a measuring mark as described later on.

The wafer W is vacuum-attracted on a wafer holder 112 on a wafer stage WST. The wafer stage WST is movable in the X and Y directions perpendicular to the optical axis AX of the projection optical system PL. Thus exposure is performed in accordance with the so-called step-and-repeat system. The wafer stage WST is also finely movable in the direction (Z direction) parallel to the optical axis AX. The wafer stage WST is driven so that the image plane of the projection optical system PL is always coincident with the surface of the wafer W on the basis of the position of the surface of the wafer W in the Z direction.

Accordingly, the apparatus of this embodiment is provided with an unillustrated focal position-detecting system based on the oblique incidence system comprising a light-feeding optical system and a light-receiving optical system for detecting the position of the wafer W in the Z direction. The focal position-detecting system is used to detect a deviation of inclination angle and a position of the surface of the wafer W in the Z direction with respect to the image formation plane of the projection optical system PL, and drive the wafer stage WST in order to maintain a state in which the surface of the wafer W is coincident with the image formation plane of the projection optical system PL. Usually, a focus signal is subjected to calibration so that the image formation plane is a zero point reference. Autofocusing and autoleveling are performed so that a focus signal from the light-receiving optical system is zero.

A movement mirror 113 is secured to an end of the wafer stage WST. The positions of the wafer stage in the X and Y directions are measured highly accurately with a resolving power of, for example, about 0.01 $\mu$m by using an external interferometer 114 and the movement mirror 113. The position of the wafer stage WST is also measured accurately by the interferometer 114 when the image formation characteristics are measured by using an edge scan type sensor. Thus an accurate position of image formation is determined for an image of the measuring mark KM on the reticle R. The position of a fiducial plate 108 in the Z direction is detected by using the focal position-detecting system described above. Thus the focal position of the image formation plane, and aberration components in the Z direction such as field curvature can be also accurately measured.

The projection exposure apparatus of this embodiment is installed with the edge scan type sensor for measuring image formation characteristics of the projection optical system PL. FIG. 13 shows a state in which the edge scan type sensor is moved to a central position of an exposure field of the projection optical system PL to perform measurement of image formation characteristics. The edge scan type sensor has been already explained, which will be briefly explained below. When the image formation characteristics are measured, the measuring mark KM formed on the reticle R is illuminated with the illuminating light beam IL. An image of the measuring mark KM is formed through the projection optical system PL on an aperture 109 of the fiducial plate 108 secured on the wafer stage WST. The aperture 109 is a substantially square aperture pattern provided in a shielding zone. The width of the aperture 109 in the measuring direction (X direction) is set to be wider than a width of a projected image in the measuring direction on the wafer stage WST, the projected image being formed from one or a plurality of patterns (transmitting section or sections in the case of transmission pattern, or shielding section or sections in the case of shielding pattern) as the measurement objective included in the measuring mark KM. The light beam for image formation on the aperture 109 passes through a variable ND filter 111 provided just under the aperture 109, and it comes into a photoelectric conversion element 110. A signal corresponding to an amount of incident light is outputted from the photoelectric conversion element 110. in this embodiment, the fiducial plate 108 corresponds to the fiducial plate 401 in FIG. 11. The aperture 109 corresponds to the aperture 402 in FIG. 11, and the photoelectric conversion element 110 corresponds to the photoelectric conversion element 403 in FIG. 11. The fiducial plate 108 is made of, for example, quartz glass, and the aperture 109 is an aperture pattern surrounded by a metal film vapor-deposited on the fiducial plate 108. The photoelectric conversion element 110 is, for example, a photodiode or a photomultiplier.

A preamplifier having a variable amplification factor is incorporated in the photoelectric conversion element 110. The sensitivity of the output signal from the photoelectric conversion element 110 (the output signal hereinafter means a signal amplified by the preamplifier), that is a variation amount of the output signal with respect to one unit of amount of incident light, can be adjusted by controlling the amplification factor of the preamplifier by means of an image formation characteristic-detecting unit 115 (image formation characteristic-calculating unit). The linear maximum amount of light, which is an upper limit value of the amount of incident light in a measurable region where the amount of incident light is proportional to the output signal, changes depending on the change in sensitivity adjusted as described above. Thus the position of the image of the mark for evaluation is measured in accordance with the edge scan system.

The variable ND filter 111, which is specifically installed in this embodiment, is arranged in the same manner as the variable ND filter 103 provided downstream from the illuminating light beam-shaping optical system 102 described above. The variable ND filter 111 comprises a plurality of ND filters having gradually varied transmittance arranged on a rotatable plate. The amount of light coming into the photoelectric conversion element 110 is adjusted by controlling the angle of rotation of the rotatable plate. In this procedure, the amount of incident light is adjusted by the image formation characteristic-detecting unit 115 (image formation characteristic-calculating unit) by controlling the angle of rotation of the rotatable plate of the variable ND filter 111 depending on the linear maximum output signal of the photoelectric conversion element 110. A signal outputted from the photoelectric conversion element 110 is supplied to the image formation characteristic-detecting unit 115. The image formation characteristic-detecting unit 115 determines the position of the image of the mark for evaluation, on the basis of the supplied signal. The image formation characteristics of the projected image formed by the projection optical system PL are calculated on the basis of the determined position. The result of calculation by the image formation characteristic-detecting system 115 is supplied to the main control system 116. The main control unit 116 corrects the image formation characteristics of the projection optical system PL on the basis of the supplied result by the aid of the image formation characteristic-detecting unit 115 and an image formation characteristic-correcting unit 117.

Thus the main control system 116 supplies, to the image formation characteristic-detecting unit 115, information necessary to calculate the image formation characteristics, including, for example, outputs of the interferometer 114 and the unillustrated focal position-detecting system. The main control system 116 sets the transmittance of the variable ND filter 103, and it sets the transmittance of the variable ND filter 111 by the aid of the image formation characteristic-detecting unit 115. Information on the image formation characteristics detected by the image formation characteristic-detecting unit 115 is also supplied to the image formation characteristic-correcting unit 117. When a correction command is given by the main control system 116, the image formation characteristic-correcting unit 117 corrects an amount of discrepancy in image formation characteristic from a designed value on the basis of the aforementioned information so that the image formation characteristics of the projection optical system PL are always maintained well.

In this embodiment, the image formation characteristics are corrected by the aid of a correcting mechanism provided inside the projection optical system PL. Although not shown in FIG. 13, specifically, the image formation characteristics are changed in accordance with several methods in which, for example, a part of lens elements for constituting the projection optical system PL is driven in the direction of the optical axis AX, inclined, shifted in a direction perpendicular to the optical axis AX, or rotated about the optical axis AX as the center. Thus correction is made so that the amount of discrepancy in image formation characteristic is counteracted. In addition, the discrepancy of the image plane in the Z direction (defocus) can be corrected by giving an offset to a focus signal of the focal position-detecting system, and driving the wafer stage WST in the Z direction.

Next, explanation will be made for an example of the operation for measuring the position of the image of the mark for evaluation by using the projection exposure apparatus according to this embodiment. As described above, the amount of light coming into the photoelectric conversion element 110 is determined depending on the change in illuminance caused by, for example, the light-emitting power of the light source 101, the diaphragm selected by the variable diaphragm 105, the type of the measuring mark KM on the reticle R, and the pupil filter 118. Therefore, if the variation amount or the state of the illuminance is known, the amount of light coming into the photoelectric conversion element 110 is calculated. In order to determine the amount of incident light more accurately, the following procedure may be adopted. Namely, for example, the sensitivity of the photoelectric conversion element 110 is set to be a standard value, the transmittances of the variable ND filters 103, 111 are set to be approximately 100%, and the illuminating light beam is received by the photoelectric conversion element 110 through the transmitting section on the reticle R. When the output signal of the photoelectric conversion element 110 exceeds the linear maximum output signal Imax, the transmittance of the variable ND filter 111 (and the transmittance of the variable ND filter 103, if necessary) is gradually decreased. Thus the amount of incident light is calculated on the basis of the output signal of the photoelectric conversion element 110, the transmittances of the variable ND filters 103, 111, and the type of the measuring mark. When the amount of incident light is accurately determined as described above, the dimming mechanisms such as the variable ND filters 103, 111, and the sensitivity of the photoelectric conversion element 110 are adjusted so that an optimum amount of incident light is obtained. Adjustment for all of the three components is not necessarily indispensable. Adjustment for any one of them may be sufficient provided that necessary adjustment for the amount of light is possible. The method for controlling the amount of light is not limited to the methods for adjusting the foregoing three components. For example, a liquid crystal element or a chopper (shutter for high-speed shielding) may be used in place of the variable ND filter. A specific embodiment of a method for calculating the amount of incident light will be explained below.

At first, the change in illuminance caused by the light source 101 and the variable diaphragm 105 can be measured by using the integrator sensor 119. In this process, the light source 101 may be energized immediately before measurement for the image formation characteristics. Alternatively, a measured value of illuminance immediately before measurement may be stored. Next, it is checked whether or not the pupil filter 118 is inserted. The state of arrangement of the pupil filter 118 is stored in the main control system 116. Accordingly, the check may be performed by reading data from its memory. Subsequently, the type of the measuring mark KM on the reticle R as the measurement objective may be previously inputted by an operator. However, this procedure requires information such as line width, number of lines, and distinction between transmission pattern and shielding pattern. According to the information as described above, it is possible to calculate an areal size of the light-transmitting section of the measuring mark, and it is possible to determine an amount of light passing through the reticle R. The operation described above makes it possible to determine an amount of incident light coming into the photoelectric conversion element 110 when the light beam is not dimmed by the variable ND filters 103, As described above, the photoelectric conversion element 110 has a measurable region in which the amount of incident light is proportional to the output signal. If the amount of incident light exceeds a certain amount of light, the output signal is saturated, and the amount of incident light cannot be measured correctly. Namely, the dynamic range of the photoelectric conversion element 110 is most effectively used when the maximum value of the effective component of the amount of incident light upon measurement is the linear maximum amount of light which is the upper limit of the measurable region. In this embodiment, the variable ND filters 103, 111 as the dimming mechanisms are adjusted so that measurement may be performed under a condition near to the most effective condition. Namely, the relationship between the amount of incident light and adjustment values concerning the dimming mechanisms is previously stored in the memory in the main control system 116 to automatically make adjustment for the dimming mechanisms depending on the change in amount of incident light.

For this purpose, at first, the transmittances of the variable ND filters 103, 111 are set to be 100% under a condition in which the amount of incident light is minimum, while the amplification factor of the preamplifier is adjusted to set the output signal of the photoelectric conversion element 110 to be the linear maximum output signal so that the sensitivity of the photoelectric conversion element 110 is set to be maximum. Instead of the adjustment for the amplification factor of the preamplifier, for example, a fixed ND filter may be placed in front of the photoelectric conversion element 110, and its transmittance may be adjusted. The condition, under which the amount of incident light is minimum, lies in, for example, a state in which the output of the light source 101 declines, a diaphragm having the lowest transmittance (for example, a diaphragm having the minimum numerical aperture) is selected by the variable diaphragm 105, a transmission pattern comprising one line having the thinnest line width is used as the measuring mark on the reticle R, and the pupil filter 118 is inserted.

As described above, adjustment is made beforehand so that the amount of incident light is minimized. Under conditions of increasing amount of incident light, the light beam is gradually dimmed by using, for example, the variable ND filters 103, 111. The dimming mechanisms are previously adjusted under a possible dimming condition so that the amount of incident light is included in the measurable region of the photoelectric conversion element 110 when the amount of incident light is maximized. The condition, under which the amount of incident light is maximum, lies in, for example, a state in which the output of the light source 101 is maximum (for example, immediately after exchange of the light source), a diaphragm having the highest transmittance (for example, a diaphragm having the maximum numerical aperture) is selected by the variable diaphragm 105, the measuring mark on the reticle R is a shielding pattern comprising one line, and the pupil filter 118 is not inserted. According to the method described above, the adjustment values are determined for the dimming mechanisms with respect to the maximum amount of incident light.

The transmittances of the variable ND filters 103, 111 are set on the basis of the adjustment values. Accordingly, for example, when the measuring mark KM comprises five transmission patterns, a signal similar to the curve 411 shown in FIG. 12A is obtained as the output signal I of the photoelectric conversion element 110. However, in this embodiment, the maximum output signal Jmax of the output signal I is approximately equal to the linear maximum output signal Imax which is the maximum value in the measurable region in which the amount of incident light is proportional to the signal I. Therefore, the signal width IA per one pattern is considerably large as compared with those obtained by the conventional technique. Thus the position is detected at a high SN ratio with a high degree of accuracy.

In the same manner as described above, for example, when the measuring mark KM comprises three shielding patterns, a signal similar to the curve 412 shown in FIG. 12B is obtained as the output signal I of the photoelectric conversion element 110. Also in this case, however, the maximum output signal Jmax of the output signal I is approximately equal to the linear maximum output signal Imax, and the ratio of the effective region IY to the dynamic range (Imax) is increased. Thus position is detected with a high degree of accuracy.

In this procedure, no problem arises if the dimming ratio obtained by the dimming mechanism continuously changes. However, in the case of the discontinuous mechanism such as the variable ND filter 103, its resolving power is important. Namely, if the resolving power is coarse, it is impossible to effectively use the dynamic range of the photoelectric conversion element 110 depending on conditions, and it is impossible to obtain a detection accuracy necessary to measure the image formation characteristics. Accordingly, it is desirable that the variable ND filter 103 is designed so that necessary types of ND filters may be installed to provide a state in which the dimming ratio changes approximately continuously. For example, the step of variation for the dimming ratio can be finely established by using a double-adjustment revolver comprising a variable ND filter of the revolver system for coarse adjustment and a variable ND filter of the revolver system for fine adjustment.

As described above, according to the method of this embodiment, the most appropriate amount of light with respect to the dynamic range of the photoelectric conversion element 110 to be used is supplied by controlling the dimming mechanisms such as the variable ND filter 103 and the variable ND filter 111. Accordingly, the image formation characteristics can be measured highly accurately even when the amount of light changes due to variation of the light source and various types of the diaphragms. Moreover, the amount of discrepancy in image formation characteristic from a designed value is corrected, for example, by the aid of the image formation characteristic-correcting unit 117 on the basis of the result of measurement for the image formation characteristics. Thus the image formation characteristics can be maintained in a desired state with a high degree of accuracy.

Figure 14A:
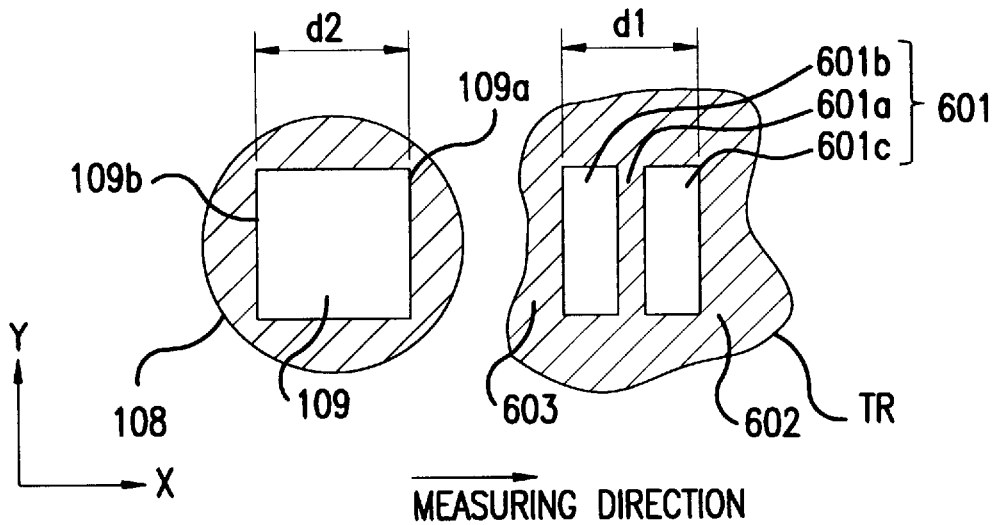
FIG. 14A shows an enlarged plan view illustrating a relationship between an image of a measuring mark and an aperture in the projection exposure apparatus according to the fourth embodiment of the present invention.
Figure 14B:
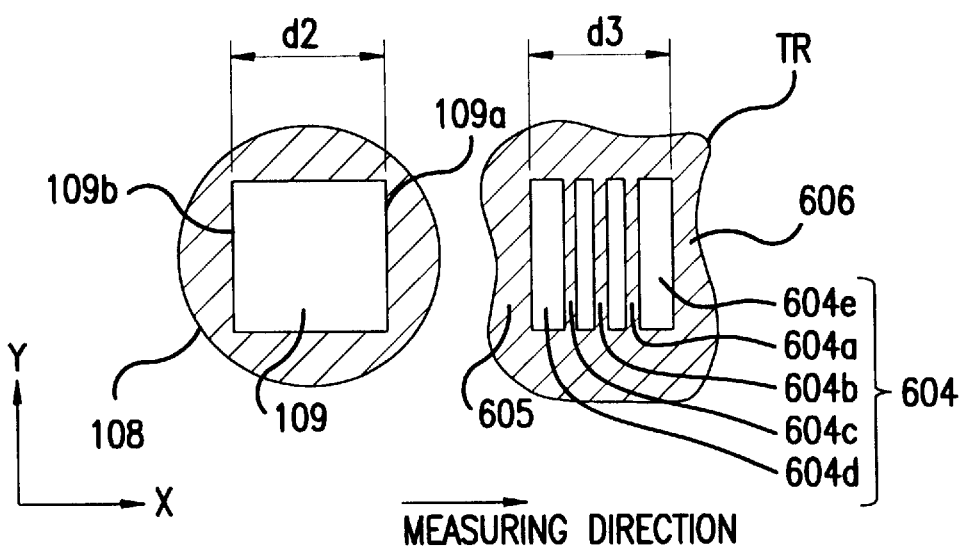
FIG. 14B shows an enlarged plan view illustrating a relationship between an image of another measuring mark and the aperture in the projection exposure apparatus according to the fourth embodiment of the present invention.

Next, another embodiment of the present invention will be explained with reference to FIGS. 14A and 14B and FIGS. 15A to 15D. This embodiment concerns a method which is effective when a shielding pattern is used as the measuring mark. When the measuring mark is a shielding pattern, the SN ratio of a detected signal can be considerably improved even in accordance with the method based on the embodiment shown in FIG. 13. However, the problem remains unsolved on the phenomenon that a region remains in which the dynamic range of the photoelectric conversion element cannot be effectively used. In this embodiment, the ineffective region in the dynamic range of the photoelectric conversion element is decreased to be as small as possible by using a shielding pattern having a new pattern form. An example of the new shielding pattern will be explained below. However, for convenience sake of explanation, FIGS. 14A and 14B show states in which a measuring mark comprising a shielding pattern is projected onto a fiducial plate. A measuring mark 601 of this embodiment is formed on the reticle TR for evaluation shown in FIG. 13. However, a projected image of the measuring mark, formed on the fiducial plate 108, and the measuring mark on the reticle TR are represented by the same reference numeral.

Figure 15A:
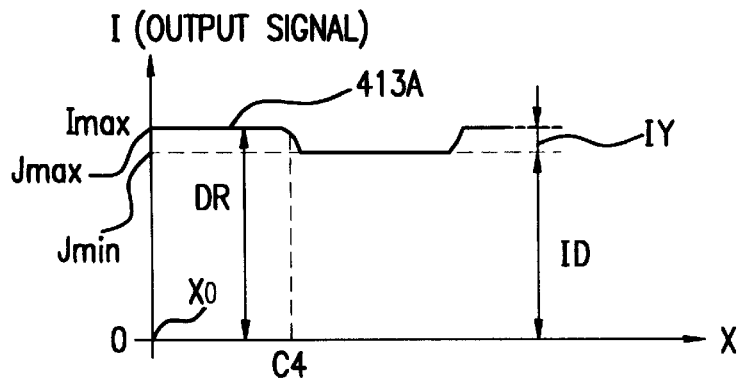
FIG. 15A shows a signal waveform from the photoelectric conversion element in the case of the use of a measuring mark comprising one shielding type basic mark having no shielding zone as shown in FIG. 12E.
Figure 15B:
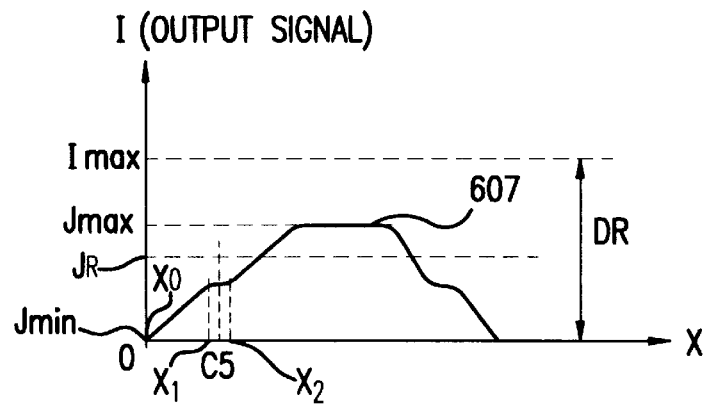
FIG. 15B shows an output signal I of the photoelectric conversion element in the case of the use of the measuring mark 601 of the embodiment shown in FIG. 14A as a measuring mark.
Figure 15C:
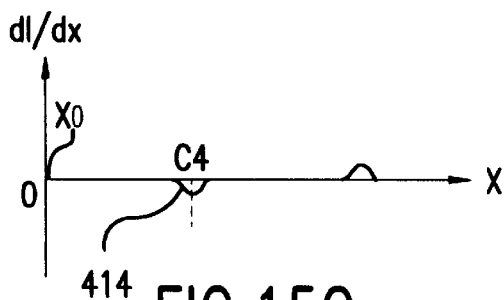
FIG. 15C shows a signal dI/dx obtained by differentiating the curve 413A shown in FIG. 15A with respect to the position x.
Figure 15D:
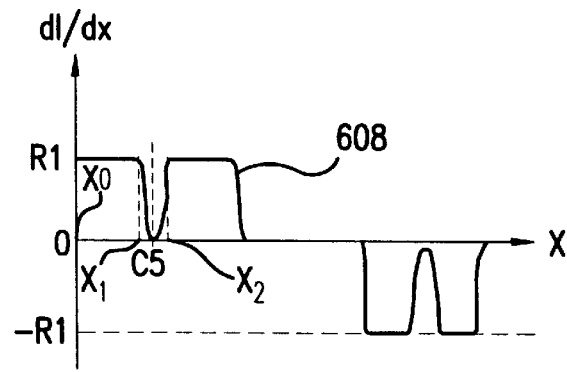
FIG. 15D shows a signal dI/dx obtained by differentiating the curve 607 shown in FIG. 15B with respect to the position x.

FIG. 14A shows a plan view of an exemplary projected image of a shielding pattern used in this embodiment. As shown in FIG. 14A, the measuring mark 601 comprises one shielding type basic mark 601a extending in the non-measuring direction, and two rectangular transmission zones 601b, 601c located on both sides of the basic mark 601a. Shielding zones 602, 603 are provided on both sides of the measuring mark 601 in the measuring direction (X direction). In this arrangement, the width of the measuring mark 601 in the measuring direction is regarded as a spacing distance d1 between the shielding zones 602, 603. An aperture 109 is formed so that a relationship of d1<d2 holds between the width d1 and a width d2 of the aperture 109 of the fiducial plate 108 in the measuring direction. However, it is necessary to make the spacing distance d1 between the shielding zones to be sufficiently large within a range to satisfy the condition so that images of the shielding zones 602, 603 do not overlap an image of the basic mark 601a. Accordingly, the illuminating light beam IL corresponding to unnecessary portions is intercepted, and thus the effective range of the dynamic range of the photoelectric conversion element 110 is enlarged. This fact will be explained with reference to FIGS. 15A–D based on output waveforms of the photoelectric conversion element 110. In FIGS. 15A and 15C described below, the axis of abscissa indicates the position x of the aperture 109 in the measuring direction, and the axis of ordinate indicates the output signal I of the photoelectric conversion element 110. In FIGS. 15B and 15D, the axis of abscissa indicates the position x in the measuring direction, and the axis of ordinate indicates the signal dI/dx obtained by differentiating the output signal I with respect to the position x. The start position of measurement is represented by the position x0 in FIGS. 15A to 15D.

A curve 413A shown in FIG. 15A represents a signal waveform of the photoelectric conversion element 110 of this embodiment in the case of the use of a measuring mark comprising one shielding type basic mark having no shielding zone as shown in FIG. 12E. When the relationship of d1<d2 does not hold between the spacing distance d1 between the shielding zones and the width d2 of the aperture in the measuring direction as in FIG. 15A, it is impossible to expect the effect of improvement in SN ratio, which would be otherwise obtained by the shielding zones as described above. However, even in the case of the use of such a shielding pattern, the ratio of the effective region IY to the dynamic range DR is increased by setting the maximum output signal Jmax measured by the photoelectric conversion element 110 to be a value which is approximately the same as the linear maximum output signal Imax of the photoelectric conversion element 110. On the contrary, the width in the measuring direction of the aperture 109 of the fiducial plate 108 shown in FIG. 14A is wider than the width in the measuring direction of the basic mark 601a as the shielding pattern. Accordingly, a state is provided, in which an amount of light transmitted through the circumference of the pattern always comes into the photoelectric conversion element 110. Therefore, the minimum output signal Jmin has a value which is near to the maximum output signal Jmax, resulting in a considerably large ratio of the ineffective region ID of the signal with respect to the dynamic range DR of the photoelectric conversion element 110.

FIG. 15C illustrates a signal dI/dx obtained by differentiating the curve 413A in FIG. 15A with respect to the position x. As indicated by a curve 414 shown in FIG. 15C, the waveform is also small because the change of the original signal is small. The measurement accuracy for the central position C4 of the measuring mark is sometimes insufficient. On the contrary, in the case of the use of the shielding pattern of this embodiment comprising the shielding zones provided on both sides of the measuring mark in the measuring direction, the dynamic range DR of the photoelectric conversion element 10 is effectively utilized.

FIG. 15B shows an output signal I of the photoelectric conversion element 110 when the measuring mark 601 in FIG. 14A of this embodiment is used as the measuring mark. As illustrated in a curve 607 shown in FIG. 15B, as the transmission zone 601b shown in FIG. 14A comes inwardly across the edge 90a of the aperture 90 of the fiducial plate 80, the output signal I linearly increases from the minimum output signal Jmin having its value of approximately zero. The increase in the output signal I once stops at a position x1 at which the basic mark 601a approaches the edge 90a. The output signal I increases again from a position x2 at which the entire basic mark 601a enters the inside of the edge 90a, as the transmission zone 601c comes inwardly across the edge 90a of the aperture 90 of the fiducial plate 80. The output signal I becomes the maximum output signal Jmax at a point of time at which the entire transmission zone 601c is accommodated in the aperture 90. The output signal I exhibits the constant maximum output value Jmax during a period in which the entire transmission zones 601b, 601c overlap the aperture 90. An opposite waveform is obtained when the transmission zone 601b goes out of the opposite edge 90b.

As described above with reference to FIG. 14A, when the condition of d1<d2 holds between the width d1 of the measuring mark 601 in the measuring direction and the width d2 in the measuring direction of the aperture 90 of the basic mark member 80, the maximum output signal Jmax of the curve 607 is smaller than the maximum output signal Jmax with no shielding zone as shown in FIG. 15A, by an amount corresponding to the existence of the shielding zones 602, 603. In this situation, the shielding type basic mark 601a provides the same variation amount of the output signal I. Accordingly, the ratio of effective components in the output signal I with respect to the maximum output signal Jmax is increased. Further, this embodiment is provided with the dimming mechanisms comprising the variable ND filter 103 and the variable ND filter 111 for controlling the amount of light coming into the photoelectric conversion element 110. Therefore, the maximum amount of light Jmax can be made to be a value near to the linear maximum output signal Imax of the photoelectric conversion element 110 by decreasing the dimming ratio by using the dimming mechanisms. The minimum output signal Jmin is approximately zero because the shielding zones 602, 603 are provided. Accordingly, it is possible to increase the ratio of signal components corresponding to the basic mark 601a with respect to the dynamic range DR. Further, as shown in the curve 607, the output signal I is clarified in the region in which the amount of light changes, i.e., in the interval between the positions x1 and x2 at which the output signal I changes. The central position C5 of the measuring mark 601 is calculated in accordance with a method described later on. Accordingly, the output signal JR, which is smaller than the maximum output signal Jmax, is sufficiently used as the maximum value of the output signal I necessary for signal processing. Taking this fact into consideration, the ratio of the components to the dynamic range DR can be further increased, and the detection accuracy can be maximized by further decreasing the dimming ratio so that the output signal JR is increased up to the linear maximum output signal Imax.

A curve 608 shown in FIG. 15D represents a signal dI/dx obtained by differentiating the curve 607 in FIG. 15B with respect to the position x. The curve 608 shown in FIG. 15D has a wavy shape as obtained by adding a certain offset to the curve 414 shown in FIG. 15C, owing to the shielding zones 602, 603 shown in FIG. 14A. However, such an offset is a constant value, and hence no problem occurs in waveform detection. As illustrated by the curve 608, the differential signal dI/dx of the output signal I has the following waveform. Namely, the differential signal dI/dx transits at an approximately constant value R1 from the measurement start point x0 to the position x1 at which the basic mark 601a of the measuring mark 601 approaches the edge 90a of the aperture 90 of the fiducial plate 80 because the overlapping area between the aperture 90 and the transmission zone 601b increases at a constant ratio. The differential signal dI/dx rapidly drops from R1 at the position x1, and it comes to zero at the position C5. After that, the differential signal dI/dx rapidly rises up to R1. The central position C5, at which the differential signal dI/dx is zero, is a position to be determined. The waveform of the differential signal dI/dx at the edge 90b opposing to the edge 90a is a waveform in which the waveform at the edge 90a is reversed upside down and righthand left, having a minimum value of −R1. The variation amount ±R1 of the differential signal dI/dx shown in FIG. 15D of this embodiment is remarkably larger than the variation amount of the differential signal shown in FIG. 15C with no shielding zone. Accordingly, the position is detected with a high degree of accuracy.

Next, a modified embodiment of the embodiment shown in FIG. 14A will be explained with reference to FIG. 14B.

FIG. 14B shows a plan view of an example of a modified shielding pattern used in this embodiment. As shown in FIG. 14B, a measuring mark 604 comprises three shielding type basic marks 604a to 604c extending in the non-measuring direction, and two rectangular transmission zones 604d, 604e provided on both sides thereof. Shielding zones 605, 606 are provided on both sides of the measuring mark 604 in the measuring direction (X direction). In this arrangement, an aperture 109 is formed so that a relationship of d3<d2 holds between the width d3 of the measuring mark 604 in the measuring direction and the width d2 in the measuring direction of the aperture 9 of a fiducial plate 108 shown in FIG. 13. Accordingly, the illuminating light beam IL corresponding to unnecessary portions is intercepted in the same manner as the embodiment shown in FIG. 14A. Therefore, the effective range of the dynamic range of the photoelectric conversion element 110 is enlarged.

As described above, even when the measuring mark is a shielding pattern, the use of the shielding pattern according to this embodiment makes it possible to effectively utilize the dynamic range of the photoelectric conversion element 110, and detect the image formation characteristics of the projection optical system PL with a high degree of accuracy. In the embodiment described above, the shielding zones 602, 603 are provided on both sides of the mark comprising the shielding pattern as shown in FIGS. 14A and 14B, and thus unnecessary illuminating light is eliminated. However, an equivalent effect is also obtained by dimming both sides of the measuring mark KM by using, for example, the variable field diaphragm (reticle blind) included in the relay optical system 106A shown in FIG. 13.

The foregoing embodiment has explained by using only the system based on the use of the edge scan type sensor. However, the method explained with reference to FIG. 13 is also effective when the position is detected in accordance with the conventional slit scan system shown in FIG. 16, or when the position is detected by using the two-dimensional or one-dimensional image pickup element shown in FIG. 18. In the foregoing embodiment, the present invention is applied to the so-called collective type (stepper type) projection exposure apparatus for performing exposure while the reticle R and the wafer W stand still. However, the present invention can be equivalently applied to the scanning exposure type projection exposure apparatus based on, for example, the so-called step-and-scan system for successively exposing each of shot areas on a wafer with a pattern on a reticle by synchronously scanning the reticle and the wafer in a state in which a part of the pattern on the reticle is projected onto the wafer through a projection optical system.

In particular, it is effective to apply the edge scan type sensor described in the fourth embodiment to the scanning type exposure apparatus and the scanning type exposure method described in the third embodiment. Namely, a photoelectric conversion element, which is provided for detecting a spatial image of a mark on a mask, formed through a projection optical system, through an aperture having a width wider than the spatial image in a measuring direction, is used as the photoelectric detector in the third embodiment. An image formation state-computing unit or an image position-computing unit is allowed to compute an image formation state or a position of an image of a mark pattern obtained by synchronous scanning on the basis of a synchronization error detected by a synchronization error detector and images of the mark pattern obtained from detection signals outputted from the photoelectric conversion element by relatively moving the spatial image and the aperture in the measuring direction by the aid of a substrate stage when the mark pattern is located at various positions in the scanning direction in an illumination area. In this procedure, it is effective that the scanning type exposure apparatus concerning the third embodiment comprises a light amount-adjusting unit for adjusting an amount of incident light coming into the photoelectric conversion element in conformity with an effective measuring range of the photoelectric conversion element, as explained in the fourth embodiment.

Further, when the static image formation characteristics are determined in the first to third embodiments, the image formation characteristics can be measured by using the edge scan type sensor while controlling the amount of light, as explained in the fourth embodiment.

As described above, the projection exposure apparatus, the scanning type exposure apparatus, and the scanning type exposure method according to the present invention have been specifically explained in accordance with the embodiments. However, the present invention is not limited thereto. The present invention may have various forms within a range without deviating from the gist of the present invention.

The scanning type exposure apparatuses according to the first and second aspects of the present invention are provided with the mechanism capable of measuring and computing, before actual exposure, information on the image position and image formation characteristics under a dynamic condition of scanning exposure, namely in a state in which the mask stage and the substrate stage are moved. Accordingly, it is possible to previously know discrepancy in image position and errors in image formation characteristics generated by the cause inherent in the scanning type exposure apparatus. Thus the exposure condition can be changed so that the image formation characteristics are corrected. In the scanning exposure methods according to the third and fourth aspects of the present invention, information on the image position and image formation characteristics under a dynamic condition of scanning exposure are measured and computed before actual exposure. Accordingly, it is possible to previously know discrepancy in image position and errors in image formation characteristics generated by the cause inherent in the scanning exposure system. Thus the exposure condition can be changed so that the image formation characteristics are corrected. Information on the image position and image formation characteristics measured under a static condition may be previously corrected on the basis of the discrepancy in image position and the image formation characteristics measured under the dynamic condition. Thus the image formation characteristics upon scanning exposure can be determined more accurately.

The scanning type exposure apparatus according to the sixth aspect of the present invention is provided with the mechanism capable of measuring and computing, before actual exposure, image formation characteristics under a dynamic condition of scanning exposure, namely in a state in which the mask stage and the substrate stage are moved. Accordingly, it is possible to previously know errors in image formation characteristics generated by the cause inherent in the scanning type exposure apparatus. Thus the exposure condition can be changed so that the image formation characteristics are corrected. The scanning type exposure apparatus according to the seventh aspect of the present invention can determine the base line of the wafer alignment system under a dynamic condition of scanning exposure, namely in a state in which the mask stage and the substrate stage are moved. Accordingly, it is possible to previously know errors concerning the base line generated by the cause inherent in the scanning type exposure apparatus. Thus it is possible to realize highly accurate overlay exposure. In the scanning exposure methods according to the eighth and ninth aspects of the present invention, image formation characteristics and the base line of the wafer alignment system under a dynamic condition of scanning exposure are measured and computed. Accordingly, it is possible to previously know errors concerning the image formation characteristics and the base line generated by the cause inherent in the scanning exposure system. Thus the exposure condition and the scanning velocity can be changed so that the image formation characteristics and the base line are corrected.

The scanning type exposure apparatus according to the eleventh aspect of the present invention is provided with the mechanism capable of measuring and computing, before actual exposure, image formation characteristics under a dynamic condition of scanning exposure, namely in a state in which the mask stage and the substrate stage are moved. Accordingly, it is possible to previously predict errors in image formation characteristics generated by the cause inherent in the scanning type exposure apparatus. Thus the exposure condition can be changed so that the image formation characteristics are corrected. The scanning type exposure apparatus according to the twelfth aspect of the present invention can determine the base line of the wafer alignment system on the basis of the image position of a reticle pattern, which may be obtained in actual scanning type exposure. Accordingly, it is possible to realize highly accurate overlay exposure even in the case of the use of the scanning type exposure apparatus. In the scanning type exposure methods according to the fourteenth and fifteenth aspects of the present invention, image formation characteristics and the base line of the wafer alignment system under a dynamic condition of scanning exposure are measured and computed. Accordingly, it is possible to previously know errors concerning the image formation characteristics and the base line generated by the cause inherent in the scanning exposure system. Thus the exposure condition and the scanning velocity can be changed so that the image formation characteristics and the base line are corrected.

Therefore, microdevices such as semiconductor elements and liquid crystal elements can be produced highly efficiently with a much higher degree of accuracy by using the scanning type exposure apparatus and the scanning exposure method according to the present invention.

According to the projection exposure apparatus in accordance with the seventeenth aspect of the present invention, even when the amount of light coming into the photoelectric conversion element changes depending on, for example, the change in illumination condition or the type of a pattern to be measured, the light amount-adjusting unit makes it possible to always effectively use the effective measuring range of the photoelectric conversion element. Thus an advantage is obtained in that image formation characteristics can be measured with a high degree of accuracy. Especially, the present invention is effective when an excimer laser beam such as a KrF excimer laser beam and an ArF excimer laser beam, for which the effective measuring range of the photoelectric conversion element is narrow, is used as the illuminating light beam. When the light amount-adjusting unit is a spatial filter having a variable dimming ratio, for adjusting the amount of incident light coming into the photoelectric conversion element in conformity with the effective measuring range of the photoelectric conversion element irrelevant to any change in illumination condition on a measuring mark, it is possible to reliably control the amount of light by using the spatial filter. When the light amount-adjusting unit is shielding zones provided in front of and at the back of a measuring mark, for adjusting the amount of incident light coming into the photoelectric conversion element in conformity with the effective measuring range of the photoelectric conversion element irrelevant to any change in illumination condition on the measuring mark, it is possible to increase the ratio of a variation amount of light corresponding to the measuring mark with respect to the maximum amount of light, even if the measuring mark is a lonely shielding pattern. Therefore, the SN ratio of the detection signal is improved, the positional detection accuracy is improved, and consequently the measurement accuracy for image formation characteristics are improved.

According to the projection exposure apparatus in accordance with the eighteenth aspect of the present invention, even when a shielding pattern is used, the shielding zones for intercepting the illuminating light beam in the movement direction during measurement make it possible to intercept the illuminating light beam which would otherwise pass through the circumference of the shielding pattern. Accordingly, it is possible to effectively use the effective measuring range of the photoelectric conversion element. Thus an advantage is obtained in that the measurement accuracy for image formation characteristics is improved. The projection exposure apparatus is effective when an excimer laser beam, for which the effective measuring range of the photoelectric conversion element is narrow, is used as the illuminating light beam, in the same manner as the projection exposure apparatus according to the seventeenth aspect of the present invention.

What is claimed is:

1. A scanning type exposure apparatus, provided with a mask stage for scanning a mask across an illumination area on the mask, a projection optical system for projecting an image of a pattern on the mask onto a photosensitive substrate, and a substrate stage for scanning the photosensitive substrate across an exposure area which is conjugate to the illumination area in relation to the projection optical system, comprising:

a photoelectric detector, including a light-receiving section provided on the substrate stage, for photoelectrically detecting an image of a mark pattern on the mask; and a combining system for combining signals outputted from the photoelectric detector during a period in which the light-receiving section is scanned across the exposure area in synchronization with scanning for the mark pattern across the illumination area; wherein a position of the image of the mark pattern is detected on the basis of an output of the combining system.

2. The scanning type exposure apparatus according to claim 1, further comprising an alignment system for illuminating an alignment mark on the photosensitive substrate, receiving a reflected light beam from the alignment mark, and detecting a position or a positional discrepancy thereof, wherein a difference between the detected position of the image of the mark pattern and a light-irradiating position of the alignment system is used as a base line of the alignment system.

3. The scanning type exposure apparatus according to claim 2, further comprising a detector for detecting at least one of a position and an amount of rotation of the image of the pattern on the mask on the basis of positions or positional discrepancies of respective images of a plurality of mark patterns on the mask, wherein a result of detection obtained by the detector is used to perform alignment for the mask and the photosensitive substrate.

4. The scanning type exposure apparatus according to claim 1, further comprising a computing unit for calculating image formation characteristics of the projection optical system on the basis of positions of respective images of a plurality of mark patterns on the mask.

5. The scanning type exposure apparatus according to claim 4, further comprising a correcting system for correcting the image formation characteristics of the projection optical system in accordance with a result of calculation by the computing unit.

6. The scanning type exposure apparatus according to claim 5, wherein the correcting system is a stage controller for controlling scanning velocities or scanning directions of the mask stage and the substrate stage.

7. The scanning type exposure apparatus according to claim 1, wherein the photoelectric detector comprises an image pickup element having its light-receiving surface arranged in a plane substantially conjugate to the light-receiving section, and a magnifying optical system for magnifying the image of the mark pattern and forming an image on the light-receiving surface.

8. A method for producing microdevices by utilizing the scanning type exposure apparatus as defined in claim 1 so as to project an image of a pattern on the mask onto the photosensitive substrate.

9. A scanning type exposure apparatus, provided with a mask stage for scanning a mask across an illumination area on the mask, a projection optical system for projecting an image of a pattern on the mask onto a photosensitive substrate, and a substrate stage for scanning the photosensitive substrate across an exposure area which is conjugate to the illumination area in relation to the projection optical system, comprising:

a photoelectric detector, including a light-receiving section arranged on the substrate stage, for photoelectrically detecting an image of a mark pattern on the mask;

a combining system for combining signals outputted from the photoelectric detector during a period in which the light-receiving section is scanned across the exposure area in synchronization with scanning for the mark pattern across the illumination area; and a computing unit for calculating an image formation state of the image of the mark pattern on the basis of an output of the combining system.

10. The scanning type exposure apparatus according to claim 9, further comprising a correcting system for correcting image formation characteristics of the projection optical system in accordance with a result of calculation by the computing unit.

11. The scanning type exposure apparatus according to claim 10, wherein the correcting system is a stage controller for controlling scanning velocities or scanning directions of the mask stage and the substrate stage.

12. The scanning type exposure apparatus according to claim 9, wherein the photoelectric detector comprises an image pickup element having its light-receiving surface arranged in a plane substantially conjugate to the light-receiving section, and a magnifying optical system for magnifying the image of the mark pattern and forming an image on the light-receiving surface.

13. A method for producing microdevices by utilizing the scanning type exposure apparatus as defined in claim 9 so as to project an image of a pattern on the mask onto the photosensitive substrate.

14. A scanning type exposure method, which includes scanning a mask across an illumination area on the mask while illuminating the mask, and scanning a photosensitive substrate across an exposure area which is conjugate to the illumination area in relation to a projection optical system, in synchronization with the scanning for the mask so that the photosensitive substrate is exposed with a pattern on the mask through the projection optical system, comprising:

scanning a light-receiving section of a photoelectric detector in place of the photosensitive substrate in synchronization with scanning for the mask before the photosensitive substrate is exposed with the pattern on the mask, the photoelectric detector being provided for detecting an image of a mark pattern formed on the mask; and combining signals outputted from the photoelectric detector during the scanning to determine a position of the image of the mark pattern on the mask during the scanning.

15. The scanning type exposure method according to claim 14, further comprising detecting an image of the mark pattern in the exposure area while illuminating the mark pattern on the mask in a state in which the mask is fixed with respect to the illumination area, and correcting information on a detected position of the image of the mark pattern by using the determined position of the image of the mark pattern on the mask during the scanning.

16. The scanning type exposure method according to claim 15, further comprising computing image formation characteristics of the projection optical system on the basis of the corrected information on the position of the image of the mark pattern.

17. A scanning type exposure method, which includes scanning a mask across an illumination area on the mask while illuminating the mask, and scanning a photosensitive substrate across an exposure area which is conjugate to the illumination area in relation to a projection optical system, in synchronization with the scanning for the mask so that the photosensitive substrate is exposed with a pattern on the mask through the projection optical system, comprising:

scanning a light-receiving section of a photoelectric detector in place of the photosensitive substrate in synchronization with scanning for the mask before the photosensitive substrate is exposed with the pattern on the mask, the photoelectric detector being provided for detecting an image of a mark pattern formed on the mask;

combining signals outputted from the photoelectric detector during the scanning to determine the image of the mark pattern on the mask during the scanning; and computing image formation characteristics of the projection optical system on the basis of the obtained image of the mark pattern.

18. A scanning type exposure apparatus, provided with a mask stage for scanning a mask across an illumination area on the mask, a projection optical system for projecting an image of a pattern on the mask onto a photosensitive substrate, and a substrate stage for scanning the photosensitive substrate across an exposure area which is conjugate to the illumination area in relation to the projection optical system, comprising:

a photosensitive object installed on the substrate stage;

a detector for detecting an image of a mark pattern formed on the photosensitive object during a period in which the photosensitive object is scanned across the exposure area in synchronization with scanning for the mark pattern across the illumination area; and an image formation state-computing unit for determining an image formation state of the image of the mark pattern on the basis of a result of detection fed from the detector.

19. The scanning type exposure apparatus according to claim 18, further comprising a correcting system for correcting the image formation state in accordance with a result of computing operation by the image formation state-computing unit.

20. The scanning type exposure apparatus according to claim 19, wherein the correcting system is a stage controller for controlling scanning velocities or scanning directions of the mask stage and the substrate stage.

21. The scanning type exposure apparatus according to claim 18, wherein the detector for detecting the image of the mark pattern formed on the photosensitive object is a positional adjustment mark detector for illuminating a positional adjustment mark formed on the photosensitive substrate, and photoelectrically detecting a light beam coming from the positional adjustment mark.

22. The scanning type exposure apparatus according to claim 18, further comprising an adjusting system for adjusting one of an intensity of an illuminating light beam and a sensitivity of the photosensitive object so that the photosensitive object is uniformly exposed during the period of synchronous scanning for the mark pattern and the photosensitive object.

23. The scanning type exposure apparatus according to claim 18, wherein the photosensitive object is a photosensitive object from which a photosensitized image is erasable.

24. The scanning type exposure apparatus according to claim 23, wherein the photosensitive object is one of a photochromic element and a magneto-optical recording element.

25. A method for producing microdevices by utilizing the scanning type exposure apparatus as defined in claim 18 so as to project an image of a pattern on the mask onto the photosensitive substrate.

26. A scanning type exposure apparatus, provided with a mask stage for scanning a mask across an illumination area on the mask, a projection optical system for projecting an image of a pattern on the mask onto a photosensitive substrate, and a substrate stage for scanning the photosensitive substrate across an exposure area which is conjugate to the illumination area in relation to the projection optical system, comprising:

a photosensitive object installed on the substrate stage;

a detector for detecting an image of a mark pattern formed on the photosensitive object during a period in which the photosensitive object is scanned across the exposure area in synchronization with scanning for the mark pattern across the illumination area; and a positional adjustment mark detector for illuminating a positional adjustment mark formed on the photosensitive substrate, and photoelectrically detecting a light beam coming from the positional adjustment mark; wherein a base line of the positional adjustment mark detector is determined on the basis of a detected position of the image of the mark pattern and a detecting position of the positional adjustment mark detector.

27. The scanning type exposure apparatus according to claim 26, wherein the detector for detecting the image of the mark pattern formed on the photosensitive object is the positional adjustment mark detector for illuminating the positional adjustment mark formed on the photosensitive substrate, and photoelectrically detecting the light beam coming from the positional adjustment mark.

28. The scanning type exposure apparatus according to claim 26, further comprising an adjusting system for adjusting one of an intensity of an illuminating light beam and a sensitivity of the photosensitive object so that the photosensitive object is uniformly exposed during the period of synchronous scanning for the mark pattern and the photosensitive object.

29. The scanning type exposure apparatus according to claim 26, wherein the photosensitive object is a photosensitive object from which a photosensitized image is erasable.

30. The scanning type exposure apparatus according to claim 29, wherein the photosensitive object is one of a photochromic element and a magneto-optical recording element.

31. A method for producing microdevices by utilizing the scanning type exposure apparatus as defined in claim 26 so as to project an image of a pattern on the mask onto the photosensitive substrate.

32. A scanning type exposure method comprising scanning a mask across an illumination area on the mask while illuminating the mask, and scanning a photosensitive substrate across an exposure area which is conjugate to the illumination area in relation to a projection optical system, in synchronization with the scanning for the mask so that the photosensitive substrate is exposed with a pattern on the mask through the projection optical system, the scanning type exposure method comprising:

scanning a photosensitive object in synchronization with scanning for the mask before the photosensitive substrate is exposed with the pattern on the mask;

detecting an image of a mark pattern formed on the photosensitive object during the scanning; and computing an image formation state of an image of the pattern on the mask on the basis of the detected image of the mark pattern.

33. The scanning type exposure method according to claim 32, further comprising correcting the computed image formation state.

34. A scanning type exposure method which includes scanning a mask across an illumination area on the mask while illuminating the mask, and scanning a photosensitive substrate across an exposure area which is conjugate to the illumination area in relation to a projection optical system, in synchronization with the scanning for the mask so that the photosensitive substrate is exposed with a pattern on the mask through the projection optical system, comprising:

scanning a photosensitive object in synchronization with scanning for the mask before the photosensitive substrate is exposed with the pattern on the mask;

detecting an image of a mark pattern formed on the photosensitive object during the scanning; and determining a base line of a positional adjustment mark detector for detecting a positional adjustment mark formed on the photosensitive substrate, on the basis of a detected position of the image of the mark pattern and a detecting position of the detector.

35. The scanning type exposure method according to claim 34, wherein the photosensitive object is one selected from a photochromic element, a magneto-optical recording element, and a photosensitive substrate.

36. A scanning type exposure apparatus, provided with a mask stage for scanning a mask across an illumination area on the mask, a projection optical system for projecting an image of a pattern on the mask onto a photosensitive substrate, and a substrate stage for scanning the photosensitive substrate across an exposure area which is conjugate to the illumination area in relation to the projection optical system, in synchronization with the scanning for the mask, comprising:

a photoelectric detector for photoelectrically detecting, on the substrate stage, an image of a mark pattern on the mask;

a synchronization error detector for detecting a synchronization error caused by the synchronous scanning for the photosensitive substrate and the mask; and an image formation state-computing unit for computing an image formation state of the image of the mark pattern obtained by the synchronous scanning, on the basis of the synchronization error detected by the synchronization error detector and images of the mark pattern corresponding to various positions in a scanning direction detected by the photoelectric detector respectively when the mark pattern is located at the respective various positions in the scanning direction in the illumination area; wherein an image formation state of the image of the pattern on the mask to be obtained by the synchronous scanning for the photosensitive substrate and the mask is predicted from a result of computing operation by the image formation state-computing unit.

37. The scanning type exposure apparatus according to claim 36, further comprising a correcting system for correcting an image formation state in accordance with the predicted image formation state of the image of the pattern on the mask.

38. The scanning type exposure apparatus according to claim 37, wherein the photoelectric detector comprises a light-receiving section having a slit formed thereon, and a sensor for photoelectrically detecting a light beam transmitted through the slit, and the image of the mark pattern is photoelectrically detected by relatively moving the light-receiving section and the image of the mark pattern on the mask in a direction parallel to the scanning direction.

39. The scanning type exposure apparatus according to claim 36, wherein the synchronization error includes a positional discrepancy of each of the stages caused by synchronous movement of the substrate stage and the mask stage, a positional discrepancy of the photosensitive substrate in a Z direction, and a discrepancy in image formation characteristics caused by vibration of the projection optical system.

40. The scanning type exposure apparatus according to claim 36, wherein the photoelectric detector is a photoelectric conversion element for detecting a spatial image of a mark on the mask, formed through the projection optical system, through an aperture having a width wider than the spatial image in a measuring direction, and the image formation state-computing unit computes the image formation state of the image of the mark pattern obtained by the synchronous scanning, on the basis of the synchronization error detected by the synchronization error detector and images of the mark pattern obtained from detection signals outputted from the photoelectric conversion element by relatively moving the spatial image and the aperture in the measuring direction by the aid of the substrate stage when the mark pattern is located at various positions in the scanning direction in the illumination area.

41. The scanning type exposure apparatus according to claim 40, further comprising a light amount-adjusting unit for adjusting an amount of incident light coming into the photoelectric conversion element in conformity with an effective measuring range of the photoelectric conversion element.

42. A method for producing microdevices by utilizing the scanning type exposure apparatus as defined in claim 36 so as to project an image of a pattern on the mask onto the photosensitive substrate.

43. A scanning type exposure apparatus, provided with a mask stage for scanning a mask across an illumination area on the mask, a projection optical system for projecting an image of a pattern on the mask onto a photosensitive substrate, and a substrate stage for scanning the photosensitive substrate across an exposure area which is conjugate to the illumination area in relation to the projection optical system, in synchronization with the scanning for the mask, comprising:

a photoelectric detector for photoelectrically detecting, on the substrate stage, an image of a mark pattern on the mask;

a synchronization error detector for detecting a synchronization error caused by the synchronous scanning for the photosensitive substrate and the mask;

an image position-computing unit for computing a position of the image of the mark pattern on the basis of the synchronization error detected by the synchronization error detector and images of the mark pattern corresponding to various positions in a scanning direction detected by the photoelectric detector respectively when the mark pattern is located at the respective various positions in the scanning direction in the illumination area; and a positional adjustment mark detector for illuminating a positional adjustment mark formed on the photosensitive substrate, and photoelectrically detecting a light beam coming from the positional adjustment mark; wherein a base line of the positional adjustment mark detector is determined on the basis of the computed position of the image of the mark pattern and a detecting position of the positional adjustment mark detector.

44. The scanning type exposure apparatus according to claim 43, wherein the photoelectric detector comprises a light-receiving section having a slit formed thereon, and a sensor for photoelectrically detecting a light beam transmitted through the slit, and the image of the mark pattern is photoelectrically detected by relatively moving the light-receiving section and the image of the mark pattern on the mask in a direction parallel to the scanning direction.

45. The scanning type exposure apparatus according to claim 43, wherein the photoelectric detector is a photoelectric conversion element for detecting a spatial image of the mark pattern on the mask, formed through the projection optical system, through an aperture having a width wider than the spatial image in a measuring direction, and the image position-computing unit computes the position of the image of the mark pattern obtained by the synchronous scanning, on the basis of the synchronization error detected by the synchronization error detector and images of the mark pattern obtained from detection signals outputted from the photoelectric conversion element by relatively moving the spatial image and the aperture in the measuring direction by the aid of the substrate stage when the mark pattern is located at various positions in the scanning direction in the illumination area.

46. The scanning type exposure apparatus according to claim 45, further comprising a light amount-adjusting unit for adjusting an amount of incident light coming into the photoelectric conversion element in conformity with an effective measuring range of the photoelectric conversion element.

47. The scanning type exposure apparatus according to claim 43, wherein the synchronization error includes a positional discrepancy of each of the stages caused by synchronous movement of the substrate stage and the mask stage, a positional discrepancy of the photosensitive substrate in a Z direction, and a discrepancy in image formation characteristics caused by vibration of the projection optical system.

48. A method for producing microdevices by utilizing the scanning type exposure apparatus as defined in claim 43 so as to project an image of a pattern on the mask onto the photosensitive substrate.

49. A scanning type exposure apparatus, provided with a mask stage for scanning a mask across an illumination area on the mask, a projection optical system for projecting an image of a pattern on the mask onto a photosensitive substrate, and a substrate stage for scanning the photosensitive substrate across an exposure area which is conjugate to the illumination area in relation to the projection optical system, in synchronization with the scanning for the mask, comprising:

a detecting system for illuminating a mark pattern established on an object plane or an image plane of the projection optical system, and detecting, on the image plane or the object plane, an image of the mark pattern formed by the projection optical system;

a synchronization error detector for detecting a synchronization error caused by the synchronous scanning for the photosensitive substrate and the mask; and an image formation state-computing unit for computing an image formation state of the image of the mark pattern obtained by the synchronous scanning, on the basis of the synchronization error detected by the synchronization error detector and images of the mark pattern corresponding to various positions in a scanning direction detected by the detecting system respectively when the mark pattern is located at the respective various positions in the scanning direction; wherein an image formation state of the image of the pattern on the mask to be obtained by the synchronous scanning for the photosensitive substrate and the mask is predicted from a result of computing operation by the image formation state-computing unit.

50. The scanning type exposure apparatus according to claim 49, wherein the synchronization error includes a positional discrepancy of each of the stages caused by synchronous movement of the substrate stage and the mask stage, a positional discrepancy of the photosensitive substrate in a Z direction, and a discrepancy in image formation characteristics caused by vibration of the projection optical system.

51. The scanning type exposure apparatus according to claim 49, wherein the detecting system is a photoelectric conversion element for detecting a spatial image of the mark pattern established on the object plane or the image plane, formed through the projection optical system, through an aperture having a width wider than the spatial image in a measuring direction, and the image formation state-computing unit computes the image formation state of the image of the mark pattern obtained by the synchronous scanning, on the basis of the synchronization error detected by the synchronization error detector and images of the mark pattern obtained from detection signals outputted from the photoelectric conversion element by relatively moving the spatial image and the aperture of the photoelectric conversion element in the measuring direction when the mark pattern is located at the various positions in the scanning direction.

52. The scanning type exposure apparatus according to claim 51, further comprising a light amount-adjusting unit for adjusting an amount of incident light coming into the photoelectric conversion element in conformity with an effective measuring range of the photoelectric conversion element.

53. The scanning type exposure apparatus according to claim 52, wherein the light amount-adjusting unit is a spatial filter having a variable dimming ratio, for adjusting the amount of incident light coming into the photoelectric conversion element in conformity with the effective measuring range of the photoelectric conversion element irrelevant to any change in illumination condition on the mark pattern.

54. The scanning type exposure apparatus according to claim 52, wherein the light amount-adjusting unit is shielding zones provided in front of and at the back of the mark, for adjusting the amount of incident light coming into the photoelectric conversion element in conformity with the effective measuring range of the photoelectric conversion element irrelevant to any change in illumination condition on the mark pattern.

55. A method for producing microdevices by utilizing the scanning type exposure apparatus as defined in claim 49 so as to project an image of a pattern on the mask onto the photosensitive substrate.

56. A scanning type exposure method, which includes scanning a mask across an illumination area on the mask while illuminating the mask, and scanning a photosensitive substrate across an exposure area which is conjugate to the illumination area in relation to a projection optical system, in synchronization with the scanning for the mask so that the photosensitive substrate is exposed with a pattern on the mask through the projection optical system, comprising:

arranging a mark pattern on the mask at various positions in a scanning direction in the illumination area, and photoelectrically detecting an image of the mark pattern formed by the projection optical system at each of the positions respectively before the photosensitive substrate is exposed with the pattern on the mask;

synchronously scanning the photosensitive substrate and the mask at the same scanning velocities as those in actual scanning exposure so that a synchronization error caused by the synchronous scanning is detected for each of positions of the mask or the photosensitive substrate; and computing an image formation state of the image of the mark pattern obtained by the synchronous scanning, on the basis of the detected synchronization error and the photoelectrically detected image of the mark pattern corresponding to each of the positions in the scanning direction, thereby predicting image formation characteristics of the image of the pattern on the mask to be obtained by the synchronous scanning for the mask and the photosensitive substrate.

57. The scanning type exposure method according to claim 56, wherein the photoelectrically detected image of the mark pattern corresponding to each of the positions in the scanning direction is corrected with the detected synchronization error corresponding to each of the positions in the scanning direction to determine corrected images of the mark pattern at the respective positions in the scanning direction, and the corrected respective images are overlaid with each other to compute an image formation state of the image of the mark pattern to be obtained by the synchronous scanning.

58. A scanning type exposure method, which uses a projection exposure apparatus provided with a detector for detecting a positional adjustment mark formed on a photosensitive substrate, and which includes scanning a mask across an illumination area on the mask while illuminating the mask, and scanning the photosensitive substrate across an exposure area which is conjugate to the illumination area in relation to a projection optical system, in synchronization with the scanning for the mask so that the photosensitive substrate is exposed with a pattern on the mask through the projection optical system, comprising:

arranging a mark pattern on the mask at various positions in a scanning direction in the illumination area, and photoelectrically detecting an image of the mark pattern formed by the projection optical system at each of the positions respectively before the photosensitive substrate is exposed with the pattern on the mask;

synchronously scanning the photosensitive substrate and the mask at the same scanning velocities as those in actual scanning type exposure so that a synchronization error caused by the synchronous scanning is detected for each of positions of the mask or the photosensitive substrate;

computing a position of the image of the mark pattern on the mask on the basis of the detected synchronization error and the photoelectrically detected image of the mark pattern at each of the positions in the scanning direction; and determining a base line of the positional adjustment mark detector on the basis of the computed position of the mark pattern and a detecting position of the detector for detecting the positional adjustment mark on the photosensitive substrate.

59. The scanning type exposure method according to claim 58, wherein the photoelectrically detected image of the mark pattern corresponding to each of the positions in the scanning direction is corrected with the detected synchronization error corresponding to each of the positions in the scanning direction, and corrected images of the mark pattern at the respective positions in the scanning direction are overlaid with each other to obtain an image from which the position of the mark pattern to be obtained by the synchronous scanning is determined.

60. The scanning type exposure method according to claim 58, wherein the image of the mark pattern formed by the projection optical system is photoelectrically detected by relatively moving the image of the mark pattern and a light-receiving surface of a photoelectric detector in a direction parallel to the scanning direction.

61. A projection exposure apparatus, provided with a projection optical system for projecting an image of a transferring pattern formed on a mask onto a photosensitive substrate under an illuminating light beam for exposure, and a substrate stage for moving the substrate in a plane perpendicular to an optical axis of the projection optical system, comprising:

a photoelectric conversion element for detecting a spatial image of a measuring mark on the mask, formed through the projection optical system, through an aperture having a width wider than the spatial image in a measuring direction, under an illuminating light beam in the same wavelength region as that of the illuminating light beam for exposure;

an image formation characteristic-calculating unit for calculating image formation characteristics of the projection optical system on the basis of a detection signal outputted from the photoelectric conversion element when the spatial image and the aperture are relatively moved in the measuring direction by the aid of the substrate stage; and a light amount-adjusting unit for adjusting an amount of incident light coming into the photoelectric conversion element in conformity with an effective measuring range of the photoelectric conversion element.

62. The projection exposure apparatus according to claim 61, wherein the light amount-adjusting unit is a spatial filter having a variable dimming ratio, for adjusting the amount of incident light coming into the photoelectric conversion element in conformity with the effective measuring range of the photoelectric conversion element irrelevant to any change in illumination condition on the measuring mark.

63. The projection exposure apparatus according to claim 61, wherein the light amount-adjusting unit is shielding zones provided in front of and at the back of the measuring mark, for adjusting the amount of incident light coming into the photoelectric conversion element in conformity with the effective measuring range of the photoelectric conversion element irrelevant to any change in illumination condition on the measuring mark.

64. A projection exposure apparatus, provided with a projection optical system for projecting an image of a transferring pattern formed on a mask onto a photosensitive substrate under an illuminating light beam for exposure, and a substrate stage for moving the substrate in a plane perpendicular to an optical axis of the projection optical system, comprising:

a photoelectric conversion element for detecting a spatial image of a measuring mark on the mask, formed through the projection optical system, through an aperture having a width wider than the spatial image in a measuring direction, under an illuminating light beam in the same wavelength region as that of the illuminating light beam for exposure; and a calculating unit for calculating image formation characteristics of the projection optical system on the basis of a detection signal outputted from the photoelectric conversion element when the spatial image and the aperture are relatively moved in the measuring direction by the aid of the substrate stage; wherein the measuring mark comprises one or a plurality of shielding patterns, based on the use of a mask for evaluation having shielding zones provided in front of and at the back of the shielding pattern or patterns in the measuring direction, at a spacing distance d1 as measured for a projected image thereof; and the aperture for restricting an amount of incident light coming into the photoelectric conversion element has a width d2 which is wider than the spacing distance d1 in the measuring direction.

65. The scanning type exposure apparatus according to claim 1, wherein a positional discrepancy of the image of the mark pattern is determined based on the position detected on the basis of the output of the combining system.

66. The scanning type exposure apparatus according to claim 65, further comprising a computing unit for calculating image formation characteristics of the projection optical system on the basis of positional discrepancies of respective images of a plurality of mark patterns on the mask.

67. The scanning type exposure method according to claim 14, further comprising determining a positional discrepancy of the image of the mark pattern on the mask during the scanning based on the determined position of the image of the mark pattern of the mask during the scanning.

68. The scanning type exposure method according to claim 67, further comprising detecting an image of the mark pattern in the exposure area while illuminating the mark pattern on the mask in a state in which the mask is fixed with respect to the illumination area, and correcting information on a detected position of the image of the mark pattern by using the determined positional discrepancy of the image of the mark pattern on the mask during scanning.

* * * * *